United States Patent
Oh et al.

(10) Patent No.: US 8,013,389 B2
(45) Date of Patent: Sep. 6, 2011

(54) THREE-DIMENSIONAL NONVOLATILE MEMORY DEVICES HAVING SUB-DIVIDED ACTIVE BARS AND METHODS OF MANUFACTURING SUCH DEVICES

(75) Inventors: Jin-Yong Oh, Goyang-si (KR); Woonkyung Lee, Seongnam-si (KR); Jin-Sung Lee, Gwangju-si (KR); Sunil Shim, Seoul (KR); Hansoo Kim, Suwon-si (KR); Wonseok Cho, Suwon-si (KR); Jaehoon Jang, Seongnam-si (KR); Jin-Soo Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 12/612,125

(22) Filed: Nov. 4, 2009

(65) Prior Publication Data
US 2010/0109065 A1    May 6, 2010

(30) Foreign Application Priority Data
Nov. 6, 2008 (KR) .................. 10-2008-0109860
Mar. 6, 2009 (KR) .................. 10-2009-0019270

(51) Int. Cl.
*H01L 29/66* (2006.01)
(52) U.S. Cl. ............ 257/331; 257/3; 257/202; 257/390; 257/E21.662; 257/E21.663; 257/E21.679
(58) Field of Classification Search .................. 257/331, 257/3, 202, 314, 390, E21.662, E21.663, 257/E21.679
See application file for complete search history.

(56) References Cited

U.S. PATENT DOCUMENTS

| | | | |
|---|---|---|---|
| 7,821,058 B2* | 10/2010 | Kidoh et al. | 257/324 |
| 2006/0186446 A1 | 8/2006 | Kim et al. | |
| 2007/0252201 A1 | 11/2007 | Kito et al. | |
| 2008/0067583 A1 | 3/2008 | Kidoh et al. | |
| 2008/0179659 A1 | 7/2008 | Enda et al. | |
| 2008/0180994 A1 | 7/2008 | Katsumata et al. | |
| 2008/0186771 A1 | 8/2008 | Katsumata et al. | |
| 2008/0242028 A1 | 10/2008 | Mokhlesi | |
| 2010/0078622 A1* | 4/2010 | Yoshimizu et al. | 257/4 |

FOREIGN PATENT DOCUMENTS

| | | |
|---|---|---|
| JP | 2007-317874 | 12/2007 |
| JP | 2008-072051 | 3/2008 |
| JP | 2008-171838 | 7/2008 |
| JP | 2008-171839 | 7/2008 |
| JP | 2008-186868 | 8/2008 |
| JP | 2008-192708 | 8/2008 |
| KR | 1020060089547 A | 8/2006 |
| KR | 1020080070583 A | 7/2008 |

* cited by examiner

*Primary Examiner* — Long Tran
(74) *Attorney, Agent, or Firm* — Myers Bigel Sibley & Sajovec

(57) ABSTRACT

Nonvolatile memory devices are provided and methods of manufacturing such devices. In the method, conductive layers and insulating layers are alternatingly stacked on a substrate. A first sub-active bar is formed which penetrates a first subset of the conductive layers and a first subset of the insulating layers. The first sub-active bar is electrically connected with the substrate. A second sub-active bar is formed which penetrates a second subset of the conductive layers and a second subset of the insulating layers. The second sub-active bar is electrically connected to the first sub-active bar. A width of a bottom portion of the second sub-active bar is less than a width of a top portion of the second sub-active bar.

20 Claims, 47 Drawing Sheets

THREE-DIMENSIONAL NONVOLATILE MEMORY DEVICES HAVING SUB-DIVIDED ACTIVE BARS AND METHODS OF MANUFACTURING SUCH DEVICES

CROSS-REFERENCE TO RELATED APPLICATIONS

This U.S. non-provisional patent application claims priority under 35 U.S.C. §119 of Korean Patent Application Nos. 10-2008-109860, filed on Nov. 6, 2008, and 10-2009-19270, filed on Mar. 6, 2009, the entire contents of which are hereby incorporated by reference as if set forth in their entireties.

BACKGROUND

Higher integration of semiconductor devices is required to satisfy consumer demands for superior performance and inexpensive prices. With semiconductor memory devices, integration is an important factor in determining product price, and hence increased integration may be especially important. The integration level of typical two-dimensional or planar semiconductor memory devices is often primarily determined by the area occupied by a unit memory cell, and hence integration is greatly influenced by the level of fine pattern forming technology. However, since extremely expensive semiconductor equipment is needed for increasing pattern fineness, integration of two-dimensional memory devices is increasing but is still limited.

To overcome this limitation, there has been proposed a technology of forming memory cells in three-dimensions, for example, US Patent Publication No. 2007/0252201 (Kito et al.) entitled "Nonvolatile semiconductor memory device and manufacturing thereof". In this cited reference, vertical semiconductor pillars are used as active regions, and memory cells are formed in three-dimensions. By doing so, the area of a semiconductor substrate can be used more effectively and thus integration can be greatly increased as compared to typical two-dimensional semiconductor memory devices. Also, since the technology disclosed in the cited reference is not based on a method of repeated forming of memory cells in two-dimensions, but on a method of forming word lines by using a patterning process for defining an active region, manufacturing cost per bit can be greatly reduced.

SUMMARY

Embodiments of the invention provide methods for manufacturing a nonvolatile memory device. Pursuant to some embodiments, conductive layers and insulating layers are alternatingly stacked on a substrate. A first sub-active bar which penetrates a first subset of the conductive layers and a first subset of the insulating layers is formed. This first sub-active bar is electrically connected to the substrate. A second sub-active bar, which penetrates a second subset of the conductive layers and a second subset of the insulating layers, is formed. This second sub-active bar is electrically connected to the first sub-active bar. A width of a bottom portion of the second sub-active bar is less than a width of a top portion of the second sub-active bar.

In some embodiments, alternatingly stacking conductive layers and insulating layers on the substrate may comprise forming a first gate on the substrate, forming a first opening that penetrates the first gate, forming at least two second gates that are vertically stacked on the first gate, forming a second opening which penetrates the at least two second gates and which is vertically connected with the first opening, forming a third gate on the at least two second gates, and forming a third opening which penetrates the third gate and which is vertically connected with the second opening.

In other embodiments, the first sub-active bar is in the first opening and is vertically connected with the substrate, and the second sub-active bar is in the second opening and is vertically connected with the first active bar. In such embodiments, the methods may further include forming a third sub-active bar in the third opening that is vertically connected with the second sub-active bar.

In still other embodiments, the method may further include forming a first gate dielectric portion on a sidewall of the first opening, forming a second gate dielectric portion including a charge storage layer on a sidewall of the second opening, and forming a third gate dielectric portion on a sidewall of the third opening.

Pursuant to further embodiments, methods of manufacturing a nonvolatile memory device are provided in which a first structure is formed on a substrate, the first structure including a lower select gate and a first active bar which penetrates the lower select gate and which extends vertically from the substrate. A second structure is formed on the first structure, the second structure including a plurality of first cell gate patterns stacked on the first structure and a second active bar which penetrates the plurality of first cell gate patterns and which extends vertically from the first active bar. A third structure is formed on the second structure, the third structure including an upper select gate pattern and a third active bar which penetrates the upper select gate pattern and which extends vertically from the second active bar.

In even other embodiments, the above methods, prior to the forming of the third structure, may further include forming a fourth structure on the second structure, the fourth structure including a plurality of second cell gate patterns stacked on the second structure, and a fourth active bar which penetrates the plurality of second cell gate patterns and which extends vertically from the second active bar.

In yet other embodiments, the above methods, may further include forming a bit line that is electrically connected with the third active bar on the third structure.

In further embodiments, one of the upper select gate and the lower select gate may be formed in the form of a plate and the other is formed in the form of a plurality of lines, and the plurality of first cell gate patterns may be formed in the form of a plate.

Pursuant to still further embodiments of the inventive concept, nonvolatile memory devices are provided that include: a plurality of gates that are vertically stacked on a semiconductor substrate; an active bar which penetrates the plurality of gates and extends vertically from the semiconductor substrate; and a gate dielectric that is between the active bar and the plurality of gates. In these embodiments, the active bar may comprise the same material as the semiconductor substrate, and may include a plurality of bars that are vertically connected with each other, and the plurality of bars may include at least one inclined bar that has a cross-sectional area which increases with increasing distance from the semiconductor substrate.

In still further embodiments, the active bar may further include an insulator therein.

In yet further embodiments of the inventive concept, nonvolatile memory devices are provided that include: gate patterns and insulation patterns alternatingly stacked on top of a substrate; an active bar which is disposed on the substrate and extends upward along sidewalls of the gate patterns and sidewalls of the insulation patterns; and a gate dielectric between the gate patterns and the active bar. The active bar may include a first sub-active bar, a second sub-active bar on top of the first sub-active bar, and a first pad portion between the first sub-active bar and the second sub-active bar that electrically connects the first sub-active bar and the second sub-active bar. An area of a top surface of the first pad portion may be greater than an area of a top surface of the first sub-active bar.

In some embodiments, the active bar may be disposed in an opening that penetrates the gate patterns and the insulation patterns. The first sub-active bar may include an inner opening that is surrounded by the first sub-active bar. The inner opening may be filled with a filling insulating pattern, and the first pad portion may be disposed on the filling insulating pattern.

In other embodiments, the top surface of the first pad portion may be coplanar with the top surface of the first sub-active bar.

In still other embodiments, a bottom surface of the second sub-active bar may directly contact the top surface of the first pad portion. A lower portion of a sidewall of the second sub-active bar that is adjacent to the gate dielectric may be laterally offset toward a center portion of the first pad from a sidewall of the first sub-active bar that is adjacent to the gate dielectric.

In some embodiments, the gate dielectric may include a first gate dielectric portion between the first sub-active bar and ones of the gate patterns that are positioned lateral to the first sub-active bar, and a second gate dielectric portion between the second sub-active bar and ones of the gate patterns that are positioned lateral to the second sub-active bar. The first gate dielectric portion and the second gate dielectric portion may be separated from each other.

In some embodiments, the gate patterns and the insulation patterns alternatingly stacked may constitute a first gate group. The device further includes second gate patterns and second insulation patterns that are alternatingly tacked to form a second gate group. The first and second gate groups may be disposed apart from each other to define a groove between the first and second gate groups. The first sub-active bars of the first and second gate groups are disposed apart from each other on respective sidewalls of the groove. The foregoing nonvolatile memory devices may further include a filling insulating layer between the first sub-active bars of the first and second gate groups. The first pad portion may be disposed on the filling insulating layer.

In even further embodiments, the first sub-active bar, the second sub-active bar and the first pad portion may include the same semiconductor material.

In yet further embodiments, the foregoing nonvolatile memory devices may further include: a second pad portion on the second sub-active bar; and a bit line electrically connected with the second pad portion. An area of a top surface of the second pad portion may be greater than an area of a top surface of the second sub-active bar.

In still further embodiments, the foregoing nonvolatile memory devices may further include an ohmic layer between the second pad portion and the bit line. In yet other embodiments, the gate dielectric may include a tunnel barrier adjacent to the active bar, a blocking barrier adjacent to the gate pattern, and a charge storage layer between the tunnel barrier and the blocking barrier.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
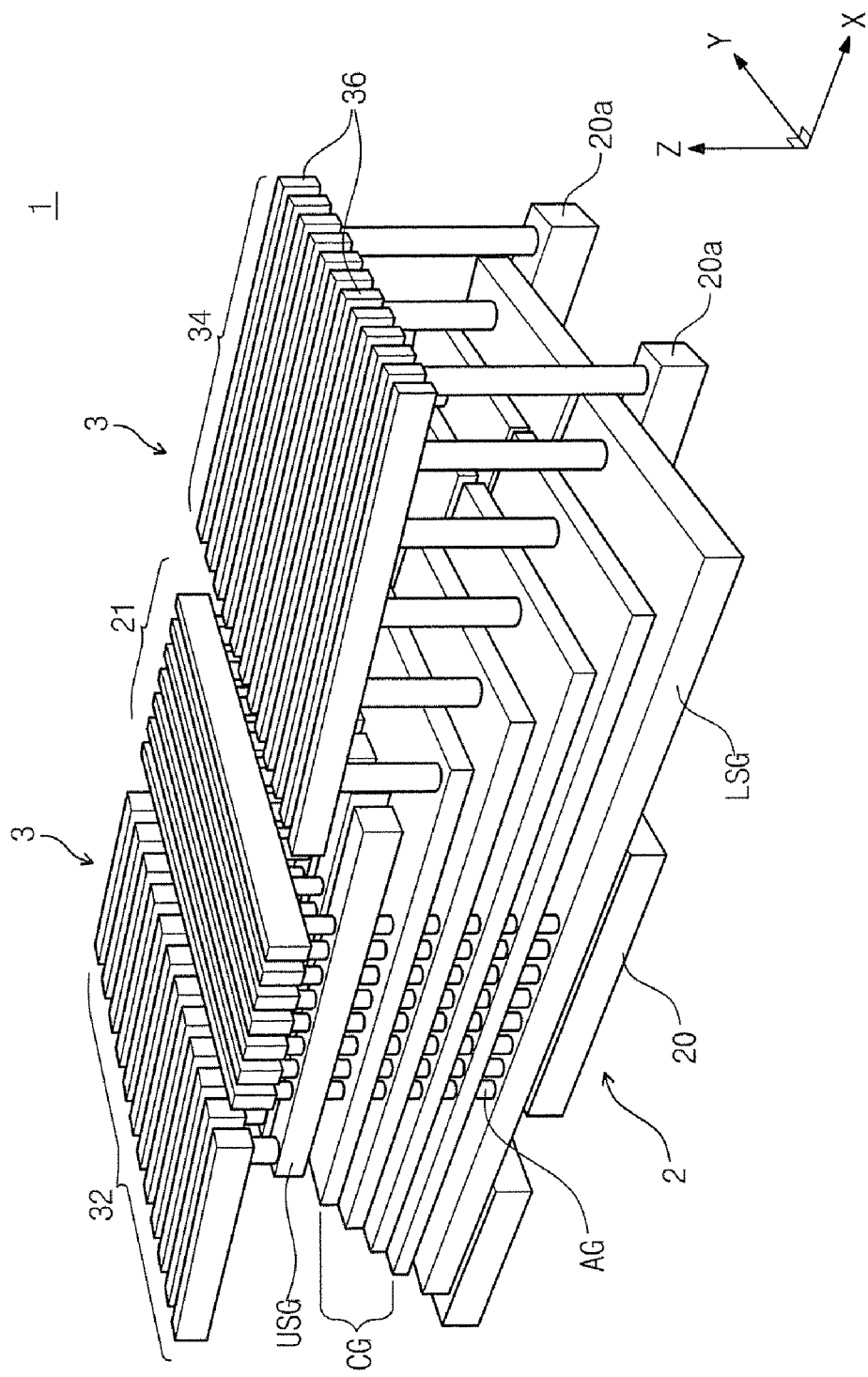
FIG. 1 is a perspective view of a nonvolatile memory device according to an embodiment of the inventive concept.

Embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

It will be understood that, although the terms first, second, etc. may be used herein to describe various elements, these elements should not be limited by these teens. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

A First Device Embodiment

FIG. 1 is a perspective view of a nonvolatile memory device according to an embodiment of the inventive concept.

Referring to FIG. 1, a nonvolatile memory device 1 according to an embodiment of the invention may include a cell region 2 including memory cells and peripheral regions 3 that include a peripheral circuit for operating the memory cells. The nonvolatile memory device 1 described below is one embodiment of the inventive concept. The inventive concept is not limited thereto and various modifications will be possible. One aspect of modifications may be one disclosed in US Patent Publication No. 2007/0252201, the entire contents of which is hereby incorporated by reference.

The cell region 2 may include a plurality of cell gate patterns CG vertically stacked in a Z-direction on a semiconductor substrate 20. Each cell gate pattern CG defines an X-Y plane and may have a plate shape. An upper select gate pattern USG and a lower select gate pattern LSG are stacked, respectively, above and below the plurality of cell gate patterns CG. A plurality of bit lines 21 are stacked on the upper select gate pattern USG and extend in the Y-direction. A plurality of active bars ACT extend vertically in the Z-direction on the semiconductor substrate 20. Each of the plurality of active bars ACT may be configured to extend from the semiconductor substrate 20 to the plurality of bit lines 21 and to penetrate the upper and lower select gate patterns USG and LSG and the plurality of cell gate patterns CG.

One of the lower select gate pattern LSG and the upper select gate pattern USG may be provided in a plate shape forming an X-Y plane and the other may comprise a plurality of lines that extend in the X-direction. In further embodiments, both the lower select gate pattern LSG and the upper select gate pattern USG may comprise a plurality of lines that extend in the X-direction. In the embodiment shown in FIG. 1, the lower select gate pattern LSG has a plate type structure forming the X-Y plane and the upper select gate pattern USG comprises a plurality of lines that extend in the X-direction.

The peripheral region 3 may include an upper select line driving circuit 32 that is connected to the plurality of upper select gate patterns USG, a word line driving circuit 21 that is connected to the plurality of cell gate patterns CG, and a common source line 36 that is connected to a source 20a of the semiconductor substrate 20. The source 20a may have a conductivity type that is different from the conductivity type of the semiconductor substrate 20, for example, when the semiconductor substrate 20 has a P-type conductivity, the source 20a may have an N-type conductivity.

Figure 2:
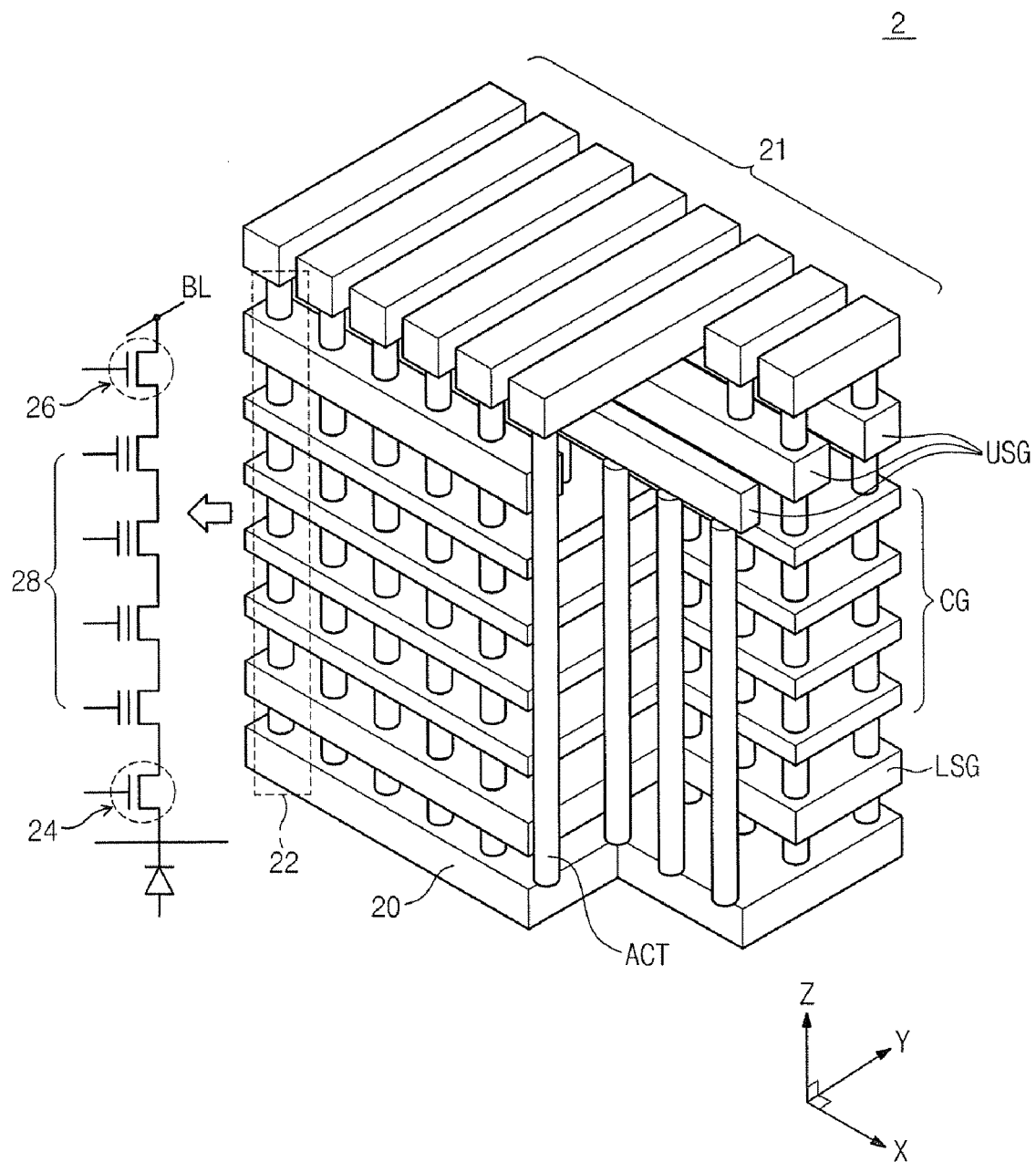
FIG. 2 is a perspective view of a cell region of a nonvolatile memory device according to an embodiment of the inventive concept.
Figure 3A:
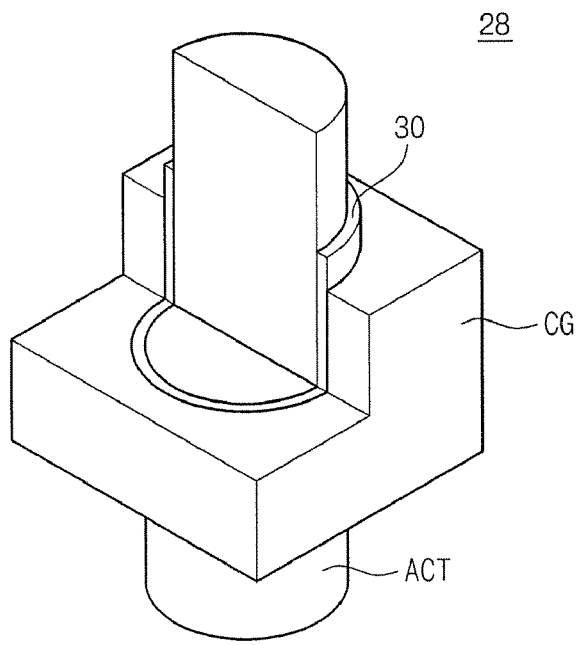
FIGS. 3A and 3B are partial cut-away perspective views of a memory transistor of a nonvolatile memory device according to an embodiment of the inventive concept.
Figure 3B:
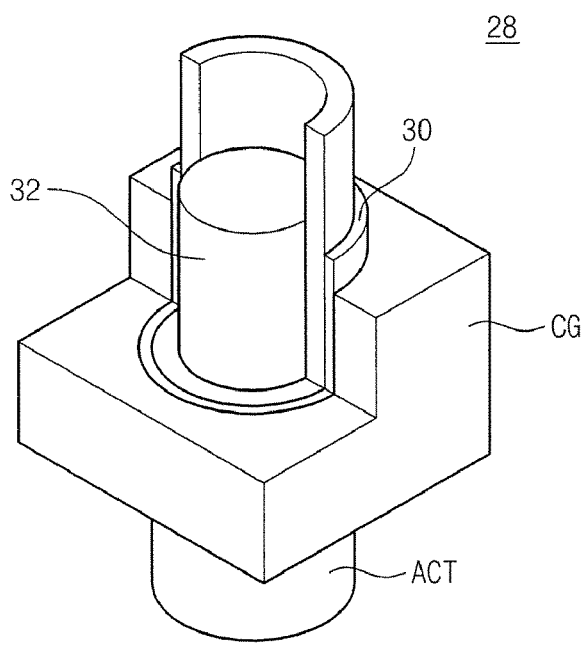

FIG. 2 is a perspective view of a cell region 2 of FIG. 1, and FIGS. 3A and 3B are perspective views of a memory transistor of FIG. 2.

Referring to FIGS. 2 and 3A, the active bar ACT and the cell gate pattern CG may define a memory transistor 28, the active bar ACT and the lower select gate pattern LSG may define a lower select transistor 24, and the active bar ACT and the upper select gate pattern USG may define an upper select transistor 26. The nonvolatile memory device according to an embodiment of the inventive concept may be a NAND flash memory device in which the plurality of memory transistors 28 and the upper and lower transistors 26, 24 which are formed along one active bar ACT and are connected in series constitute a single cell string 22. While this embodiment exemplarily shows that the single cell string 22 has four memory transistors 28, the number of the memory transistors 28 constituting the single cell is not limited thereto but may be arbitrarily changed. The active bar ACT may have a cylindrical shape the cross section of which is a circular shape, a rectangular bar shape the cross section of which is a rectangular shape, or other arbitrary shape.

The memory transistors 28 and the upper and lower select transistors 26, 24 may be depletion transistors which do not have source/drain regions in the active bar ACT. In further embodiments, the memory transistors 28 and the upper and lower select transistors 26, 24 may be enhancement transistors which have source/drain regions in the active bar ACT.

The longitudinal axis of each of the plurality of active bars ACT extends in the direction of the Z-axis to penetrate the plurality of cell gate patterns CG, and accordingly intersection points between the plurality of cell gate patterns CG and the plurality of active bars ACT may be distributed in all three dimensions. The memory transistors 28 of the nonvolatile memory device may be formed at respective ones of the three-dimensionally distributed intersection points. A gate dielectric 30 (see FIG. 3A) that includes a data storage layer may be disposed between the plurality of active bars ACT and the plurality of cell gate patterns CG.

The data storage layer may include an insulating layer that can trap a charge. For example, in the case where the gate dielectric 30 is an ONO (Oxide-Nitride-Oxide) layer composed of a silicon oxide layer, a silicon nitride layer (or silicon oxynitride layer) and a silicon oxide layer, a charge can be trapped and maintained in the silicon nitride layer (or silicon oxynitride layer). In this case, the silicon oxide layer adjacent the active bar may act as a tunnel barrier, and the silicon oxide layer adjacent to the cell gate pattern CG may act as a blocking barrier.

Referring to FIG. 3B, the active bar ACT may have a hollow cylindrical shape having an insulator 32 therein. The insulator 32 may be formed as a solid cylinder. Since the insulator 32 occupies the space inside of the active bar ACT, the thickness of the active bar ACT of FIG. 3B may be thinner than that in the structure of FIG. 3A, thereby decreasing the deviation in threshold voltage.

Figure 4:
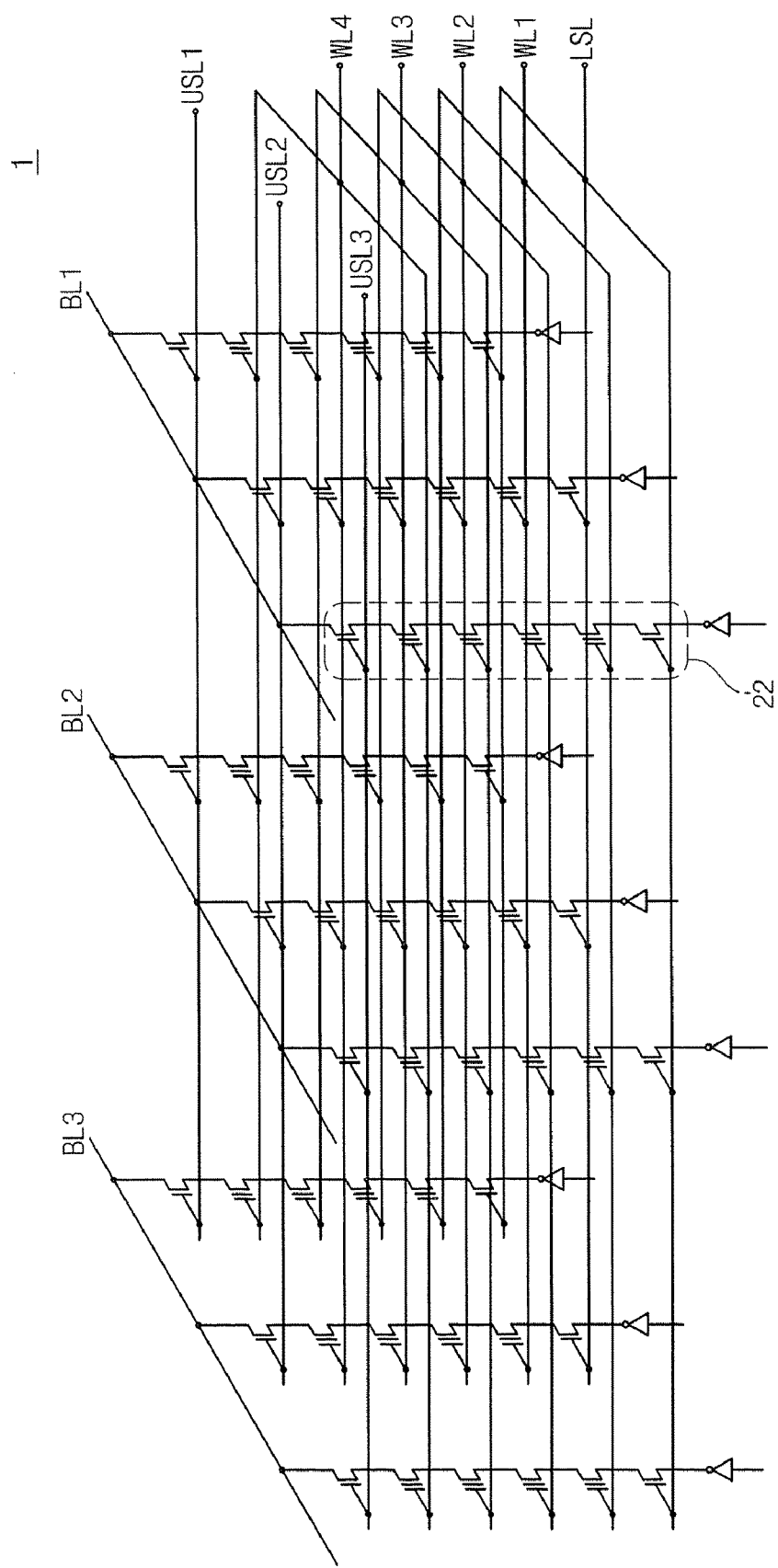
FIG. 4 is an equivalent circuit diagram of a nonvolatile memory device according to an embodiment of the inventive concept.

FIG. 4 is a partial equivalent circuit diagram of a nonvolatile memory device according to an embodiment of the inventive concept.

Referring to FIGS. 2 to 4, in the nonvolatile memory device 1, the plurality of cell gate patterns CG are used as a plurality of word lines WL1 to WL4, the plurality of upper select gate patterns USG are used as a plurality of upper select lines USL1 to USL3, and the plurality of lower select gate patterns LSG are used as a plurality of lower select lines LSL. A plurality of cell strings 22 may be connected to each of the plurality of bit lines BL1 to BL3.

Since each of the plurality of cell gate patterns CG can have a two-dimensional planar structure, each of the plurality of word lines WL1 to WL4 has a planar structure and may be substantially normal to the cell string 22.

Since each of the plurality of upper select gate pattern USG can form a separate interconnection line structure, the plurality of upper select lines USL1 to USL3 may be disposed to cross the plurality of bit lines BL1 to BL3. Since each of the plurality of upper select lines USL1 to USL3 is electrically connected with each of the plurality of bit lines BL1 to BL3, each cell string 22 can be independently selected.

Since each of the plurality of lower select gate patterns LSG can have a two-dimensional planar structure, each of the plurality of lower select lines LSL has a planar structure and may be substantially normal to the cell string 22. The lower select line LSL can control an electrical connection between the active bar ACT and the semiconductor substrate 20.

In the nonvolatile memory device 1, a program operation can be performed by setting a voltage difference between a selected word line WL and the active bar ACT and then injecting a charge into a data storage layer. In one example, a program operation can be performed by applying a program voltage Vprog to a selected word line WL to inject electrons into a data storage layer of the memory transistor 28 pertaining to a word line to be programmed from the active bar ACT by using Fowler-Nordheim tunneling. Since the program voltage Vprog applied to the selected word line WL can program a memory transistor pertaining to a non-selected word line, a program operation which is not intended can be prevented by using a boosting technique.

To perform a read operation, a word line WL to which the memory transistor 28 to be read is connected is set to 0 volts and another word line is set to a read voltage Vread. As a result, whether a current is charged to the bit line BL or not is determined according to whether the threshold voltage Vth of the memory transistor 28 to be read is more or less than 0 volts. Therefore, data information of the memory transistor 28 to be read can be read by sensing the current of the bit line BL.

An erase operation can be performed in a block unit by using so-called "gate induced drain leakage current (GIDL)". In one example, an electrical potential of the active bar ACT is elevated by applying an erase voltage Verase to the selected bit line BL and the substrate 20. At this time, the electrical potential of the active bar ACT may be elevated after a predetermined delay. Together with the elevation of the electrical potential, GIDL is generated from a gate terminal of the lower select transistor 24, electrons generated by GIDL are injected into the substrate 20, and generated holes are injected into the active bar ACT. Accordingly, the electrical potential around the erase voltage Verase can be transferred to a channel of the memory transistor 28, i.e., the active bar ACT. At this time, if the electric potential of the word line WL is set to 0 volts, electrons accumulated in the memory transistor 28 are ejected, so that a data erase can be performed. During this operation, the word line of a non-selected block can be floated so that memory cells of the non-selected block are not erased.

Methods of operating the nonvolatile memory device 1 according to certain embodiments of the inventive concept are provided so as to exemplarily describe the technical spirit of the inventive concept, and technical features of the inventive concept should not be construed as limited to the embodiments set forth herein. Accordingly, since it is apparent that the embodiments can be easily modified in various forms based on publicly known technologies by those skilled in the art, the technical features of the inventive concept related to the operating method may be modified and embodied in various forms. As one example, the operation of the nonvolatile memory device 1 may be performed by the method disclosed in US Patent Publication No. 2007/0252201, the entire contents of which are hereby incorporated by reference.

First Method Embodiment

Figure 5A:
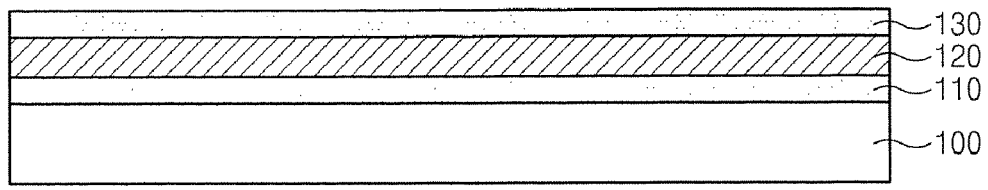
FIGS. 5A through 5P are cross-sectional views illustrating a method for manufacturing a nonvolatile memory device according to an embodiment of the present invention.
Figure 5B:
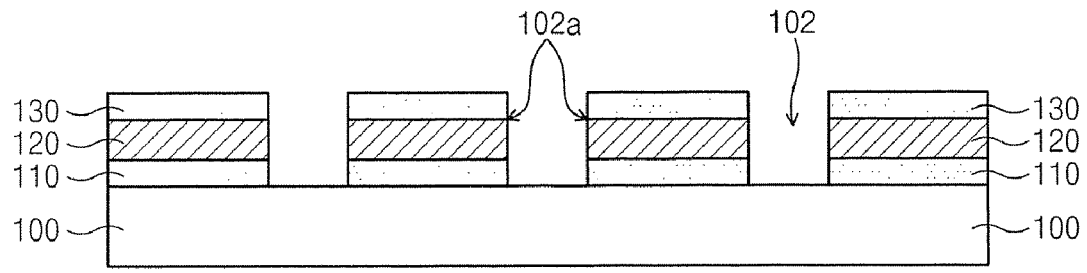
Figure 5C:
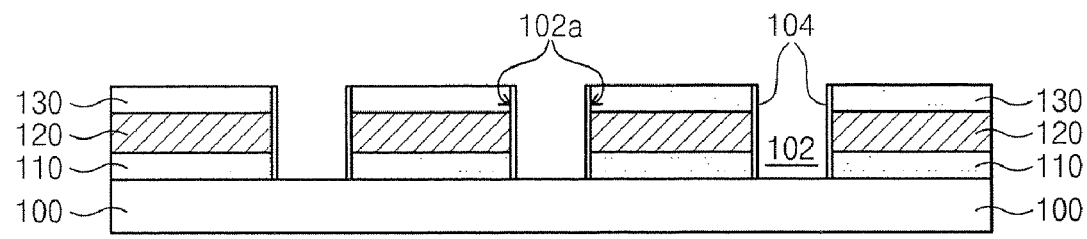
Figure 5D:
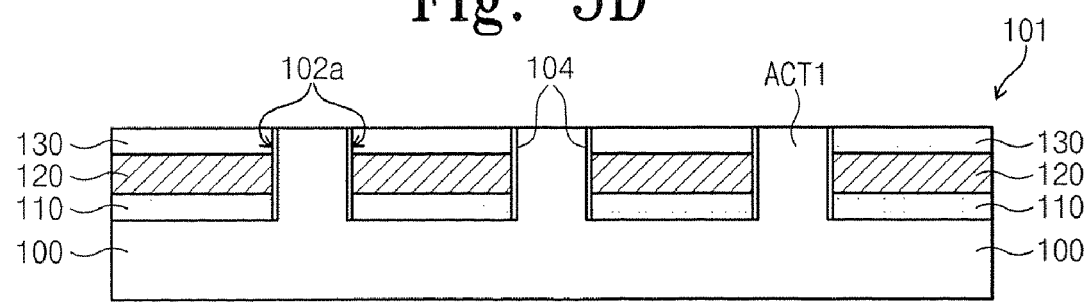
Figure 5E:
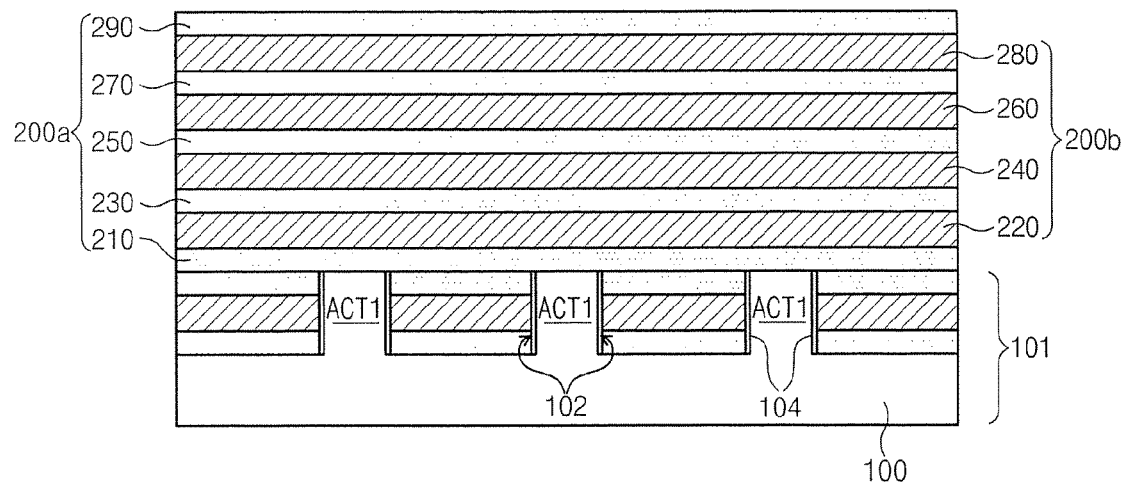
Figure 5F:
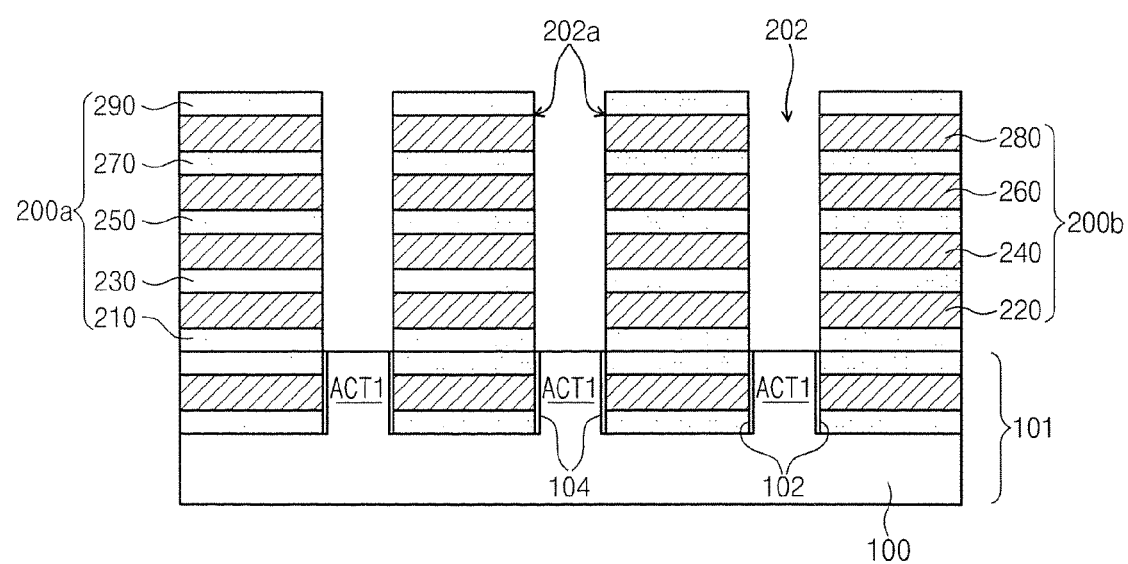
Figure 5G:
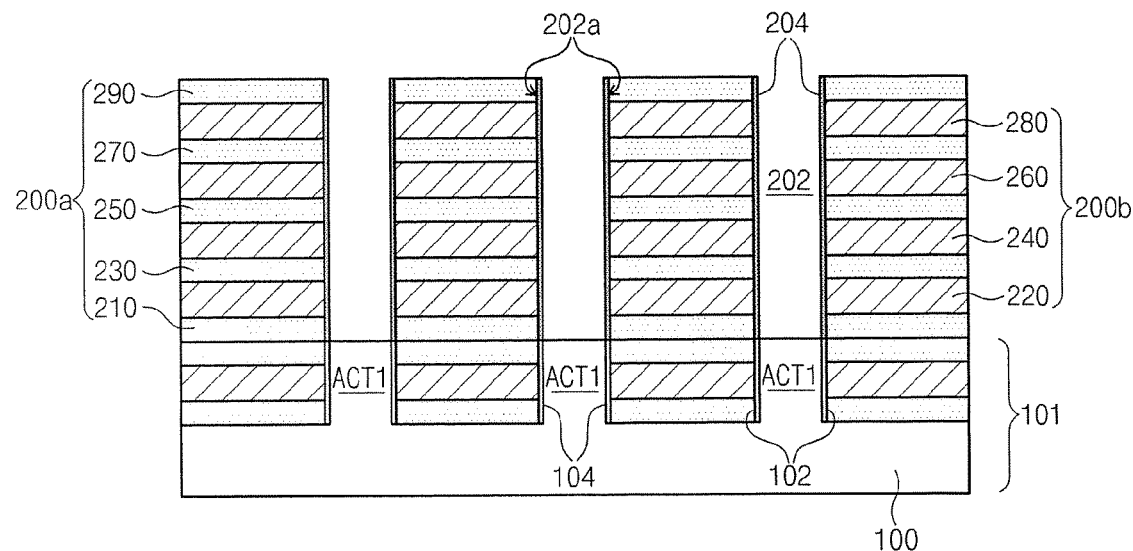
Figure 5H:
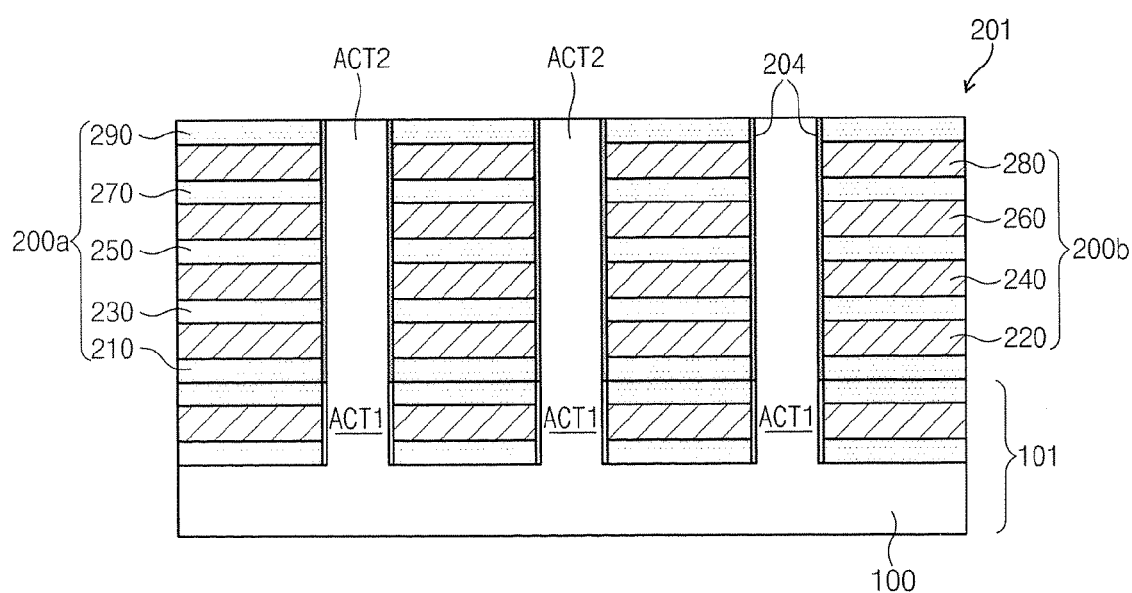
Figure 5I:
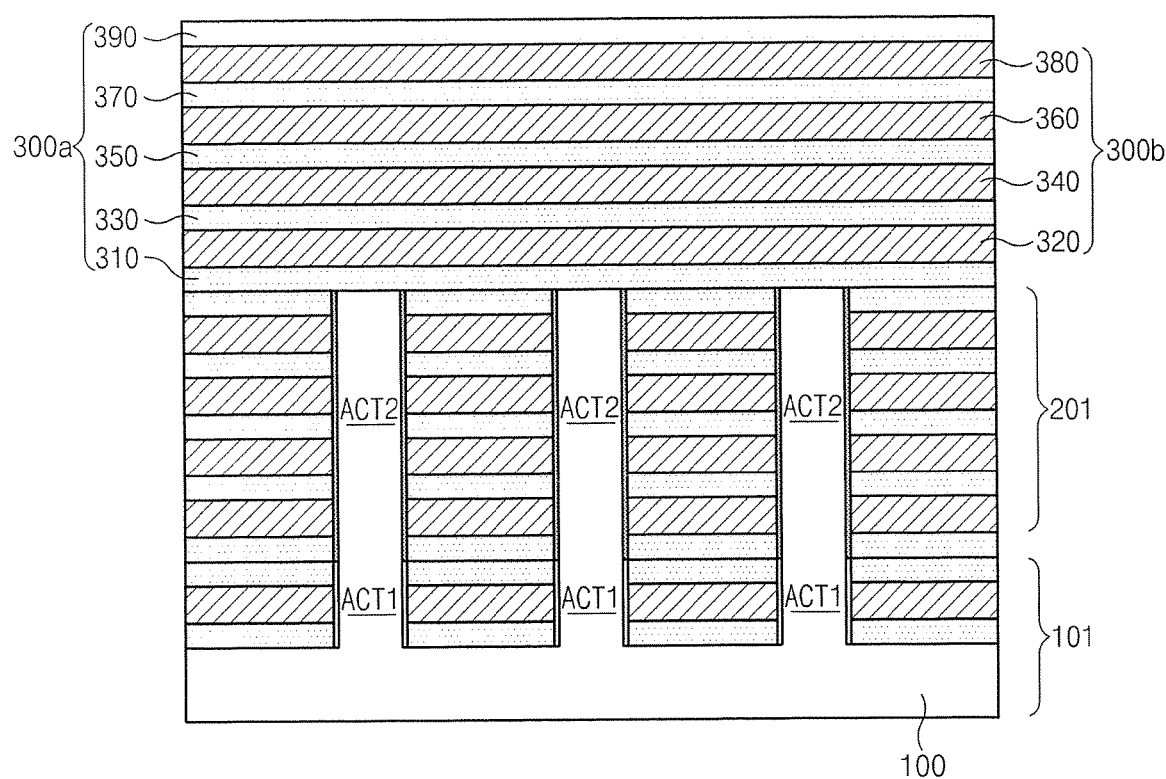
Figure 5J:
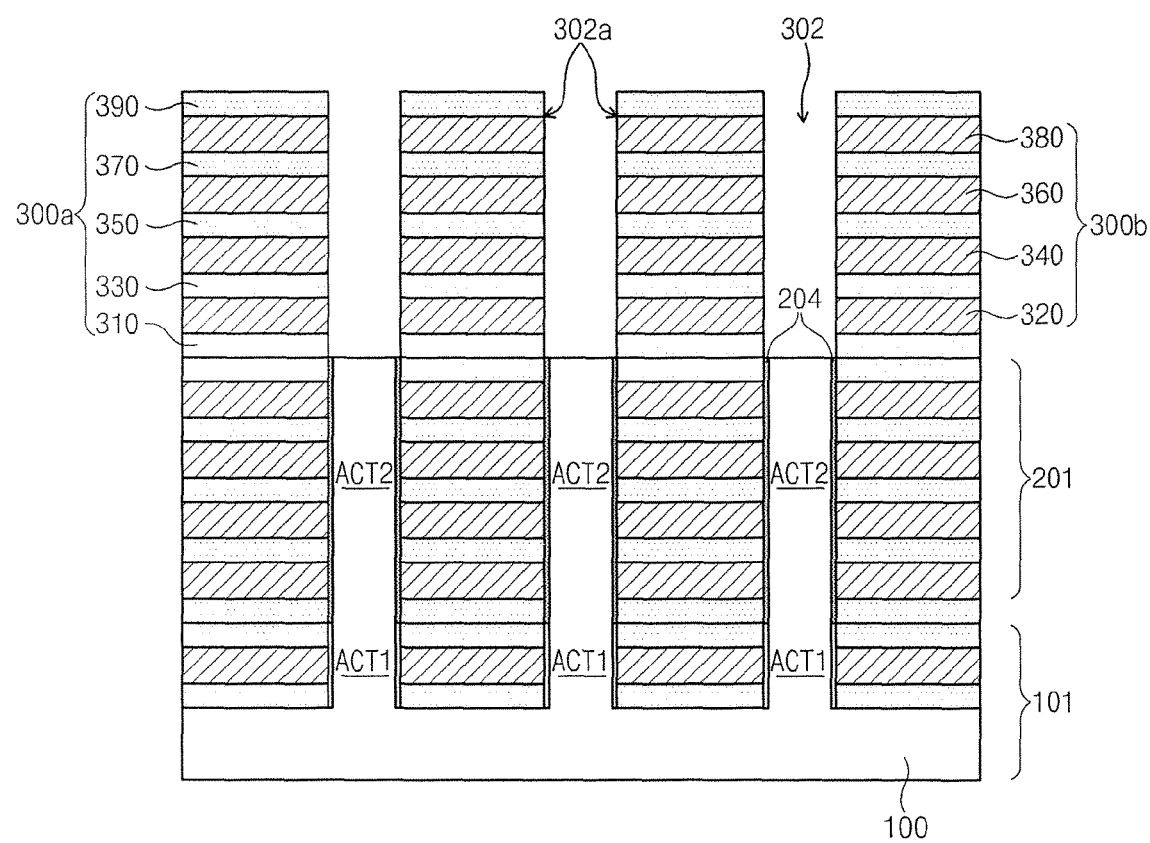
Figure 5K:
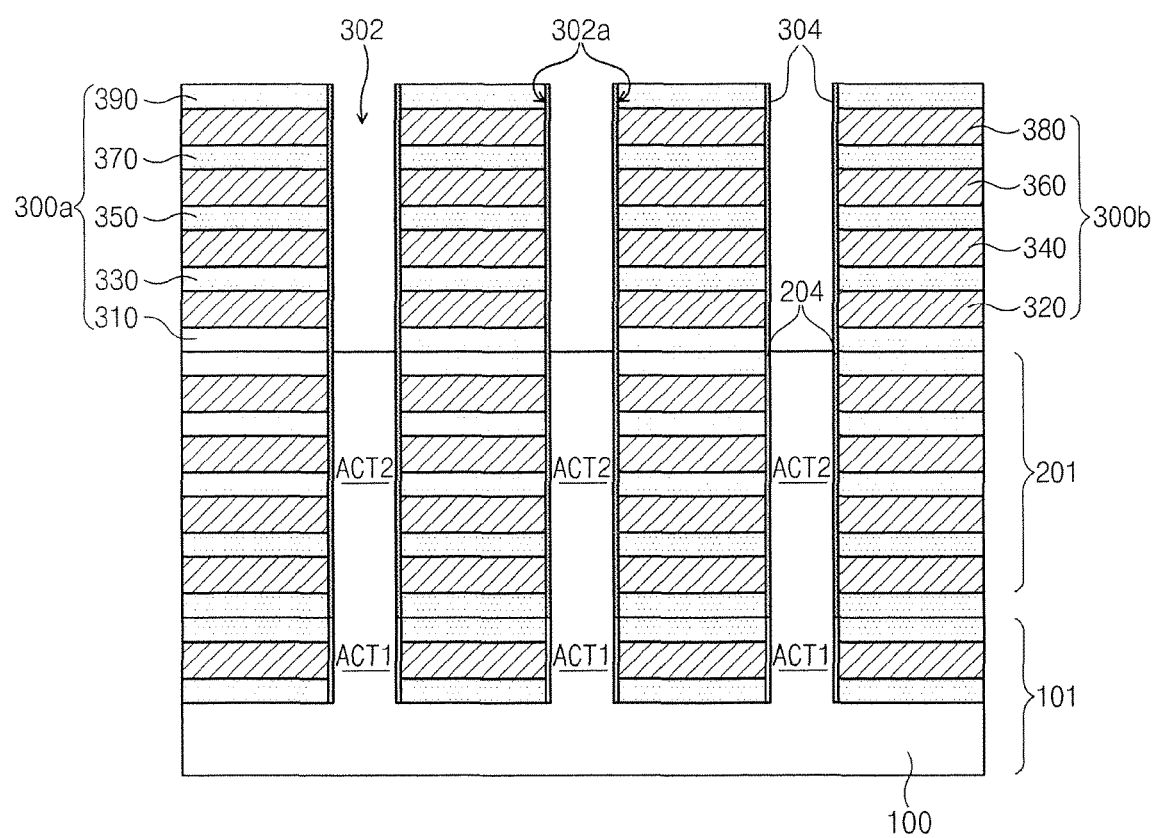
Figure 5L:
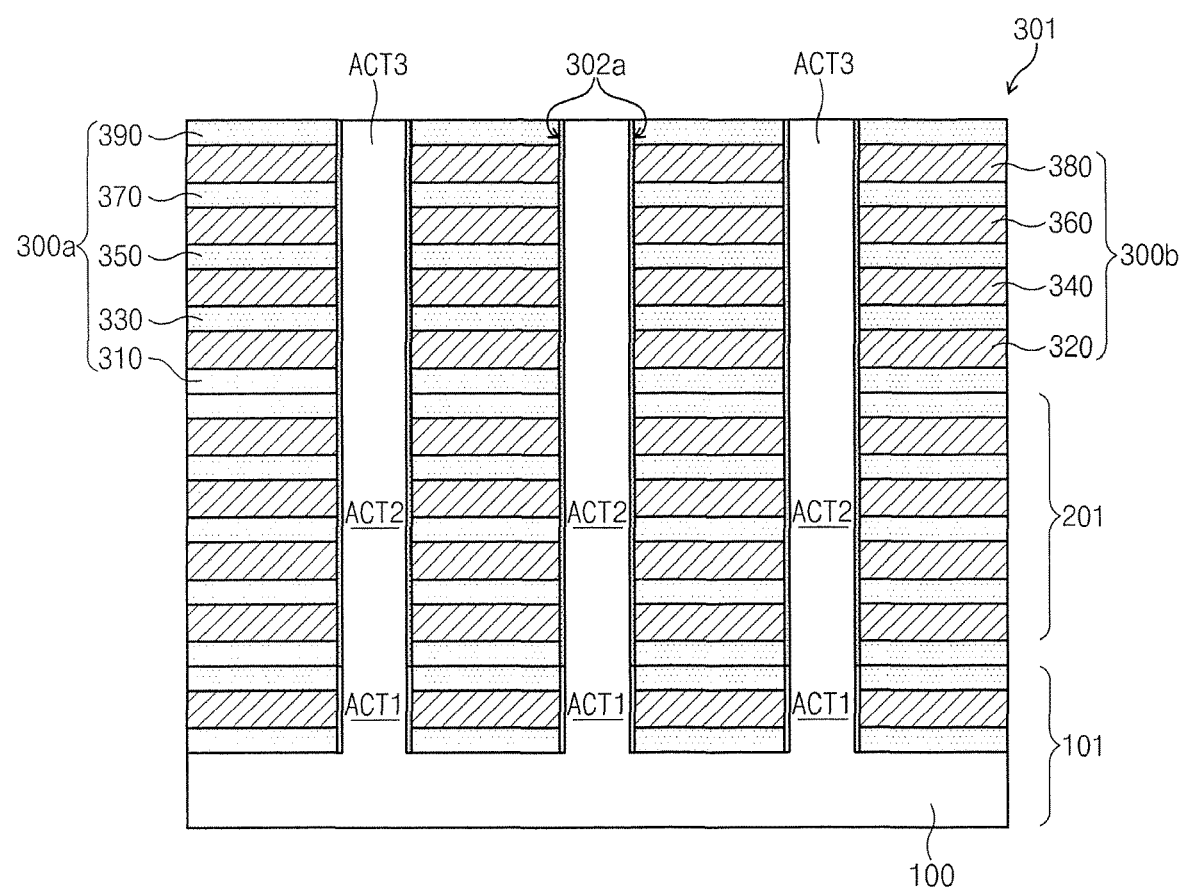
Figure 5M:
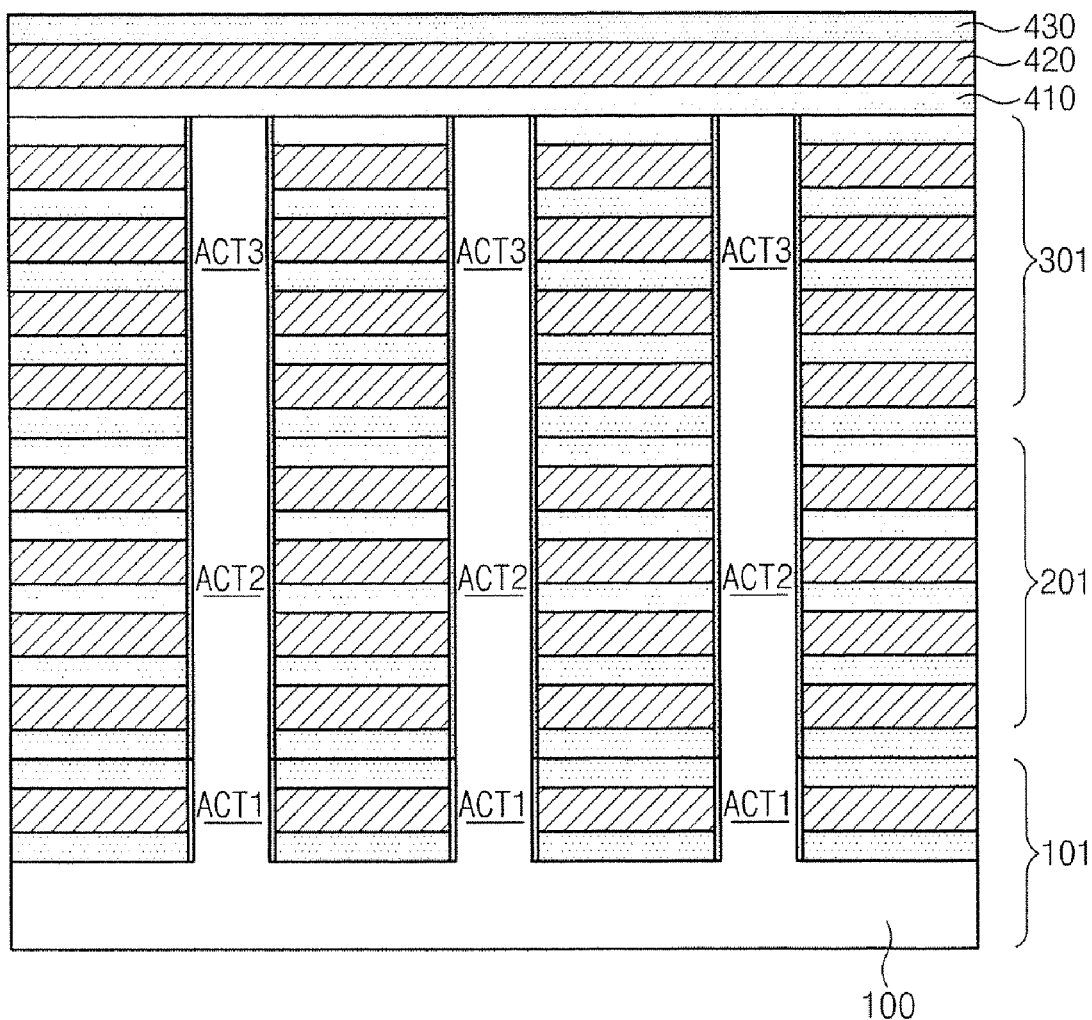
Figure 5N:
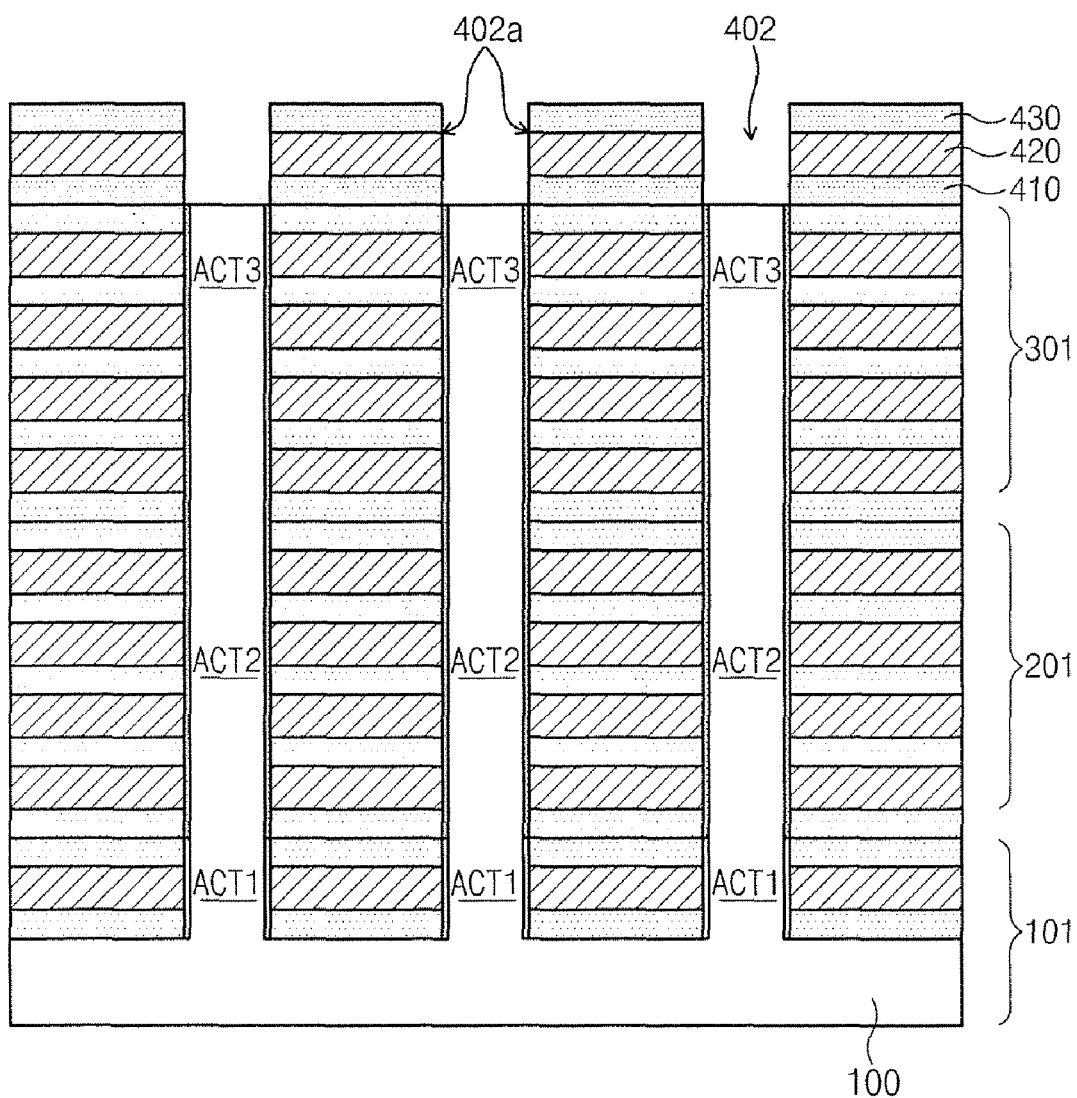
Figure 50:
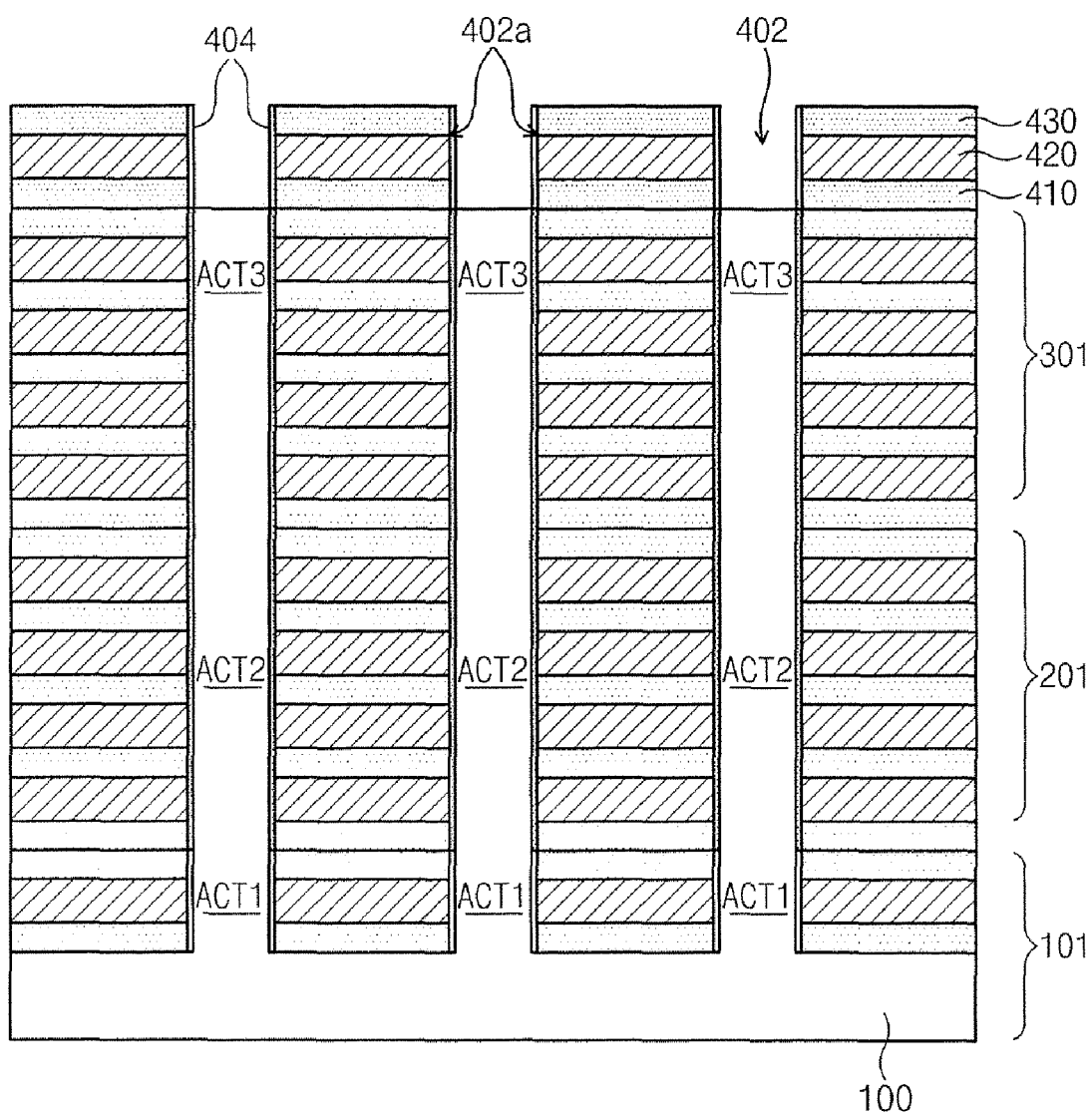
Figure 5P:
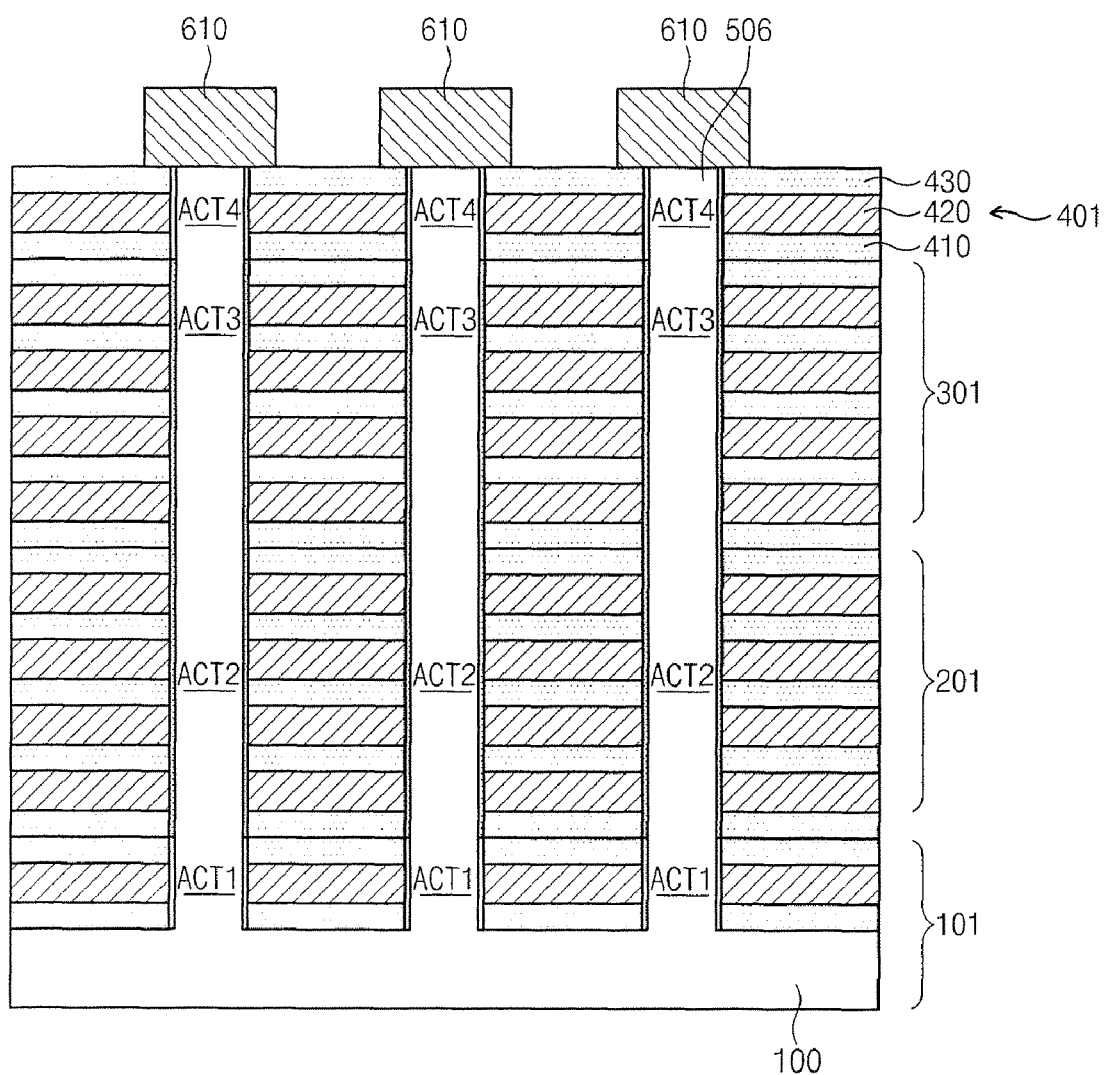

FIGS. 5A through 5P are cross-sectional views illustrating a method for manufacturing a nonvolatile memory device according to an embodiment of the present invention.

Referring to FIG. 5A, an insulating layer 110, a conductive layer 120 and an insulating layer 130 are sequentially formed on a semiconductor substrate 100. The semiconductor substrate 100 may be doped with dopants of first conductivity type, for example, P-type dopants. The semiconductor substrate 100 may have a region having a different conductive type, i.e., a well region. The well region may be formed in a pocket well or a triple well structure. The insulating layers 110 and 130 may be formed by depositing an insulating material such as silicon oxide, silicon nitride, silicon oxynitride or the like. The conductive layer 120 may be used as a lower select gate. The conductive layer 120 (hereinafter, referred to as the "lower select gate") may be formed by depositing a conductive material, such as doped polycrystalline silicon or metal so that the conductive layer 120 can be used as a gate.

Referring to FIG. 5B, at least one opening 102 exposing the semiconductor substrate 100 is formed, by using, for example, a photolithography and etching process. The first opening 102 may have, for example, a circular or polygonal (e.g., rectangular) cross section. The first opening 102 is filled with silicon as will be described later, to form an active bar used as a channel of a transistor. If sidewalls 102a of the first opening 102 are formed inclined at a predetermined angle, the size of the active bar is varied with its height, so that the channel width of the transistor may not be uniform. Non-uniform channel width may act as a hindrance factor in realizing uniform electrical characteristics of a semiconductor memory device. Therefore, in some embodiments, the first opening 102 may be formed by using an anisotropic etching technique, for example, a dry etching technique such that the first opening 102 has the sidewalls 102a that are vertical to the-surface of the semiconductor substrate 100.

Referring to FIG. 5C, an insulating layer 104 is formed on the sidewalls 102a of the first opening 102. The insulating layer 104 may be used as a gate dielectric (hereinafter, referred to as a "first gate dielectric portion") of the lower select gate 120. In one example, the first gate dielectric portion 104 may be formed by depositing silicon oxide. In the deposition process for forming the first gate dielectric portion 104, silicon oxide may be deposited on the semiconductor substrate 100 that is exposed by the first opening 102. The silicon oxide deposited on the semiconductor substrate 100 may be removed by using an etching technique so that the semiconductor substrate 100 and an active bar to be described later are electrically connected to each other. A spacer for protecting the silicon oxide layer that is deposited on the sidewalls 102a of the first opening 102 from the etching may also be formed prior to the above-mentioned etching step.

Referring to FIG. 5D, a first active bar ACT1 is deposited in the first opening 102. The first active bar ACT1 may substantially fill the first opening 102. The first active bar ACT1 may be formed of the same material as the semiconductor substrate 100. In one example, the first active bar ACT1 may be formed by depositing a silicon layer and planarizing the deposited silicon layer through a chemical mechanical polishing (CMP) process. The silicon layer for forming the first active bar ACT1 may be formed by depositing polycrystalline silicon or amorphous silicon. In other embodiments, the first active bar ACT1 may be epitaxially grown from the portion of the semiconductor substrate 100 that is exposed by the first opening 102. In this case, the semiconductor substrate 100 and the first active bar ACT1 may be a single crystalline silicon which is continuous without crystalline defects. The first active bar ACT may be doped with the same conductivity type dopants as the semiconductor substrate 100. In some embodiments, the semiconductor substrate 100 and the first active bar ACT1 may have a P-type conductivity. Alternatively, the first active bar ACT1 may be not doped with dopants.

Through the foregoing processes, a first structure 101 including the semiconductor substrate 100, the lower select gate 120 above the semiconductor substrate 100, and the first active bar ACT1 used as a channel of the lower select gate 120 may be manufactured.

Referring to FIG. 5E, a first insulating layer group 200a and a first conductive layer group 200b are formed on the first structure 101. The first insulating layer group 200a may include a plurality of insulating layers 210, 230, 250, 270, 290. The first conductive layer group 200b may include a plurality of conductive layers 220, 240, 260, 280. The plurality of conductive layers 220, 240, 260, 280 and the plurality of insulating layers 210, 230, 250, 270, 290 may be alternatingly disposed to form a stacked sandwich structure. The insulating layer 210 may be positioned at the bottom of the stacked structure directly on the first structure 101, and the insulating layer 290 may be positioned at the top of the stacked structure to cover the conductive layer 280. Each of the plurality of conductive layers 220, 240, 260, 280 of the first conductive layer group 200b may be used as a cell gate pattern. The plurality of conductive layers 220, 240, 260, 280 may be formed by depositing doped polycrystalline silicon or metal. In this specification, the term "the first conductive layer group" 200b may be interchanged with the term "first cell gate pattern group", and the term "each of the plurality of conductive layers" 220, 240, 260, 280 may be interchanged with the term "first cell gate pattern."

Each of the plurality of conductive layers 220, 240, 260, 280 may have substantially the same thickness. Since thickness and/or interval of each of the plurality of conductive layers 220, 240, 260, 280 may determine a channel length, the thickness and/or interval of each of the plurality of conductive layers 220, 240, 260, 280 may be selected in a range that can solve limitations in the electrical characteristics due to a short channel. Also, since the plurality of conductive layers 220, 240, 260, 280 can be formed by deposition, the channel length can be controlled precisely.

The plurality of insulating layers 210, 230, 250, 270, 290 may be formed by depositing silicon oxide. In further embodiments, the plurality of insulating layers 210, 230, 250, 270, 290 may be formed of high-k dielectric. In still further embodiments, each of the plurality of insulating layers 210, 230, 250, 270, 290 may be formed by depositing a material (e.g., silicon nitride, silicon oxynitride) having a dielectric constant higher than silicon oxide.

The number, thickness, material and the like of layers constituting the first insulating layer group 200a and the first conductive layer group 200b may be modified in various forms with consideration of electrical characteristics of a memory transistor and technical difficulties in the process (see FIG. 4F) of patterning these layers. Each of the first insulating layer group 200a and the first conductive layer group 200b may be formed in a step form.

Referring to FIG. 5F, the first insulating layer group 200a and the conductive layer group 200b are patterned via a photolithography and etching process to form a second opening 202 that exposes the first active bar ACT1. The first gate dielectric portion 104 may be exposed by the second opening 202. The second opening 202 may be formed by using, for example, a dry etching so as to have vertical sidewalls 202a and thus realize uniform electrical characteristics for a transistor. The first opening 102 and the second opening 202 can be connected in a vertical direction.

The number of the plurality of conductive layers 220, 240, 260, 280 constituting the first conductive layer group 200b and the number of the plurality of insulating layers 210, 230, 250, 270, 290 constituting the first insulating layer group 200a may be varied from the four conductive layer and five insulating layer embodiment depicted in the figures. In this embodiment, while the number of conductive layers 220, 240, 260, 280 constituting the first conductive layer group 200b is set at 4 layers and the number of insulating layers 210, 230, 250, 270, 290 constituting the first insulating layer group 200a is set at 5 layers, these numbers are arbitrary.

Referring to FIG. 5G, an insulating layer 204 is formed on the sidewalls 202a of the second opening 202. The insulating layer 204 may be used as a gate dielectric (hereinafter, referred to as the "second gate dielectric portion") of a first cell gate pattern group 200b. The second gate dielectric portion 204 may include a data storage layer. In one example, the second gate dielectric portion 204 may be formed in a triple layer structure by sequentially depositing a silicon oxide layer, a silicon nitride layer or a silicon oxynitride layer, and a silicon oxide layer or the like. In the second gate dielectric portion 204, the silicon nitride layer or the silicon oxynitride layer is used as a charge storage layer for trapping a charge and storing information, and any one of the two silicon oxide layers is used as a blocking barrier and the other is used as a tunnel barrier.

The second gate dielectric portion 204 may be formed on the first active bar ACT1 that is exposed by the second opening 202. The second gate dielectric portion 204 that is deposited on the first active bar ACT1 during the deposition process may be removed by using an etching technique so that the first active bar ACT1 and a second active bar ACT2 may be electrically connected to each other. Prior to this etching process, a spacer for protecting the second gate dielectric portion 204 that is deposited on the sidewalls 202a of the second opening 202 from the etching may be formed.

Referring to FIG. 5H, a second active bar ACT2 is formed in the second opening 202 by using a process that is the same as or similar to that described with reference to FIG. 5D. The second active bar ACT2 may be connected to the first active bar ACT1 in a vertical direction, and may also be connected to the surface of the semiconductor substrate 100. The second active bar ACT2 may be formed of the same material as the first active bar ACT1. In some embodiments, the second active bar ACT2 may be formed by depositing amorphous or polycrystalline silicon and planarizing the deposited amorphous or polycrystalline silicon layer through a chemical mechanical polishing (CMP) process. In other embodiments, the second active bar ACT2 may be formed by epitaxially growing single crystalline silicon from the first active bar ACT1. The second active bar ACT2 may be formed to have the same conductivity type as the semiconductor substrate 100 and the first active bar ACT1, for example, P-type conductivity. Alternatively, the semiconductor substrate 100 and the first and second active bars ACT1 and ACT2 may not doped with dopants.

Through the foregoing processes, a second structure 201 including the plurality of cell gate patterns 220, 240, 260, 280 on the first structure 101, and the second active bar ACT2 that is used as a channel of the plurality of cell gate patterns 220, 240, 260, 280 can be formed.

Referring to FIG. 5I, a second insulating layer group 300a that includes a plurality of insulating layers 310, 330, 350, 370, 390 and a second conductive layer group 300b that includes a plurality of conductive layers 320, 340, 360, 380 which are alternatingly disposed with the plurality of insulating layers 310, 330, 350, 370, 390 are formed in a stacked sandwich structure by using a process that is the same as or similar to that described with reference to FIG. 5E. The insulating layer 310 is disposed at the bottom of the stack, directly on the second structure 201, and the insulating layer 390 is at the top of the stack and covers the conductive layer 380. Each of the plurality of conductive layers 320, 340, 360, 380 of the second conductive layer group 300b may be used as a cell gate pattern. For this purpose, the plurality of conductive layers 320, 340, 360, 380 may be formed by depositing doped polycrystalline silicon or metal. The plurality of conductive layers 320, 340, 360, 380 may each have substantially the same thickness. In this specification, the term "second conductive layer group 300b" may be exchanged with the term "second cell gate pattern", and the term "each of the plurality of conductive layers" 320, 340, 360, 380 may be exchanged with the term in "second cell gate pattern." The plurality of insulating layers 310, 330, 350, 370, 390 may be formed by depositing silicon nitride or silicon oxynitride having a dielectric constant higher than silicon oxide. Each of the second insulating layer group 300a and the second conductive layer group 300b may be formed in a step form.

Referring to FIG. 5J, the second insulating layer group 300a and the second conductive layer group 300b are patterned using a process that is the same as or similar to that described with reference to FIG. 5F to form a third opening 302 that exposes the second active bar ACT2. The second gate dielectric portion 204 may be exposed by the third opening 302. The third opening 302 may be formed using, for example, a dry etching process so as to provide an opening having vertical sidewalls 302 and to thus realize uniform electrical characteristics for the transistors. The second opening 202 and the third opening 302 may be connected in a vertical direction.

Although the third opening 302 is formed inclined with a predetermined angle, the number of conductive layers 320, 340, 360, 380 constituting the second conductive layer group 300b and the number of insulating layers 310, 330, 350, 370, 390 constituting the second insulating layer group 300a may be selected such that a third active bar can be formed at a height that can neglect an increasing degree of cell dispersion. In one example, the second conductive layer group 300b and the first conductive layer group 200b may be formed in the same structure and the second insulating layer group 300a and the first insulating layer group 200a may be formed in the same structure.

Referring to FIG. 5K, an insulating layer 304 is formed on the sidewalls 302a of the third opening 302 using a process that is the same as or similar to that described with reference to FIG. 5G. The insulating layer 304 may be used as a gate dielectric (hereinafter, referred to as the "third gate dielectric") of the second cell gate pattern group 300b. The third gate dielectric portion 304 may be formed with the same structure as the second gate dielectric portion 204. In one example, the third gate dielectric portion 304 may be formed in a triple layer structure by sequentially depositing a silicon oxide layer that acts as a blocking barrier, a silicon nitride layer or a silicon oxynitride layer that acts as a charge storage layer, and a silicon oxide layer that acts as a tunnel barrier.

In the deposition process for forming the third gate dielectric portion 304, the third gate dielectric portion 304 may be deposited on the second active bar ACT2 that is exposed by the third opening 302. The third gate dielectric portion that is deposited on the second active bar ACT2 may be removed via etching. A spacer for protecting the third gate dielectric portion 304 deposited on the sidewalls 302a of the third opening 302 from the etching may be formed prior to the etching operation.

Referring to FIG. 5L, a third active bar ACT3 is deposited in the third opening 302 using a process that is the same as or similar to that described with reference to FIG. 5D. The third active bar ACT3 may be connected to the second active bar ACT2 in a vertical direction and to the surface of the semiconductor substrate 100. The third active bar ACT3 may be formed of the same material as the second active bar ACT2. In some embodiments, the third active bar ACT3 may be formed by depositing amorphous or polycrystalline silicon and then planarizing the deposited amorphous or polycrystalline silicon layer through a chemical mechanical polishing (CMP) process, or by epitaxially growing a single crystalline silicon layer from the second active bar ACT2. The third active bar ACT3 may be formed with the same conductivity type as the semiconductor substrate 100, the first active bar ACT1 and the second active bar ACT2, for example, P-type conductivity. In other embodiments, the semiconductor substrate 100, the first, second and third active bars may not be doped with dopants.

Through the foregoing processes, a third structure 301 including the plurality of cell gate patterns 320, 340, 360, 380 on the second structure 201, and the third active bar ACT3 used as a channel of the plurality of cell gate patterns 320, 340, 360, 380 can be formed.

Referring to FIG. 5M, an insulating layer 410, a conductive layer 420, and an insulating layer 430 are sequentially formed on the third structure 301 by, for example, a process that is the same as or similar to that described with reference to FIG. 5A. The insulating layers 410, 430 may be formed by depositing an insulating material such as silicon oxide, silicon nitride, silicon oxynitride or the like. The conductive layer 420 may be used as an upper select gate. The conductive layer 420 (hereinafter, referred to as the "upper select gate") may be formed by depositing a conducive material layer, for example, doped polycrystalline silicon or metal such that the conductive layer 420 can be used as a gate.

Referring to FIG. 5N, a fourth opening 402 that exposes the third active bar ACT3 is formed via a process that is the same as or similar to that described with reference to FIG. 5B. The fourth opening 402 may be formed using, for example, a dry etching process so as to have substantially vertical sidewalls 302.

Referring to FIG. 5O, an insulating layer 404 is formed on sidewalls 402a of the third opening 302 via a process that is the same as or similar to that described with reference to FIG. 5C. The insulating layer 404 may be used as a gate dielectric (hereinafter, referred to as the "fourth gate dielectric") of the upper select gate 420. The fourth gate dielectric 404 may be formed by depositing, for example, a silicon oxide layer. In the deposition process for forming the fourth gate dielectric 404, the silicon oxide layer may be deposited on the third active bar ACT3 that is exposed by the fourth opening 402. The silicon oxide layer deposited on the third active bar ACT3 may be removed using an etching process. In this case, a spacer for protecting the silicon oxide layer that is deposited on the sidewalls 402a of the fourth opening 402 from the etching may be formed prior to the etching step.

Referring to FIG. 5P, a fourth active bar ACT4 is formed in the fourth opening 402 using a process that is the same as or similar to that described with reference to FIG. 5D. The fourth active bar ACT4 may be connected to the third active bar ACT3 in a vertical direction and to the surface of the semiconductor substrate 100. The fourth active bar ACT4 may be formed of the same material as the third active bar ACT3. In some embodiments, the fourth active bar ACT4 may be formed by depositing amorphous or polycrystalline silicon and then planarizing the deposited amorphous or polycrystalline silicon layer through a chemical mechanical polishing (CMP) process. In other embodiments, the fourth active bar ACT4 may be formed by epitaxially growing a single crystalline silicon layer from the third active bar ACT3. The fourth active bar ACT4 may be formed to have the same conductivity type as the semiconductor substrate 100, for example, P-type conductivity. In other embodiments, the semiconductor substrate 100, the first, second, third and fourth active bars ACT1, ACT2, ACT3 and ACT4 may not be doped with dopants.

Through the foregoing processes, a fourth structure 401 that includes the upper select gate and the fourth active bar ACT4 (which is used as a channel of the upper select gate) can be formed on the third structure 301. The active bar which is formed on the semiconductor substrate 100 may be formed of the same material (e.g., silicon) as the semiconductor substrate 100, and may have the same conductivity type as the semiconductor substrate 100.

In particular, since the active bar ACT is foamed by separately forming the first to fourth active bars ACT1 to ACT4, it is possible to minimize a width difference according to height of each of the first to fourth active bars ACT1 to ACT4. Accordingly, since the width of the active bar ACT can be set to not vary greatly according to its height, deterioration of cell dispersion characteristics can be reduced and/or minimized.

A bit line 610 that is electrically connected to the active bar ACT may be formed on the fourth structure 401. The bit line 610 may be formed to extend in a direction that crosses the upper select gate 420. In one example, the bit line 610 may be formed by depositing an aluminum layer on the fourth structure 401 and then patterning the deposited aluminum layer through a photolithography and etching process.

Figure 6A:
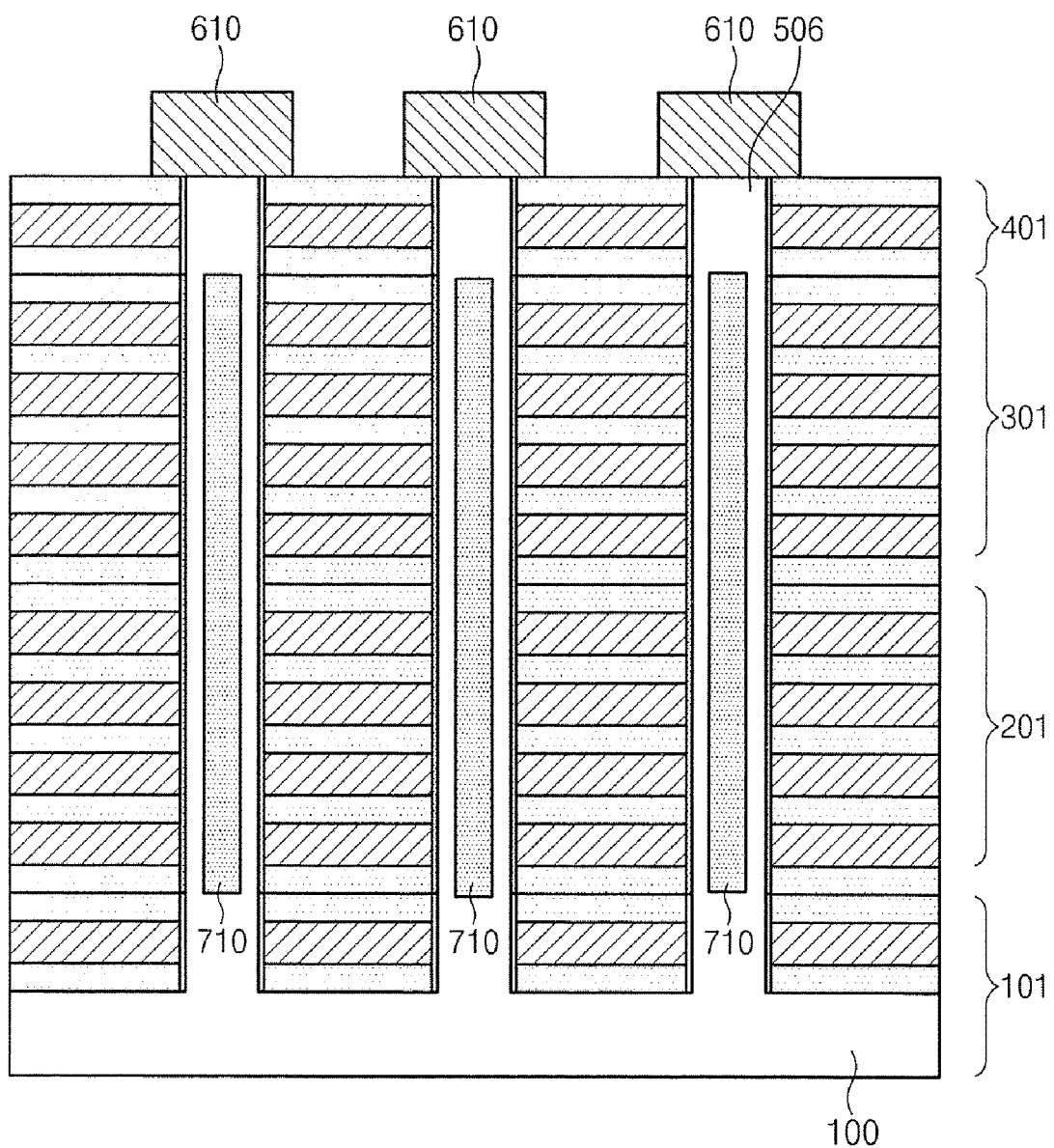
FIGS. 6A and 6B are cross-sectional views illustrating a method for manufacturing a nonvolatile memory device according to a modified embodiment of the inventive concept.
Figure 6B:
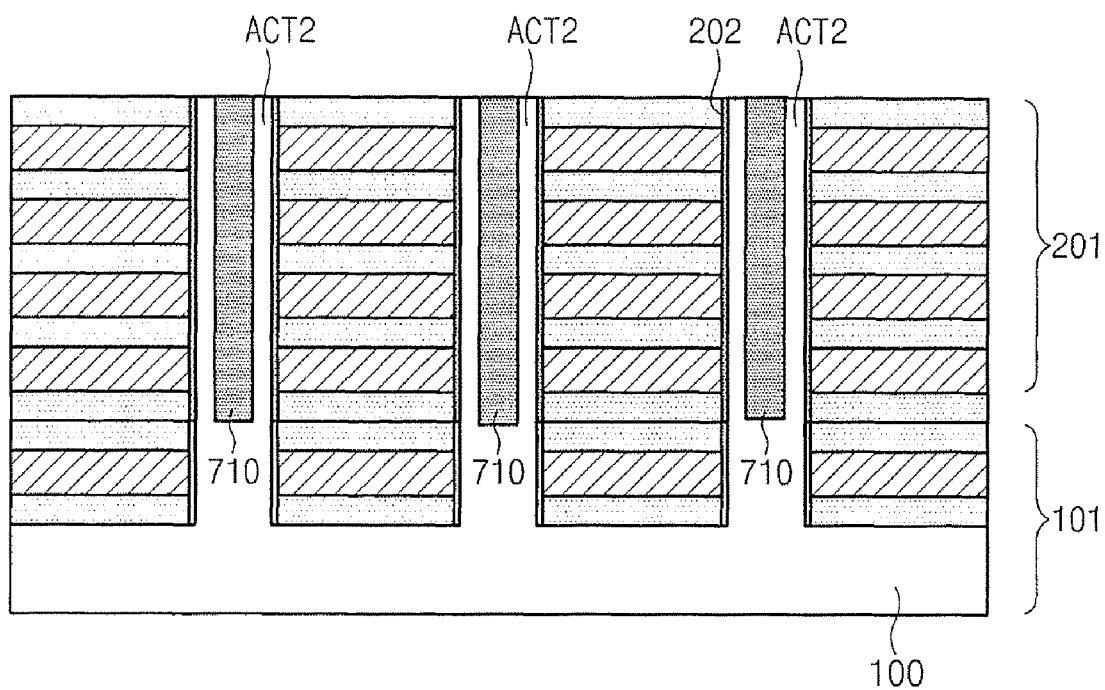

FIGS. 6A and 6B are cross-sectional views illustrating a method for manufacturing a nonvolatile memory device according to a modified embodiment of the inventive concept.

Referring to FIG. 6A, the nonvolatile memory device may be formed to have an active bar ACT that has a cylindrical share with an opening extending through the center of the cylinder along the longitudinal axis of the cylinder. An insulator 710 is formed in the opening through the active bar ACT as shown in FIG. 3B. The insulator 710 may be formed by depositing, for example, a silicon oxide layer. In some embodiments, referring to FIG. 6B, during the formation of the second structure 201, silicon is deposited into the second opening 202 such that the second active bar ACT2 does not completely fill the second opening 202. For example, when silicon is deposited to form the second active bar ACT2, the silicon is deposited starting from the sidewalls of the second opening 202 toward a core of the second opening 202, so that the second active bar ACT2 can be formed in a hollow cylinder shape. Thereafter, a hollow core of the second active bar ACT2 is filled with the insulator 710. By repeating the foregoing processes while forming the third structure (see 301 of FIG. 6A), the active bar ACT (see 506 of FIG. 6A) having the hollow cylinder structure may be formed.

Figure 7A:
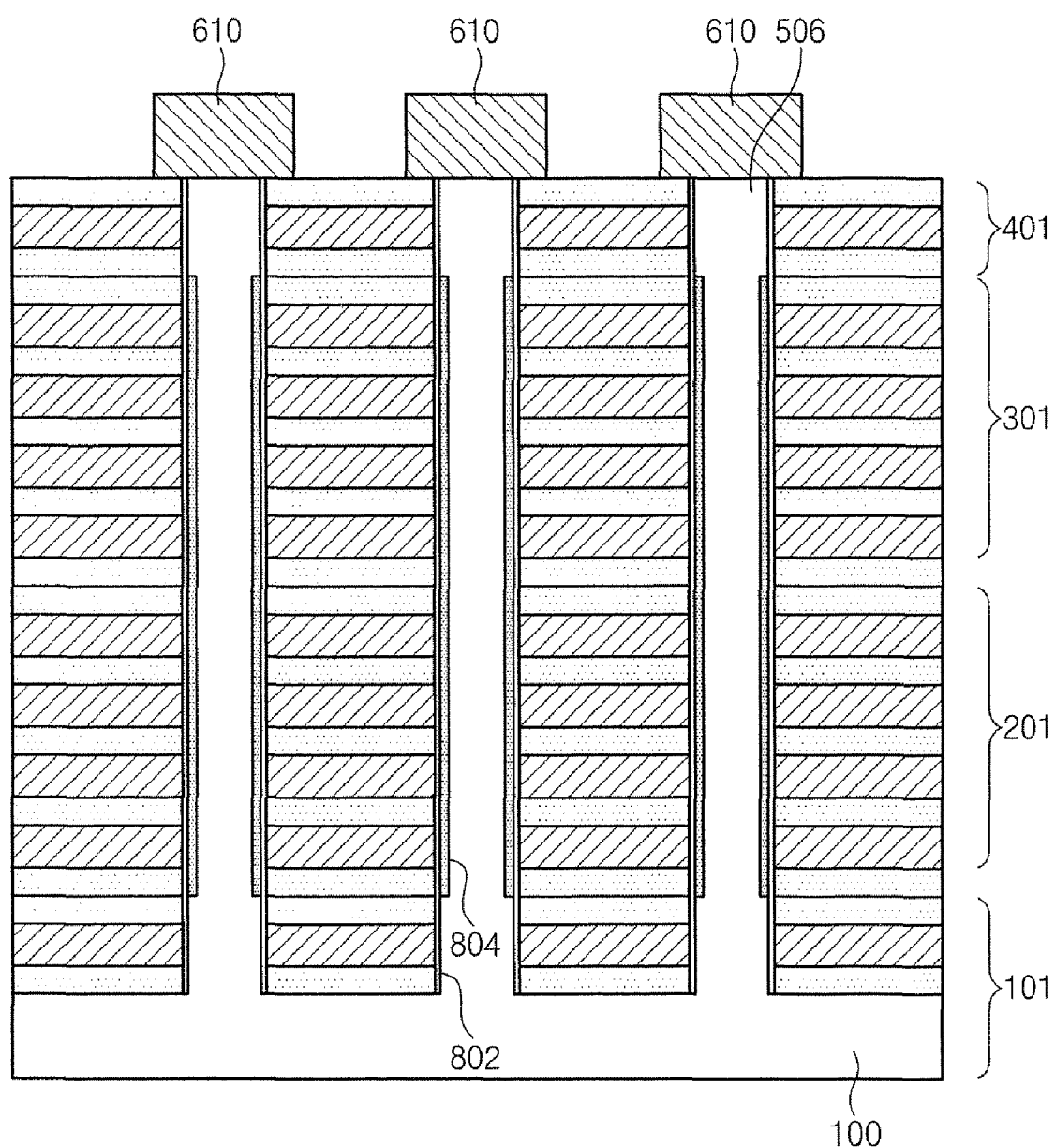
FIGS. 7A and 7B are cross-sectional views illustrating a method for manufacturing a nonvolatile memory device according to another modified embodiment of the inventive concept.
Figure 7B:
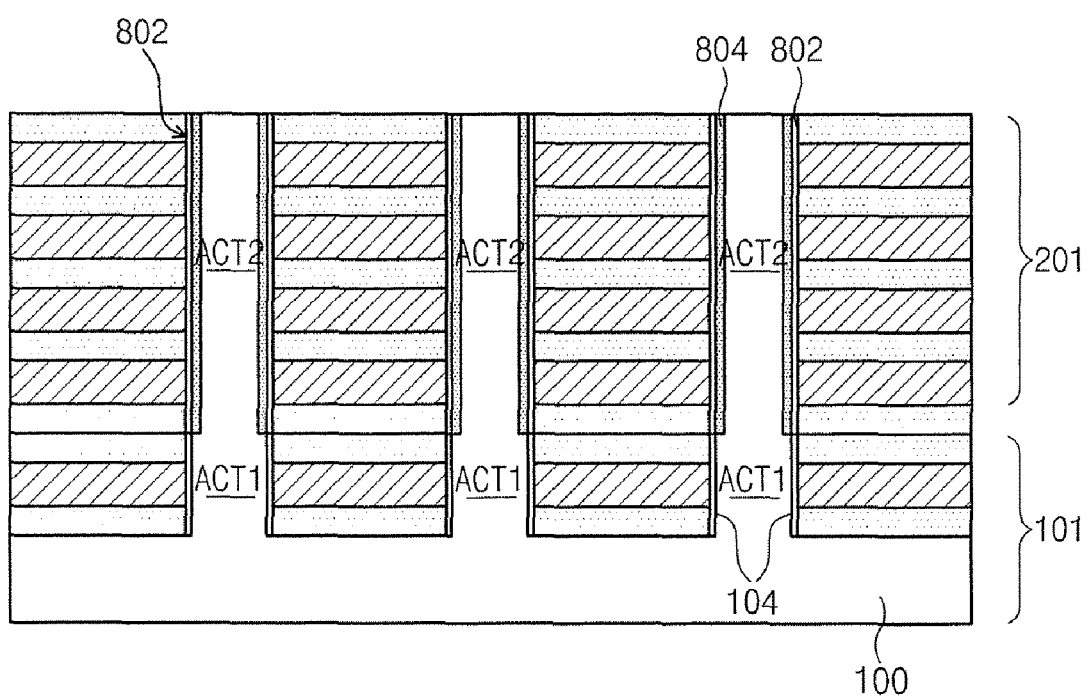

FIGS. 7A and 7B are cross-sectional views illustrating a method for manufacturing a nonvolatile memory device according to another modified embodiment of the inventive concept.

Referring to FIG. 7A, a gate dielectric 802 functioning as a tunnel barrier and a data storage layer 804 for trapping a charge may be formed in the active bar ACT. The data storage layer 804 may be formed by depositing a silicon nitride layer or a silicon oxynitride layer while forming the second structure 201 and the third structure 301. In some embodiments, referring to FIG. 7B, a second gate dielectric portion 802 and the data storage layer 804 may be sequentially formed by depositing the same material as the first gate dielectric portion 104, for example, silicon oxide. By repeating the foregoing processes while forming the third structure (see 301 of FIG. 7A), the nonvolatile memory device shown in FIG. 7A may be formed.

Figure 8A:
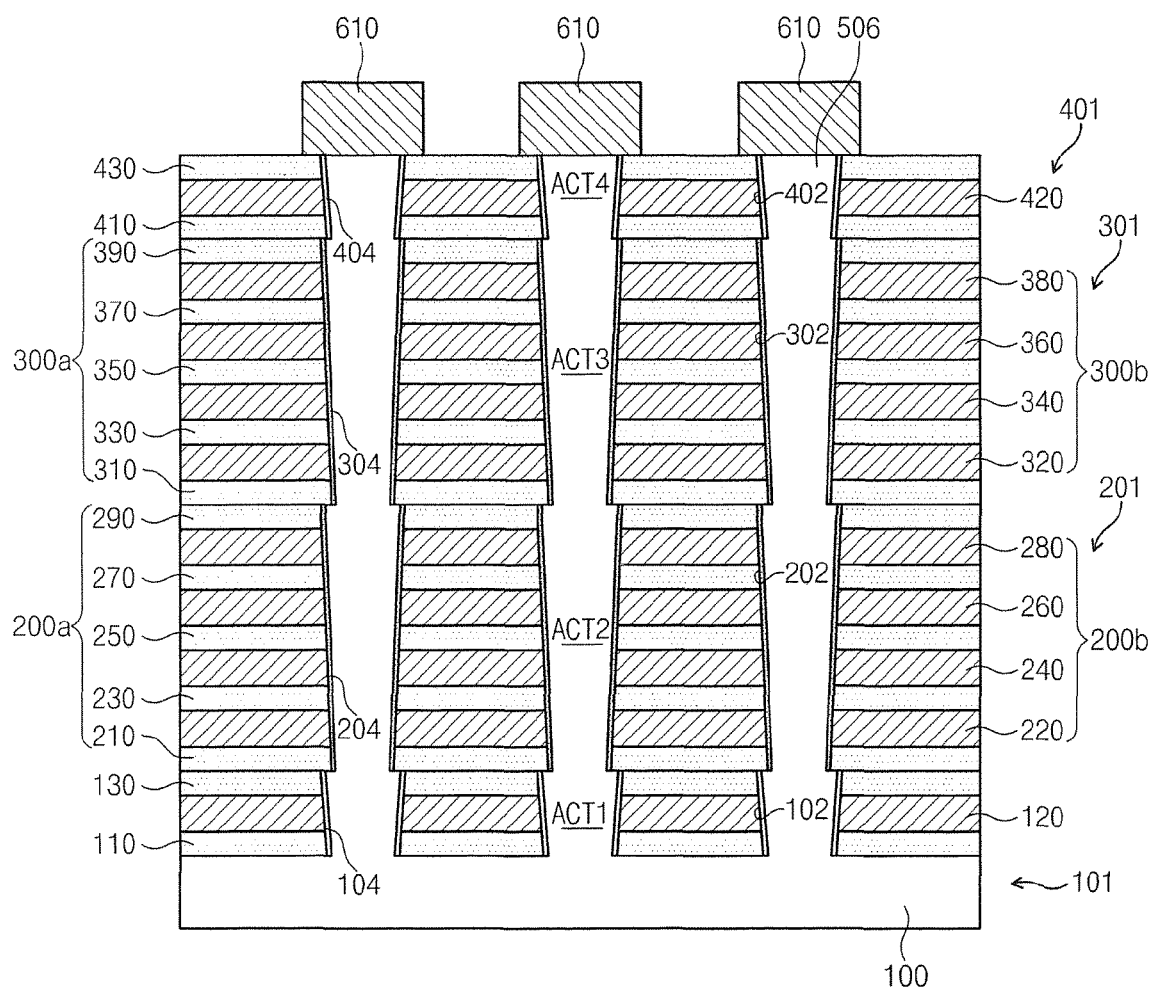
FIGS. 8A and 8B are cross-sectional views illustrating a method for manufacturing a nonvolatile memory device according to still another modified embodiment of the inventive concept.
Figure 8B:
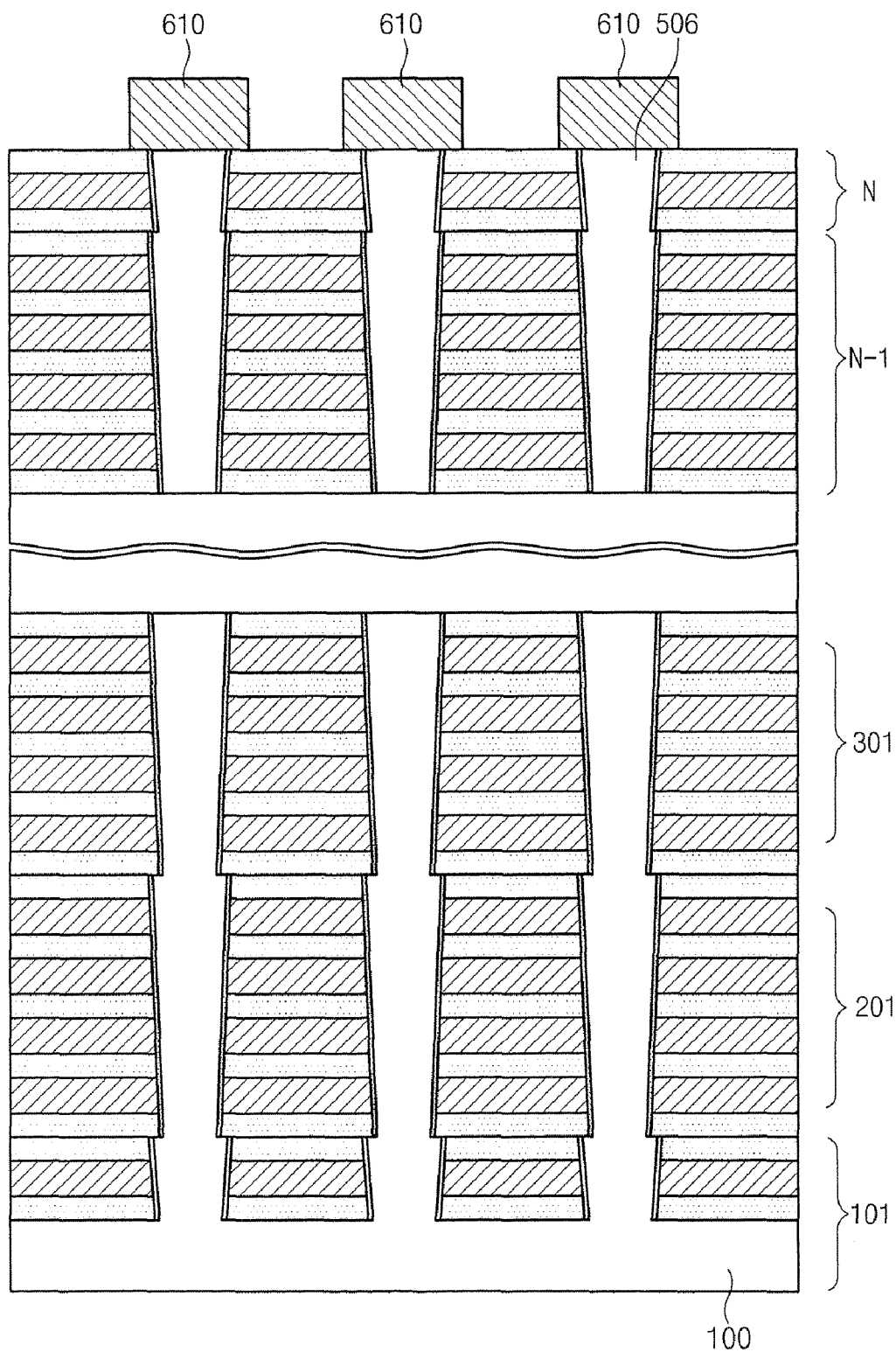

FIGS. 8A and 8B are cross-sectional views illustrating a method for manufacturing a nonvolatile memory device according to still another modified embodiment of the inventive concept.

Referring to FIG. 8A, a nonvolatile memory device can be formed by using a process that is the same as or similar to that described with reference to FIGS. 5A to 5P. In some embodiments, an insulating layer 110, a conductive layer 120 (or lower select gate) and an insulating layer 130 may be sequentially deposited on a semiconductor substrate 100. A first opening 102 may be formed by using a photolithography and etching process and a first gate dielectric portion 104 may be formed on sidewalls of the first opening ACT1. A first structure 101 may be formed by forming a first active bar ACT1 in the first opening 102 through a deposition process and a CMP process. The first opening 102 may be formed inclined and accordingly the first active bar ACT1 may be formed, for example, in an inclined bar shape. In one example, the first active bar ACT1 may be tapered as it goes from a top thereof to a bottom thereof.

A first insulating layer group 200a including a plurality of insulating layers 210, 230, 250, 270, 290 and a first conductive layer group 200b including a plurality of conductive layers 220, 240, 260, 280 may be deposited on the first structure 101. A second opening 202 aligned in a vertical direction with the first opening 102 may be formed by using a photolithography and etching process, and a second gate dielectric portion 204 may be deposited on sidewalls of the second opening 202. A second active bar ACT2 may be formed in the second opening via a deposition process and a CMP process, so that a second structure 201 may be formed. The second opening 202 may be formed by using a dry etching process so as to set the shape of the second opening 202 in a vertical direction as soon as possible.

Even when a dry etching technique is used, the second opening 202 may be inclined. For example, a lower portion of the second opening 202 may have a width that is greater than a width of an upper portion of the second opening 202. When the number of the plurality of conductive layers 220, 240, 260, 280 constituting the first conductive layer group 200b is increased, the inclination of the second opening 202 may also be increased. When the second opening 202 is formed inclined, the second active bar ACT2 has a width that varies with height thereof. In one example, the second active bar ACT2 may be tapered as it goes from a top portion thereof to a bottom portion thereof.

The inclined second active bar ACT2 may change the channel width of the memory transistors that are formed in each of the plurality of conductive layers 220, 240, 260, 280 constituting the first conductive layer group 200b as a first cell gate pattern, so that the electrical characteristics of memory cells may not be uniform. Therefore, the inclined second active bar ACT2 may be formed at such a height that can neglect an increasing degree of cell dispersion. For this purpose, the number of the plurality of conductive layers 220, 240, 260, 280 constituting the first conductive layer group 200b and the number of the plurality of insulating layers 210, 230, 250, 270, 290 constituting the first insulating layer group 200a may be selected properly. In this embodiment, while the number of the plurality of conductive layers 220, 240, 260, 280 constituting the first conductive layer group 200b is, for example, limited to 4 layers and the number of the plurality of insulating layers 210, 230, 250, 270, 290 constituting the first insulating layer group 200a is, for example, limited to 5 layers, these numbers may be varied in other embodiments.

A third structure 301 including a plurality of conductive layers (or cell gate patterns) 320, 340, 360, 380 and a third gate dielectric portion 304 to trap a charge may be formed by using a process that is the same as or similar to the process for forming the second structure 201. Like the second active bar ACT2, the third active bar ACT3 may be formed inclined.

An insulating layer 410, a conductive layer 420 (or upper select gate) and an insulating layer 430 may be sequentially deposited on the third structure. A fourth opening 402 may be formed by using a photolithography and etching process and a fourth gate dielectric portion 404 may be deposited on sidewalls of the fourth opening 402. A fourth structure 401 may be formed by forming a fourth active bar ACT4 in the fourth opening 402 through a deposition process and a CMP process. The fourth opening 402 may be formed inclined and, accordingly, the fourth active bar ACT4 may be formed in an inclined bar shape. A bit line 610 that is electrically connected to the fourth active bar ACT4 may be formed by depositing and patterning a conductor such as metal.

As in the previous embodiments, the active bar ACT may be formed by vertically connecting the first to fourth active bars ACT1 to ACT4 that are formed by repeating a process 4 times. Since each of the first to fourth active bars ACT1 to ACT4 can minimize a difference of width according to height, the active bar ACT can minimize a difference of width according to height as will be described with reference to FIG. 8C. As shown in FIG. 8B, while the processes for forming the active bar ACT are performed N times (N is an integer more than 4), the width variation of the active bar ACT can be reduced and/or minimized.

Figure 8C:
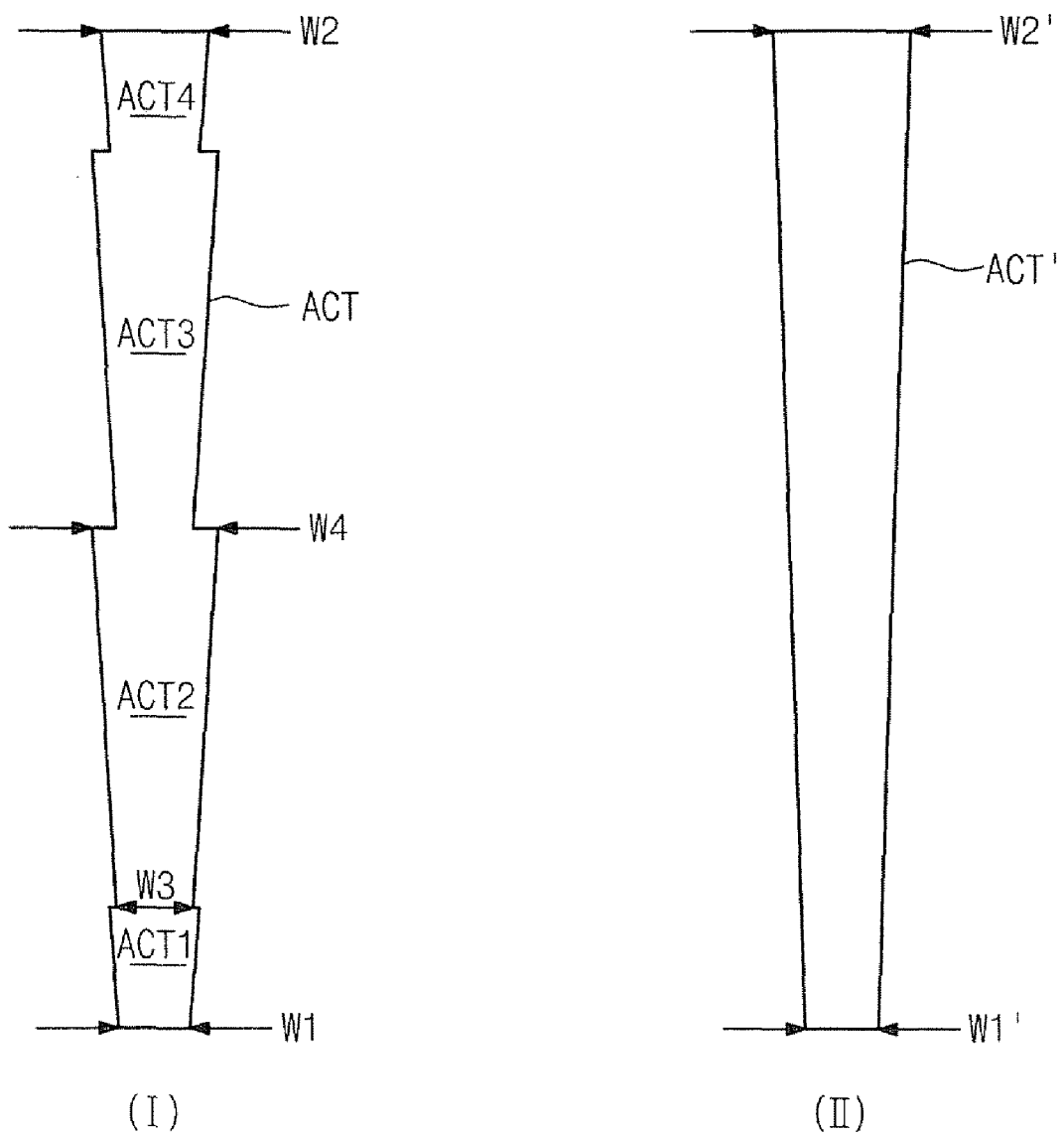
FIG. 8C is cross-sectional views illustrating an active bar (I) which can be formed through a process that is repeated several times and an active bar (II) which can be formed through a process that is performed a single time according to a method for manufacturing a nonvolatile memory device according to yet another embodiment of the inventive concept.

FIG. 8C are cross-sectional views of an active bar I which is formed through a process that is repeated several times, and an active bar II which is formed through a process that performed only once in a method for manufacturing a nonvolatile memory device according to another modified embodiment of the inventive concept.

Referring to FIG. 8C, as described with reference to FIG. 8A, the active bar ACT may be formed by forming the first to fourth active bars ACT1 to ACT4 which are formed through 4 separate processes. Accordingly, the difference of width according to height of the active bar ACT may be greatly decreased compared with the difference of width according to height of the active bar ACT'. For example, when the active bar ACT' is formed via a dry etching process, an upper portion of the active bar ACT' continues to be dry-etched while a lower portion of the active bar ACT' is etched, and the upper portion of the active bar ACT' experiences relatively more damage due to the plasma used in the dry etching. Accordingly, the upper width W2' of the active bar ACT' may be greater than the upper width W2 of the active bar ACT. In addition, the lower width W1' of the active bar ACT' may be smaller than the lower width W1 of the active bar ACT. Therefore, the difference (W2−W1) between the upper width W2 and the lower width W1 of the active bar ACT may be significantly smaller than the difference (W2'−W1') between the upper width W2' and the lower width W1' of the active bar ACT'.

In the active bar ACT, the difference (W4−W3) between the upper width W4 and the lower width W3 of the second active bar ACT2 may be greater than the difference (W2−W1) between the upper width W2 and the lower width W1 of the active bar ACT. However, since the height of the second active bar ACT2 is smaller than that of the active bar ACT', the upper width W4 of the second active bar ACT2 may be smaller than the upper width W2' of the active bar ACT'. In addition, the lower width W3 of the second active bar ACT2 may be greater than the lower width W1' of the active bar ACT'. Accordingly, the difference (W4−W3) between the upper width W4 and the lower width W3 of the second active bar ACT2 may be smaller than the difference (W2'−W1') between the upper width W2' and the lower width W1' of the active bar ACT'. The description on the difference of width of the second active bar ACT2 can be equivalently applied to the case of the third active bar ACTS.

As described above, since the active bar ACT formed through a process repeated several times can minimize the difference between the upper width and the lower width thereof compared with the active bar ACT' formed by a single process, the uniformity of electrical characteristics of the transistors of the semiconductor memory device can be secured. This description can be equivalently applied to the active bar ACT formed through N-times processes as described with reference to FIG. 8B.

Second Device Embodiment

Figure 9:
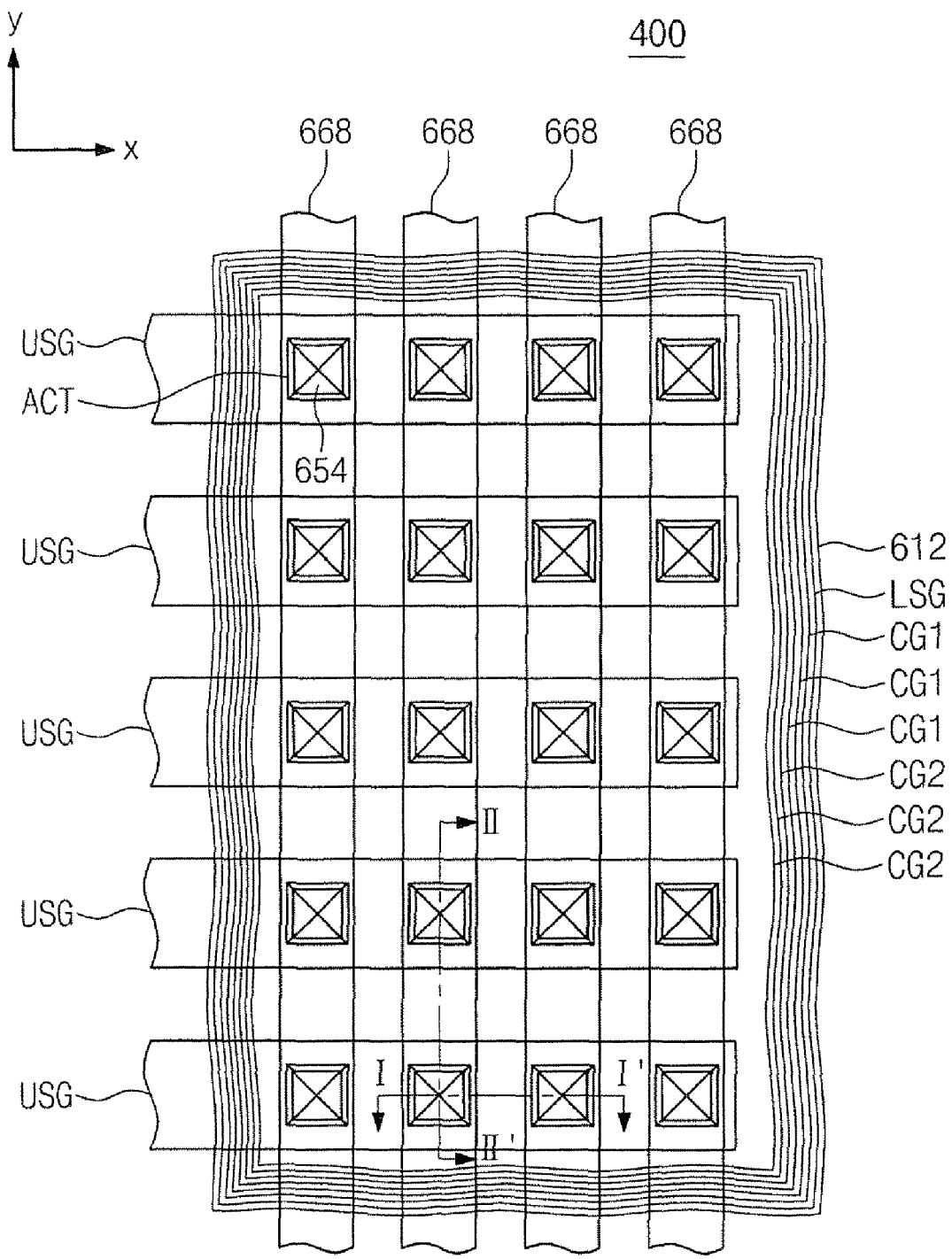
FIG. 9 is a plan view of a nonvolatile memory device according to another embodiment of the inventive concept.
Figure 10A:
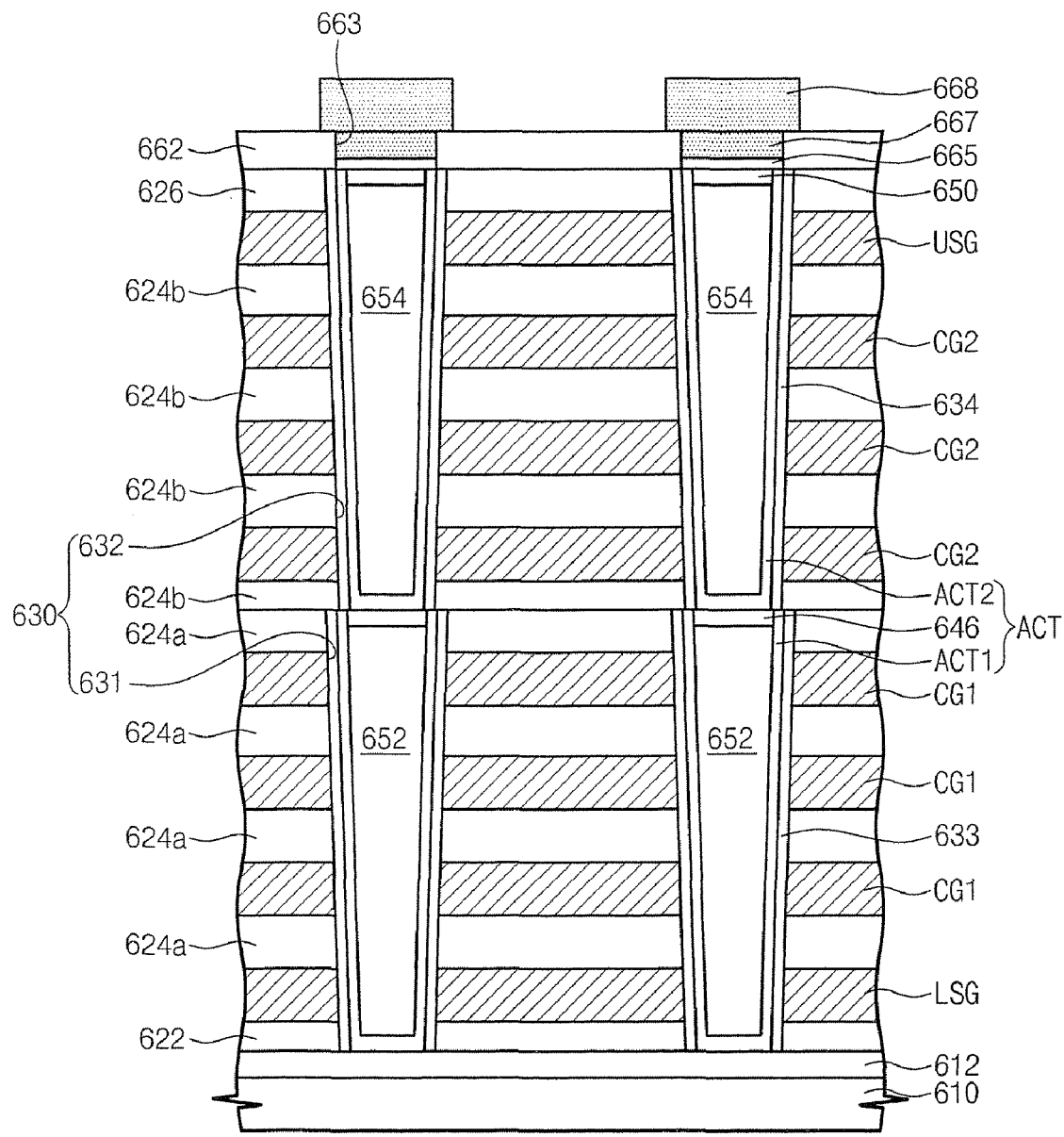
FIG. 10A is a cross-sectional view taken along line I-I' of FIG. 9

A nonvolatile memory device according to another embodiment of the inventive concept will now be described with reference to FIGS. 9, 10A and 10B. FIG. 9 is a plan view of a nonvolatile memory device according to another embodiment of the inventive concept. FIG. 10A is a cross-sectional view taken along line I-I' of FIG. 9 and FIG. 10B is a cross-sectional view taken along line II-II' of FIG. 9.

Figure 10B:
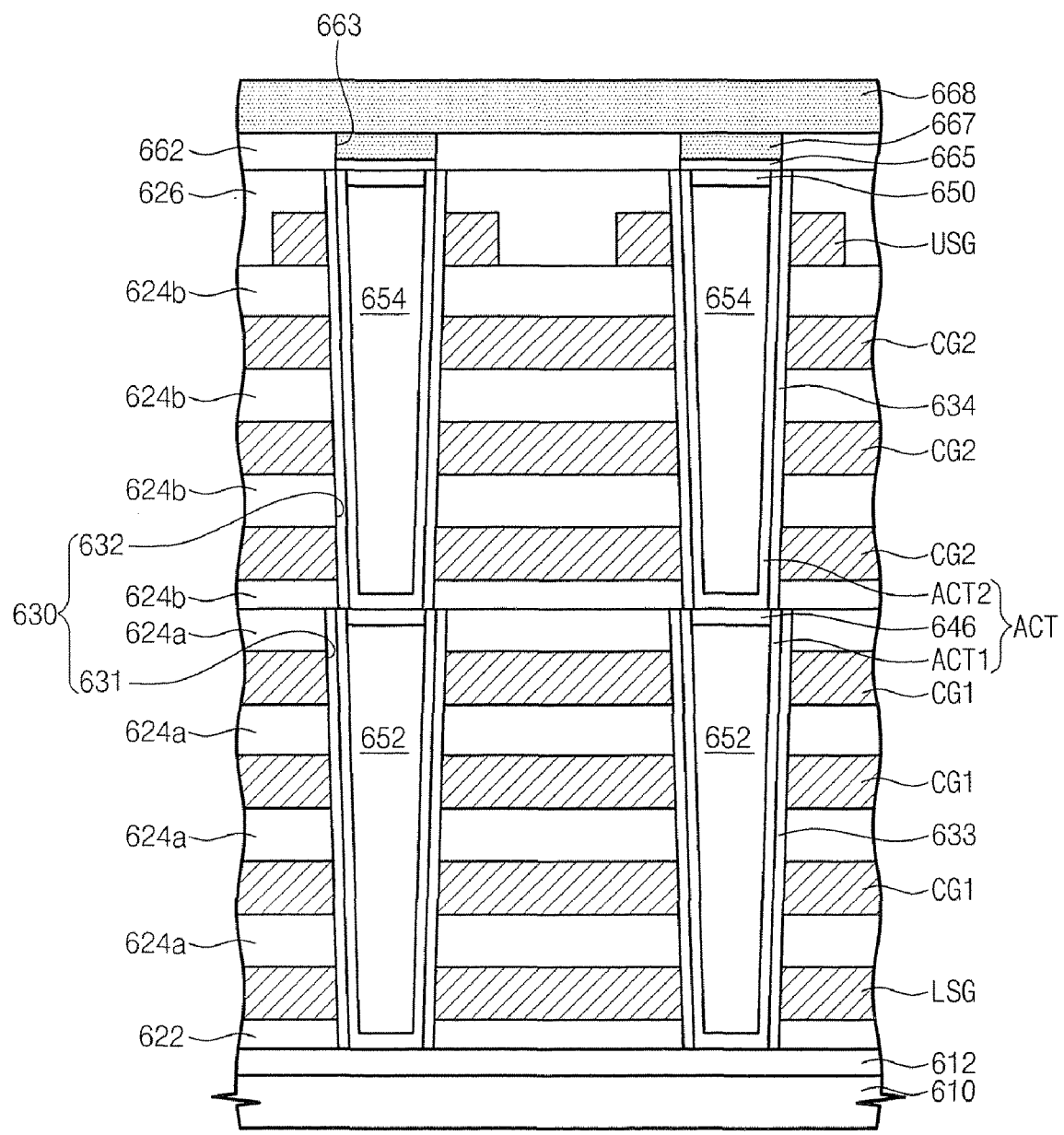
FIG. 10B is a cross-sectional view taken along line II-II' of FIG. 9.

Referring to FIGS. 9, 10A and 10B, a semiconductor substrate 610 that includes a well region is prepared. The well region may be a region of the semiconductor substrate 610 doped with dopants. The well region may be doped, for example, with a first conductivity type dopant. A common source region 612 may be disposed in the well region. The common source region 612 may be a region doped with a second conductivity type dopant. The well region and the common source region 612 may be disposed throughout an entire region of a cell region of the semiconductor substrate 610.

A base insulation pattern 622 is disposed on the semiconductor substrate 610. Gate patterns LSG, CG1, CG2, USG and insulation patterns 624a, 624b, 626 are stacked on the base insulation pattern 622. The gate patterns LSG, CG1, CG2, USG may be composed of first lower gate patterns LSG, CG1 and second upper gate patterns CG2, USG.

The lowermost gate pattern LSG may be a lower select gate pattern. The lower select gate pattern LSG may have a planar plate shape and may extend across the entire cell region of the semiconductor substrate 610.

The cell gate patterns CG1, CG2 may be formed on the lowermost insulation patterns 624a, 624b, respectively. The first cell gate pattern CG1 may be adjacent the lower gate pattern LSG, and the second cell gate pattern CG2 may be adjacent the upper gate pattern USG. The cell gate patterns CG1, CG2 may have a planar plate shape and may be disposed parallel to the lower select gate pattern LSG.

The uppermost gate pattern USG may be an upper select gate pattern. The upper select gate pattern USG may be partially disposed on the second cell gate pattern CG2. In some embodiments, the upper select gate pattern USG may have a line shape and may extend in a first direction. As shown in FIG. 9, the plurality of upper select gate patterns USG may be disposed on the cell region of the semiconductor substrate 610. The upper select gate patterns USG on the uppermost insulation pattern 624b may extend in the first direction in parallel with the uppermost insulation pattern 624b.

The insulation patterns 624a, 624b may be disposed between the gate patterns LSG, CG1, CG2, USG. Specifically, the first insulation pattern 624a may be disposed between the first cell gate patterns CG1, and the second insulation pattern 624b may be disposed between the second cell gate patterns CG2. The lowermost first insulation pattern 624a may be disposed between the lowermost first cell gate pattern CG1 and the lower select gate pattern LSG. Between the uppermost first cell gate pattern CG1 and the lowermost second cell gate pattern CG2, the first insulation patterns 624a and the second insulation patterns 624b may be disposed together. The uppermost second insulation pattern 624b may be disposed between the uppermost second cell gate pattern CG2 and the upper select gate pattern USG.

An upper insulation pattern 626 may be disposed on the upper select gate pattern USG. As shown in FIG. 10B, the upper insulation pattern 626 may extend to cover sidewalls of the upper select gate pattern USG.

An opening 630 is provided in the gate patterns LSG, CG1, CG2, USG. The opening 630 may have sidewalls defined by sidewalls of the gate patterns LSG, CG1, CG2, USG and the insulation patterns 622, 624a, 624b, 626, and a bottom defined by the semiconductor substrate 610. The opening 630 may be a hole type opening.

The opening 630 may include a first hole 631 that penetrates the lower select gate pattern LSG and the first cell gate patterns CG1 and a second hole 632 that penetrates the second cell gate patterns CG2 and the upper select gate pattern USG. The first hole 631 and the second hole 632 are connected in a vertical direction. A face extending from the sidewall of the first hole 631 is in parallel but may not be consistent with a face extending from the sidewall of the second hole 632. That is, the sidewall of the first hole 631 and the sidewall of the second hole 632 may not be positioned on the same face. In one embodiment, the first hole 631 may have the narrowest width at a region adjacent to the semiconductor substrate 610, and the widest width at a region adjacent to the second hole 632. In other words, the sidewall of the first hole 631 may be inclined. The second hole 632 may have the narrowest width at a region adjacent to the first hole 631, and the widest width at a region adjacent to the upper insulation pattern 626.

An active bar ACT may be disposed on the sidewalls of the opening 630. The active bar ACT extends upward from the semiconductor substrate 610 along the sidewalls of the gate patterns LSG, CG1, CG2, USG and the sidewalls of the insulation patterns 622, 624a, 624b, 626.

The active bar ACT may include a first sub-active bar ACT1, a second sub-active bar ACT2 above the first sub-active bar ACT1, and a first pad portion 646 connecting the first sub-active bar ACT1 and the second sub-active bar ACT2.

The first sub-active bar ACT1 may be disposed on the sidewalls of the first hole 631 of the opening 630. The first sub-active bar ACT1 may have an inner opening defined by sidewalls thereof. For example, the first sub-active bar ACT1 may have a shell shape. The first sub-active bar ACT1 may include a bottom portion that contacts the semiconductor substrate 610. In some embodiments (not shown in the figures), the active bar ACT may penetrate the common source region 612 and a lower portion of a sidewall of the active bar ACT may contact with the common source region 612. In other embodiments, the first sub-active bar ACT1 may not include a bottom portion. The first sub-active bar ACT1 may have a sidewall that is inclined with respect to the plane defined by a top surface of the semiconductor substrate 610. In one embodiment, the first sub-active bar ACT1 may have a truncated cone shape or frustum of pyramid shape. A lower width of the first sub-active bar ACT1 having the truncated cone shape or frustum of pyramid shape may be narrower than an upper width thereof. In other embodiments, the lower width of the first sub-active bar ACT1 may be substantially equal to the upper width thereof. The first sub-active bar ACT1 may have an upper surface that forms a closed loop. For example, the upper surface of the first sub-active bar ACT1 may have a ring shape.

The first sub-active bar ACT1 may comprise a semiconductor material. For example, the first sub-active bar ACT1 may comprise a single crystalline semiconductor material or polycrystalline semiconductor material.

In one embodiment, the inner space of the first sub-active bar ACT1 may be partially or completely filled with a first filling insulating layer 652. The first filling insulating layer 652 may be surrounded by the sidewalls of the first sub-active bar ACT1. A top surface of the first filling insulating layer 652 may be lower than a top surface of the uppermost first insulation pattern 624b (i.e., the top surface of the first filling insulating layer 652 is closer to the substrate 610 than is a top surface of the uppermost first insulation pattern 624b). The first pad portion 646 may be disposed on the filling insulating layer 652. A top surface of the first pad portion 646 may be coplanar with a top surface of the first sub-active bar ACT1. Alternatively, the first pad portion 646 may be disposed on the top surface of the first sub-active bar ACT1. A sectional area of the top surface of the first pad portion 646 may be wider than a sectional view of the top surface of the first sub-active bar ACT1. In one embodiment, the inner space of the first sub-active bar ACT1 may be closed.

The first pad portion 646 may comprise a semiconductor material which is the same as the semiconductor material used to form the first sub-active bar ACT1. Accordingly, the first sub-active bar ACT1 may be electrically connected to the first pad portion 646. The first pad portion 646 may increase the area where the first sub-active bar ACT1 electrically contacts other elements of the memory device.

The second sub-active bar ACT2 may be disposed on sidewalls of the second hole 632 of the opening 630. The second sub-active bar ACT2 may have sidewalls that are inclined with respect to the plane defined by the top surface of the semiconductor substrate 610. A circumference of the second sub-active bar ACT2 may increase with distance from the semiconductor substrate 610. In one embodiment, the second sub-active bar ACT2 may have a truncated cone shape or frustum of pyramid shape. A lower width of the second sub-active bar ACT2 having the truncated cone shape or frustum of pyramid shape may be narrower than an upper width thereof.

The second sub-active bar ACT2 may have an inner opening. In the case where the second sub-active bar ACT2 has such an inner opening, the inner opening may be similar to that of the first sub-active bar ACT1. In other embodiments, the second sub-active bar ACT2 may be solid and may fill the second hole 632. As shown in the drawings, the second sub-active bar ACT2 may include a bottom portion. Alternatively, the second sub-active bar ACT2 may not include a bottom portion.

The second sub-active bar ACT2 may comprise a semiconductor material. For example, the second sub-active bar ACT2 may comprise a single crystalline semiconductor material or polycrystalline semiconductor material. The second sub-active bar ACT2 may be formed of the same material as the first sub-active bar ACT1 and the first pad portion 646.

The second sub-active bar ACT2 may be electrically connected to the first sub-active bar ACT1 by the first pad portion 646. An outer wall of the second sub-active bar ACT2 that is adjacent the first pad portion 646 may be laterally offset from an outer wall of the first sub-active bar ACT1 that is adjacent the first pad portion 646 toward a core of the first pad portion 646. The outer wall of the first sub-active bar ACT1 is positioned lateral to a first gate dielectric portion 633. In one embodiment, the bottom surface of the second sub-active bar ACT2 may be narrower than the top surface of the first pad portion 646. Accordingly, some of the top surface of the first pad portion 646 may not contact the second sub-active bar ACT2. The portion of the top surface of the first pad portion 646 which does not contact the second sub-active bar ACT2 may be an edge of the top surface of the first pad portion 646.

In one embodiment, some of the second sub-active bar ACT2 directly contacts the first sub-active bar ACT1. That is, some portion of the second sub-active bar ACT2 electrically contacts the first sub-active bar ACT1 through the first pad portion 646, and the other portion of the second sub-active bar ACT2 directly contacts the first sub-active bar ACT1.

The first pad portion 646 may allow the second sub-active bar ACT2 to contact the first sub-active bar ACT1 more stably. As aforementioned, the second sub-active bar ACT2 may be electrically connected with the first sub-active bar ACT1 through a direct path and/or an indirect path via the first pad portion 646. In one embodiment, the first sub-active bar ACT1 may be formed in a shell shape having an inner opening. In the case where the first sub-active bar ACT1 is formed in a shell shape, the first sub-active bar ACT1 may have a narrow top surface. The first pad portion 646 is disposed on the inner space defined by the first sub-active bar ACT1, and makes it possible to electrically contact the first sub-active bar ACT1 and the second sub-active bar ACT2. By doing so, the first sub-active bar ACT1 and the second sub-active bar ACT2 can be electrically connected with each other more stably. Accordingly, nonvolatile memory devices with enhanced reliability can be provided.

The inner opening defined by the sidewalls of the second sub-active bar ACT2 that is provided in some embodiments may be filled with a second filling insulating layer 654. A top surface of the second filling insulating layer 654 may be positioned lower than the top surface of the uppermost insulation pattern 626. A second pad portion 650 may be disposed on the second filling insulating layer 654.

The second pad portion 650 may comprise a semiconductor material which is the same as the second sub-active bar ACT2. Accordingly, other elements of the memory device may be electrically connected with the second sub-active bar ACT2 by contacting the second pad portion 650. In some embodiments, a bit line (described later) may be electrically connected with the second sub-active bar ACT2 by contacting the second pad portion 650 and/or the second sub-active bar ACT2. Accordingly, the bit line can be electrically connected to the second sub-active bar ACT2 more easily and stably.

While the above embodiments show and describe nonvolatile memory devices that include two sub-active bars and a pad portion connecting these two sub-active bars, it will be understood that embodiments of the inventive concept may include a nonvolatile memory device including two or more sub-active bars and a first pad portion between the two or more sub-active bars. Specifically, a third sub-active bar, third gate patterns and elements connected with the third sub-active bar and/or the third gate patterns may be further disposed on the second sub-active bar and the second gate patterns. In this case, the uppermost gate pattern of the second gate patterns may be a cell gate pattern unlike the foregoing example. That is, the nonvolatile memory device according to embodiments of the inventive concept includes two or more sub-active bars and a pad portion connecting the two or more sub-active bars.

A gate dielectric 633, 634 is disposed between the active bar ACT and the gate patterns LSG, CG, USG. The gate dielectric 633, 634 may include two or more layers. The gate dielectric 633, 634 may include a blocking barrier adjacent the gate patterns LSG, CG, USG, a tunnel barrier adjacent the active bar ACT, and a charge storage layer between the blocking barrier and the tunnel barrier. In one embodiment, the gate dielectric 633, 634 may comprise an ONO layer.

The gate dielectric 633, 634 may include the first gate dielectric portion 633 disposed on the sidewalls of the first hole 631 and the second gate dielectric portion 634 disposed on the sidewalls of the second hole 632. In some embodiments, the first gate dielectric portion 633 and the second gate dielectric portion 634 may not be connected with each other. In other embodiments, the first gate dielectric portion 633 may be partially connected with the second gate dielectric portion 634. In one embodiment, a top surface of the first gate dielectric portion 633 of the gate dielectric may be coplanar with the top surface of the first pad portion 646 and the top surface of the first sub-active bar ACT1. Also, a bottom surface of the second gate dielectric portion 634 of the gate dielectric may contact the top surface of the first pad portion 646.

A bit line 668 may be disposed above the active bar ACT. The bit line 668 may extend in a direction crossing the upper select gate pattern USG. That is, the bit line 668 may extend in a second direction that is perpendicular to the first direction in which the upper select gate pattern USG extends. The second direction may correspond to an X-axis direction.

A bit line contact 667 may be disposed between the active bar ACT and the bit line 668. The active bar ACT and the bit line 668 may be electrically connected to each other by the bit line contact 667. An ohmic layer 665 may be further provided between the active bar ACT and the bit line contact 667.

Second Method Embodiment

Hereinafter, another method for manufacturing a nonvolatile memory device according to an embodiment of the inventive concept will be described with reference to FIGS. 9, 10A, 10B and 11A to 11I. FIGS. 11A through 11I are cross-sectional views taken along line I-I' of FIG. 9. The foregoing description may be partially omitted to the extent that it has already been described with respect to the description of the previous embodiments.

Figure 11A:
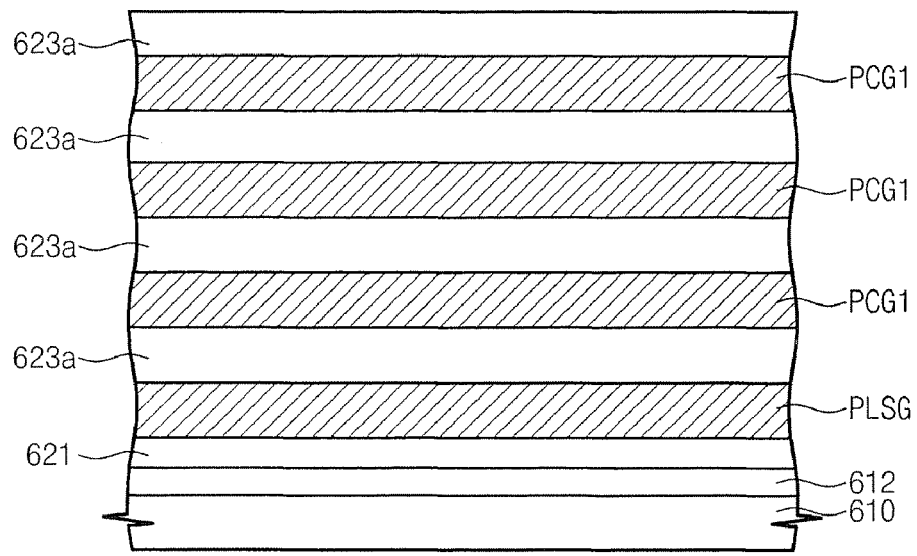
FIGS. 11A through 11I are cross-sectional views illustrating a method for manufacturing a nonvolatile memory device according to still another embodiment of the inventive concept.

Referring to FIG. 11A, a substrate 610 including a well region is prepared. The well region may be formed by doping an upper portion of a cell region of the substrate 610 with a first conductivity type dopant. A common source region 612 may be formed in the well region. The common source region 612 may be formed by doping an upper portion of the well region with a second conductivity type dopant.

A preliminary base insulation pattern 621 may be formed on the substrate 610. The preliminary base insulation pattern 621 may cover the cell region of the substrate 610. First preliminary gate patterns PLSG, PCG1 and first preliminary insulation patterns 623a are stacked on the preliminary base insulation pattern 621. Specifically, a preliminary lower select gate pattern PLSG is formed on the preliminary base insulation pattern 621. A lowermost first preliminary insulation pattern 623a is formed on the preliminary lower select gate pattern PLSG. Thereafter, first preliminary cell gate patterns PCG1 and first preliminary insulation patterns 623a are alternatingly and repeatedly stacked. The uppermost first preliminary cell gate pattern PCG1 may be coved by the uppermost first preliminary insulation pattern 623a.

Figure 11B:
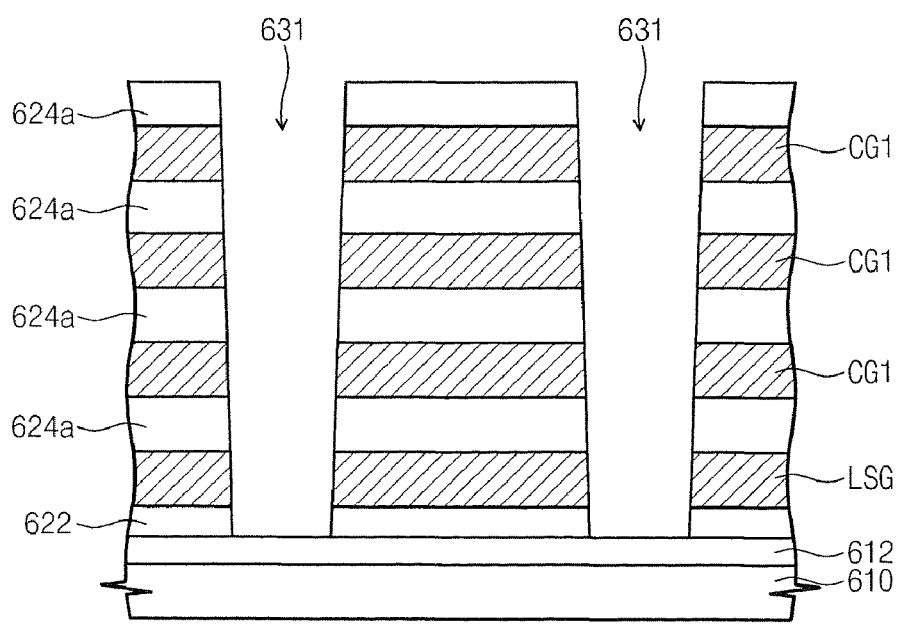

Referring to FIG. 11B, the first preliminary gate patterns PLSG, PCG1 and the first preliminary insulation patterns 621, 623a are etched to form first gate patterns LSG, CG1 and first insulation patterns 622, 624a. Specifically, the preliminary lower gate pattern PLSG is etched to form a lower gate pattern LSG, and the first preliminary cell gate patterns PCG1 are etched to form first cell gate patterns CG1. The preliminary base insulation pattern 621 is etched to form a base insulation pattern 622, and the first preliminary insulation patterns 623a are etched to form first insulation patterns 624a. Sidewalls of the first gate patterns LSG, CG1 and the first insulation patterns 622, 624a can define sidewalls of a first hole 631. The first hole 631 may include a bottom that is defined by a top surface of the substrate 610.

The sidewalls of the first hole 631 may not be perpendicular to the top surface of the substrate 610. That is, an angle between the sidewall of the first hole 631 and a plane defined by the top surface of the substrate 610 may be an oblique angle. An upper width of the first hole 631 may be greater than a lower width of the first hole 631. In one embodiment, the first hole 631 may have the narrowest width at a portion adjacent the substrate 610, and the widest width at a portion adjacent a portion farthest from the substrate 610. The width of the first hole 631 may increase with increasing distance from the substrate 610.

Figure 11C:
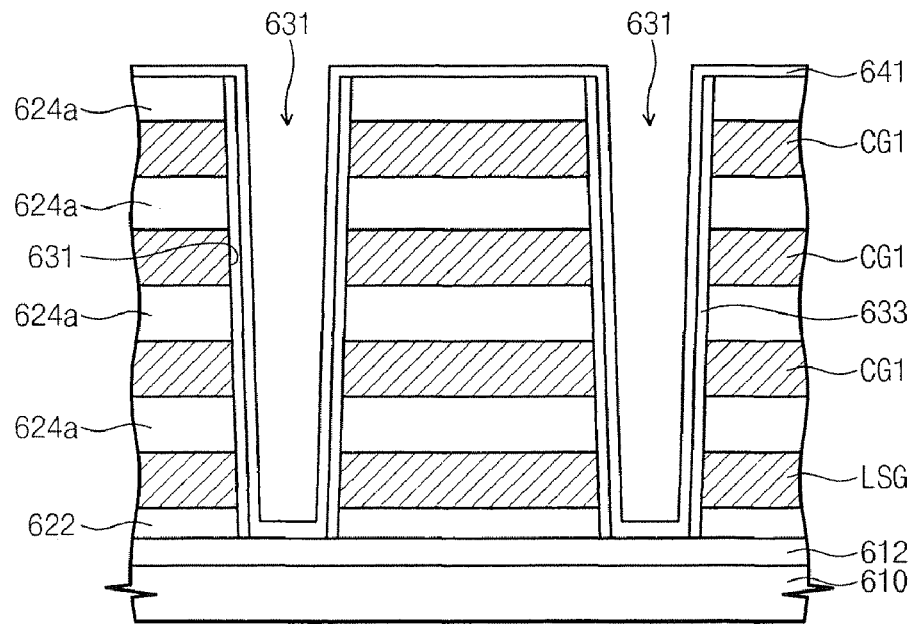

Referring to FIG. 11C, a first gate dielectric portion 633 of a gate dielectric and a first sub-active layer 641 are formed on the sidewalls of the first hole 631. The first gate dielectric portion 633 of the gate dielectric forms a blocking barrier on the gate pattern LSG, CG1, and may be formed by sequentially forming a charge storage layer and a tunnel barrier on the blocking barrier. In one embodiment, the blocking barrier may be formed by forming a thermal oxide layer on the gate patterns LSG, CG1. The charge storage layer and the tunnel barrier may be formed by sequentially forming a nitride layer and an oxide layer on the thermal oxide layer.

The first sub-active layer 641 may comprise a single crystalline semiconductor material or a polycrystalline semiconductor material. The first sub-active layer 641 may be formed conformally on the first gate dielectric portion 633. The first sub-active layer 641 may have sidewalls inclined along the sidewalls of the first hole 631. Alternatively, the first sub-active layer 641 may be formed as disclosed above, referring to FIGS. 6A and 6B.

Figure 11D:
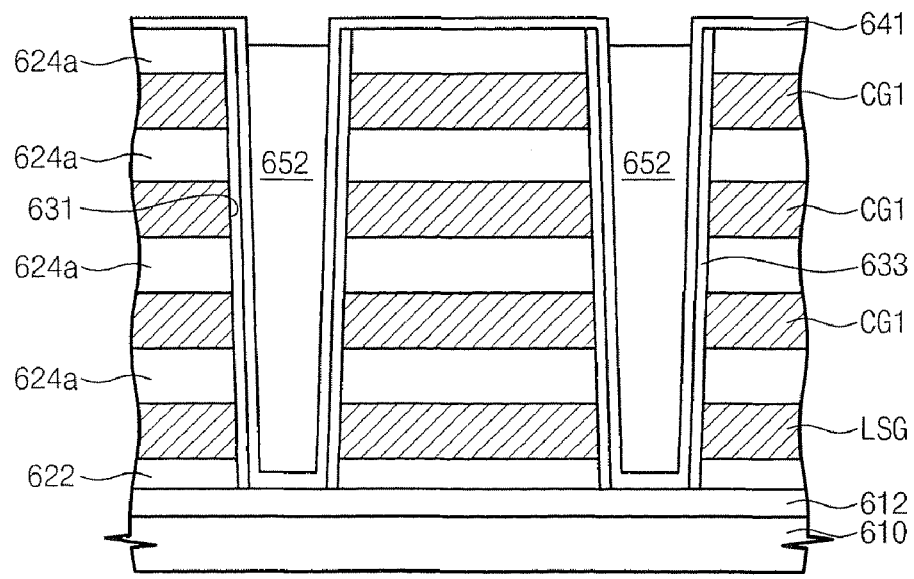

Referring to FIG. 11D, a first filling insulating layer 652 is formed in the first hole 631. An upper portion of the first filling insulating layer 652 may be etched. Thereby a top surface of the first filling insulating layer 652 may be lower than a top surface of the uppermost first insulation pattern 624a. The first filling insulating layer 652 may be removed until the top surface of and the sidewalls of the first sub-active layer 641 are partially exposed.

Figure 11E:
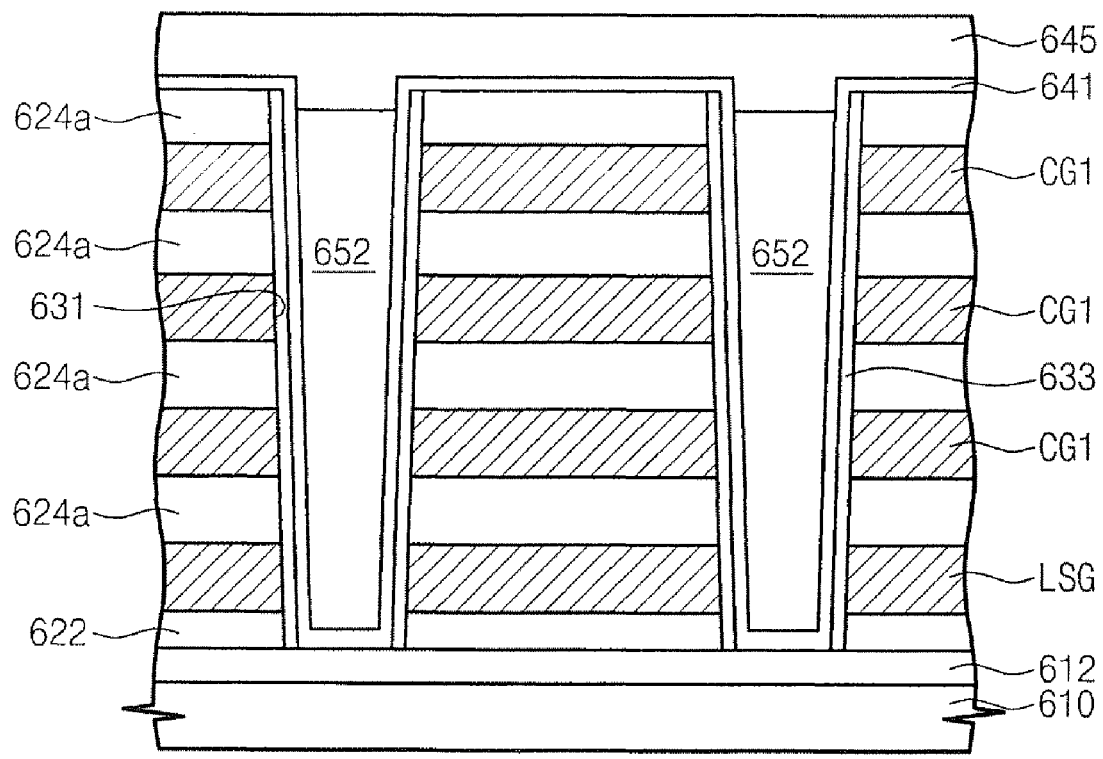

Referring to FIG. 11E, a pad layer 645 may be formed on the first sub-active layer 641 and the first filling insulating layer 652. The pad layer 645 may comprise a semiconductor material. The pad layer 645 may comprise a single crystalline semiconductor material or a polycrystalline semiconductor material. The pad layer 645 may include a material that is the same as the first sub-active layer 641.

Figure 11F:
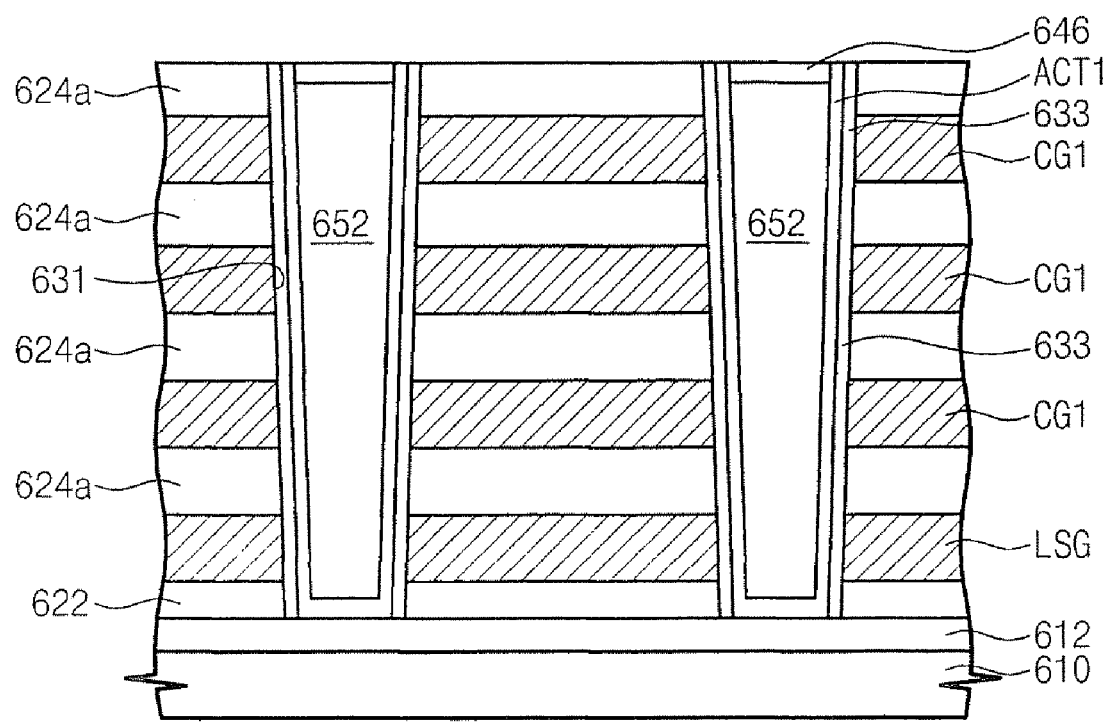

Referring to FIG. 11F, the pad layer 645 may be partially etched to form a first pad portion 646. While the pad layer 645 is removed, the first sub-active layer 641 on the uppermost first insulation pattern 624a and the first gate dielectric portion 633 may also be partially removed. Thereby, a first sub-active bar 633 may be formed. The pad layer 645 and the first sub-active layer 641 may be etched until the top surface of the uppermost first insulation pattern 624a is exposed.

A top surface of the first pad potion 646 may be coplanar with the top surface of the uppermost first insulation pattern 624a. Also, the top surface of the first pad portion 646 may be coplanar with the top surface of the first gate dielectric portion 633. By the first pad portion 646, an electrically contactable region of the first sub-active bar ACT1 may be expanded. That is, an element of the memory device electrically connected with the first sub-active bar ACT1 may be connected with the first sub-active bar ACT1 directly or through the first pad portion 646.

Figure 11G:
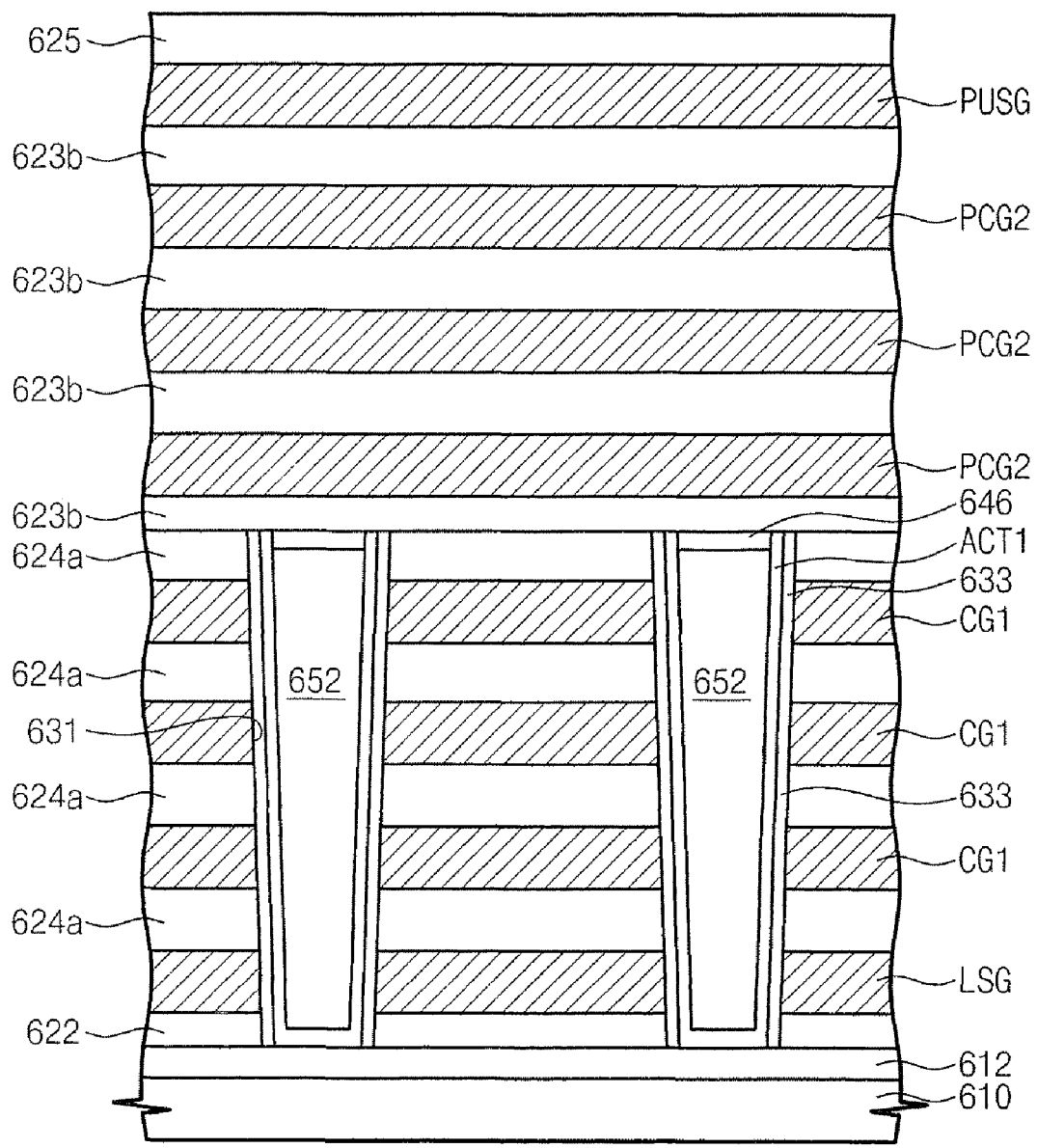

Referring to FIG. 11G, second preliminary insulation patterns 623b, 625 and second preliminary gate patterns PCG2, PUSG may be alternatingly stacked on a resultant structure shown in FIG. 11 F. The lowermost second preliminary insulation pattern 623b may contact the uppermost first insulation pattern 624a.

The uppermost preliminary gate pattern PUSG may be a preliminary upper select gate pattern PUSG. The second preliminary gate patterns PCG2 between the lowermost second preliminary insulation pattern 623b and the preliminary upper select gate pattern PUSG may be second preliminary cell gate patterns PCG2. A preliminary upper insulation pattern 625 may be formed on the preliminary upper select gate pattern PUSG.

Figure 11H:
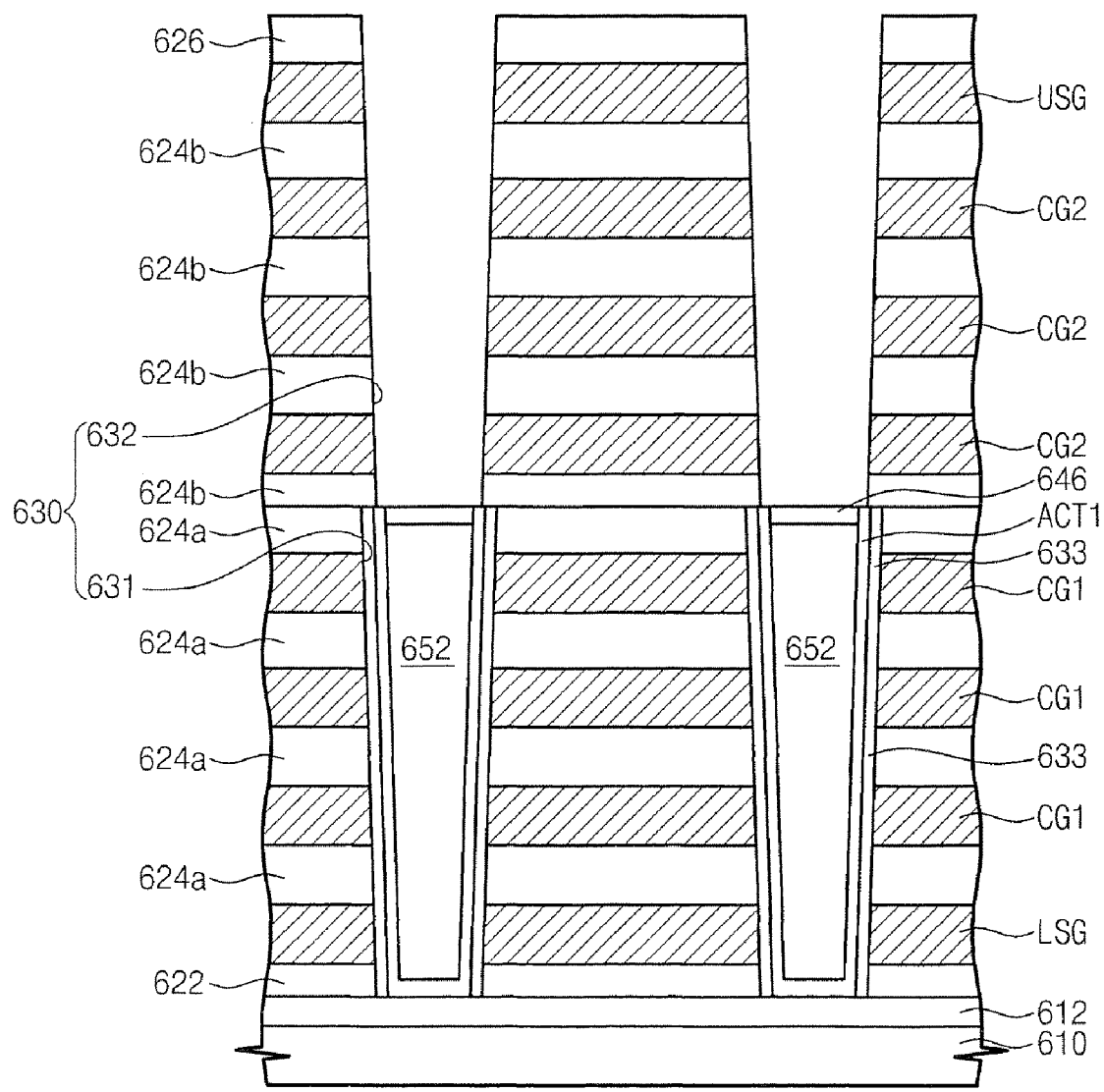

Referring to FIG. 11H, the second preliminary insulation patterns 623b, 625 and the second preliminary gate patterns PCG2, PUSG are etched. The second preliminary insulation patterns 623b, 625 and the second preliminary gate patterns PCG2, PUSG may be etched until the first pad portion 646 is exposed. By the etching, second cell gate patterns CG2, an upper select gate pattern USG and insulation patterns 624b, 626 are formed.

A second hole 632 is defined by sidewalls of the gate patterns CG2, USG and the insulation patterns 624b, 626 and the top surface of the first pad portion 646. The second hole 632 and the first hole 631 may together constitute an opening 630.

A sidewall of the second hole 632 may not be perpendicular to a top surface of the substrate 610. That is, the angle between the sidewall of the second hole 632 and the plane defined by the top surface of the substrate 610 may be an oblique angle. An upper width of the second hole 632 may be different from a lower width of the second hole 632. In one embodiment, the width of the second hole 632 may be increased with increasing distance from the first hole 631. A lowermost width of the second hole 632 may be narrower than an uppermost width of the first hole 631. A top end of the sidewall of the first hole 631 may not be connected with a bottom end of the sidewall of the second hole 632.

At least some of the bottom of the second hole 632 may be defined by the top surface of the first pad portion 646. The second hole 632 may expose a top surface of the first sub-active bar ACT1. In some embodiments, the bottom of the second hole 632 may be defined by the top surface of the first pad portion 646 and the top surface of the first sub-active bar ACT1. In other embodiments, the bottom of the second hole 632 may be wider so as to extend to the top surface of the first gate dielectric portion 633 of the gate dielectric.

Figure 11I:
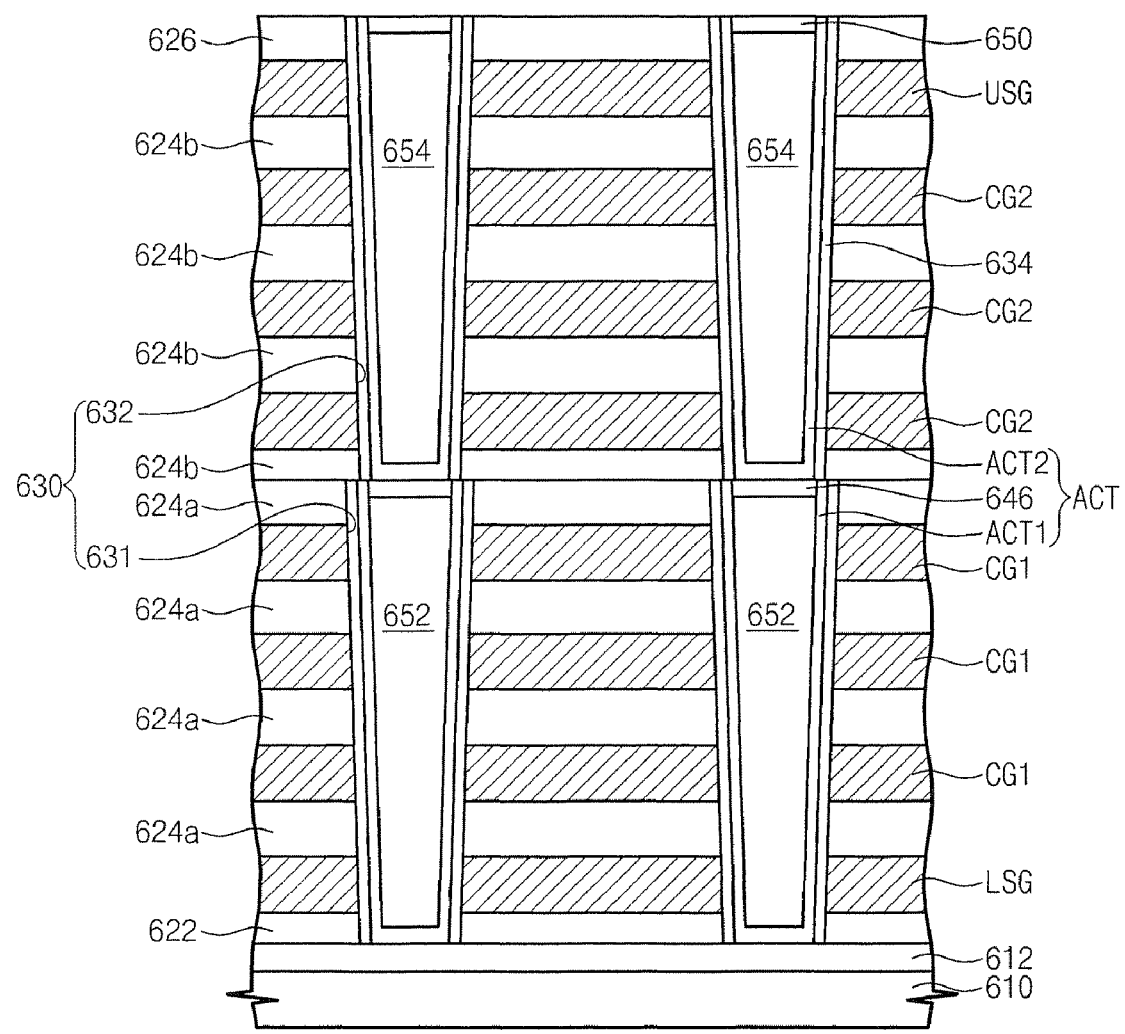

Referring to FIG. 11I, a second gate dielectric portion 634 and a second sub-active bar ACT2 are formed in the second hole 632. In some embodiments, the second gate dielectric portion 634 may not be connected with the first gate dielectric portion 633 of the gate dielectric. Since the sidewalls of the first hole 631 and the second hole 632 may not be connected to each other as aforementioned. In other embodiments, the first and second gate dielectric portions 633 and 634 may be partially connected to each other.

In one embodiment, the second sub-active bar ACT2 may be formed on sidewalls of the second gate dielectric portion 634. A bottom surface of the second sub-active bar ACT2 may contact the top surface of the first pad portion 646. Some of the bottom surface of the second sub-active bar ACT2 may contact the top surface of the first sub-active bar ACT1. The second sub-active bar ACT2 may partly or completely connect to the first sub-active bar ACT1 through the first pad portion 646. The first sub-active bar ACT1, the first pad portion 646 and the second sub-active bar ACT2 may together constitute the active bar ACT.

The second sub-active bar ACT2 may be stably connected with the first sub-active bar ACT1 by the first pad portion 646.

For example, if the first pad portion 646 is not disposed on the first sub-active bar ACT1, a process margin for forming the second hole 632 and the second sub-active bar ACT2 may not be sufficient due to the narrow width and small area of the first sub-active bar ACT1. However, according to embodiments of the inventive concept, more process margin for forming the second hole 632 and the second sub-active bar may ACT2 may be secured by inclusion of the first pad portion 646. Specifically, although the second hole 632 is not precisely aligned with the first hole 631, the second sub-active bar ACT2 may be connected to the first sub-active bar ACT1 by the first pad portion 646. Accordingly, a plurality of holes and memory elements accompanied with the plurality of holes can be easily formed on a single substrate. In other words, a nonvolatile memory device optimized for high integration can be formed.

The second sub-active bar ACT2 may have an inner opening. For example, the second sub-active bar ACT2 may have a shell shape. In one embodiment, the second sub-active bar ACT2 may have a truncated cone shape or frustum of pyramid shape with an open interior. Accordingly, an upper width of the second sub-active bar ACT2 may be greater than a lower width thereof. Alternatively, the second sub-active bar ACT2 may have a truncated cone shape or frustum of pyramid shape which does not have an open interior (i.e., the second sub-active bar ACT2 may be solid).

In the case where the second sub-active bar ACT2 has an open interior, this void in the second sub-active bar ACT2 may be partially or completely filled with a second filling insulating layer 654. A top surface of the second filling insulating layer 654 may be lower (i.e., closer to the substrate 610) than the top surface of the second sub-active bar ACT2. That is, the second filling insulating layer 654 may not fill an uppermost portion of the open interior in the second sub-active bar 648.

The second pad portion 650 may fill the uppermost portion of the inner space of the second sub-active bar ACT2. A top surface of the second pad portion 650 may be coplanar with the top surface of the second sub-active bar ACT2. The second pad portion 650 may also be coplanar with the top surface of the second gate dielectric portion of the gate dielectric.

The second pad portion 650 may comprise a semiconductor material. For example, the second pad portion 650 may comprise a single crystalline semiconductor material or a polycrystalline semiconductor material. The second pad portion 650 may comprise a material that is the same as the second sub-active layer ACT2. The second pad portion 650 may provide a wider area for electrically connecting other elements of the memory device to the second sub-active bar ACT2.

In embodiments where the second pad portion 650 is not provided, an element should contact at least some of the second sub-active bar ACT2 so as to be electrically connected with the second sub-active bar ACT2. However, in the case where the second pad portion 650 is provided, the element may be electrically connected to the second sub-active bar ACT2 by directly contacting the second sub-active bar ACT2 and/or through the second pad portion 650.

Again referring to FIGS. 9, 10A and 10B, the upper select gate pattern USG may be further patterned. Unlike the foregoing example, the upper select gate pattern USG may be formed by depositing an additional conductive layer on the uppermost insulation pattern 624b and patterning the deposited conductive layer. The patterned upper select gate pattern USG may comprise a plurality of lines extending in a first direction. The first direction may correspond to an X-axis direction. By the foregoing patterning, the plurality of upper select gate patterns USG extending in the first direction in parallel with each other may be disposed in the cell region of the substrate 610. An insulation pattern may be formed on sidewalls of the patterned upper select gate patterns USG. The insulation pattern formed on the sidewalls of the upper select gate patterns USG, and an insulation pattern on a top surface of the upper select gate patterns USG may constitute an upper insulation pattern 626.

An interlayer insulation layer 662 is formed on the second sub-active bar ACT2. The interlayer insulation layer 662 is etched to form a contact hole 663 exposing the second sub-active bar ACT2 and/or the top surface of the second pad portion 650. An ohmic layer 665 may be formed on the second sub-active bar ACT2 and/or the top surface of the second pad portion 650. The ohmic layer 665 may be formed, for example, by reacting the exposed second sub-active bar ACT2 and/or the exposed top surface of the second pad portion 650 with a metal. A bit line contact 667 is formed by depositing a conductive material in the contact hole 663. A bit line 668 may be formed on the bit line contact 667. The bit line 668 may extend in a second direction crossing the upper select gate pattern USG. The second direction may correspond to the Y-axis direction.

Third Device Embodiment

Figure 12:
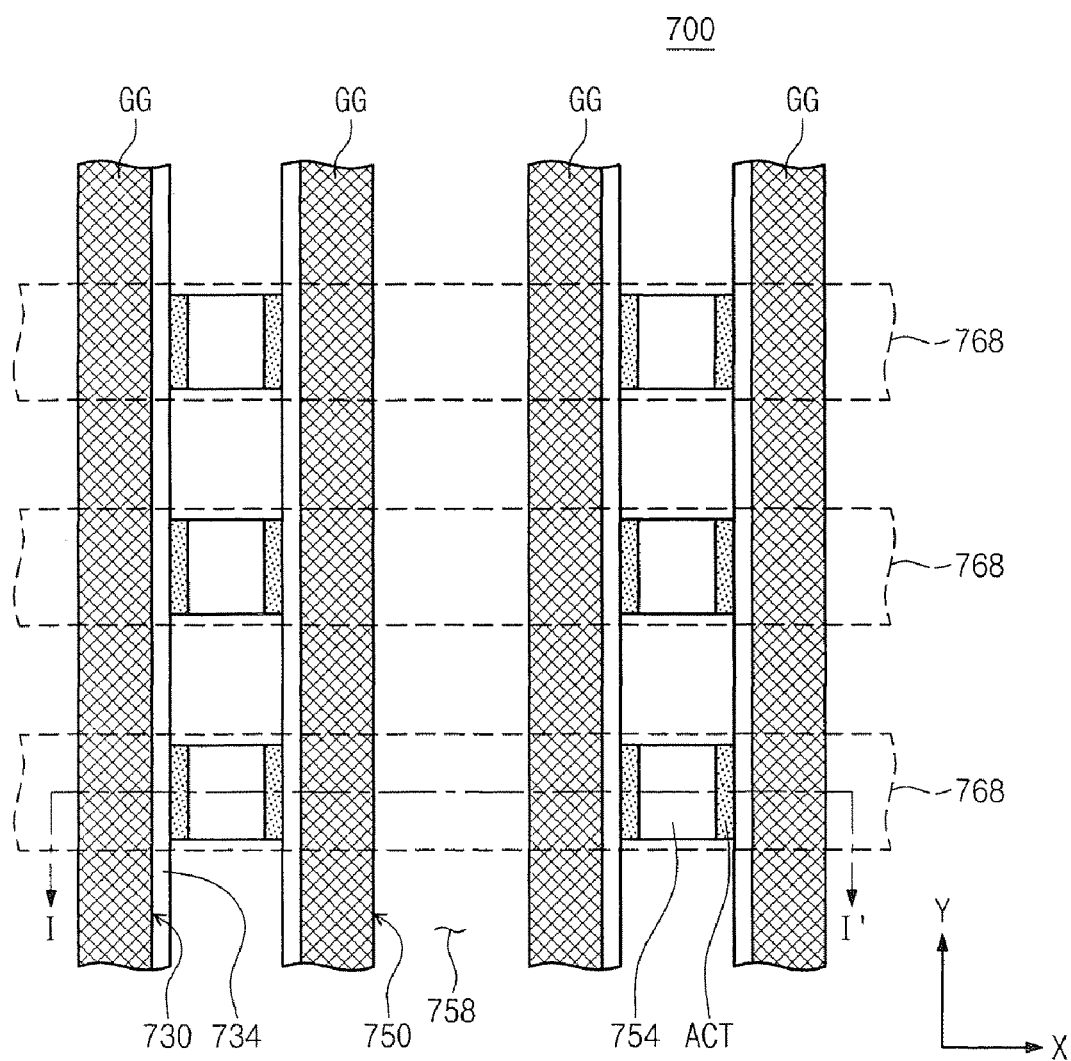
FIG. 12 is a plan view of a nonvolatile memory device according to another embodiment of the inventive concept.

A nonvolatile memory device according to still further embodiments of the inventive concept will now be described with reference to FIGS. 12 and 13. FIG. 12 is a plan view of a nonvolatile memory device according to these embodiments of the inventive concept, and FIG. 13 is a cross-sectional view taken along line I-I' of FIG. 12.

A semiconductor substrate 710 including a well region is prepared. The well region may be a region of the substrate 710 doped with a first conductivity type dopant. A common source region 712 may be disposed in the well region. The common source region 712 may be a region doped with a second conductivity type dopant.

Figure 13:
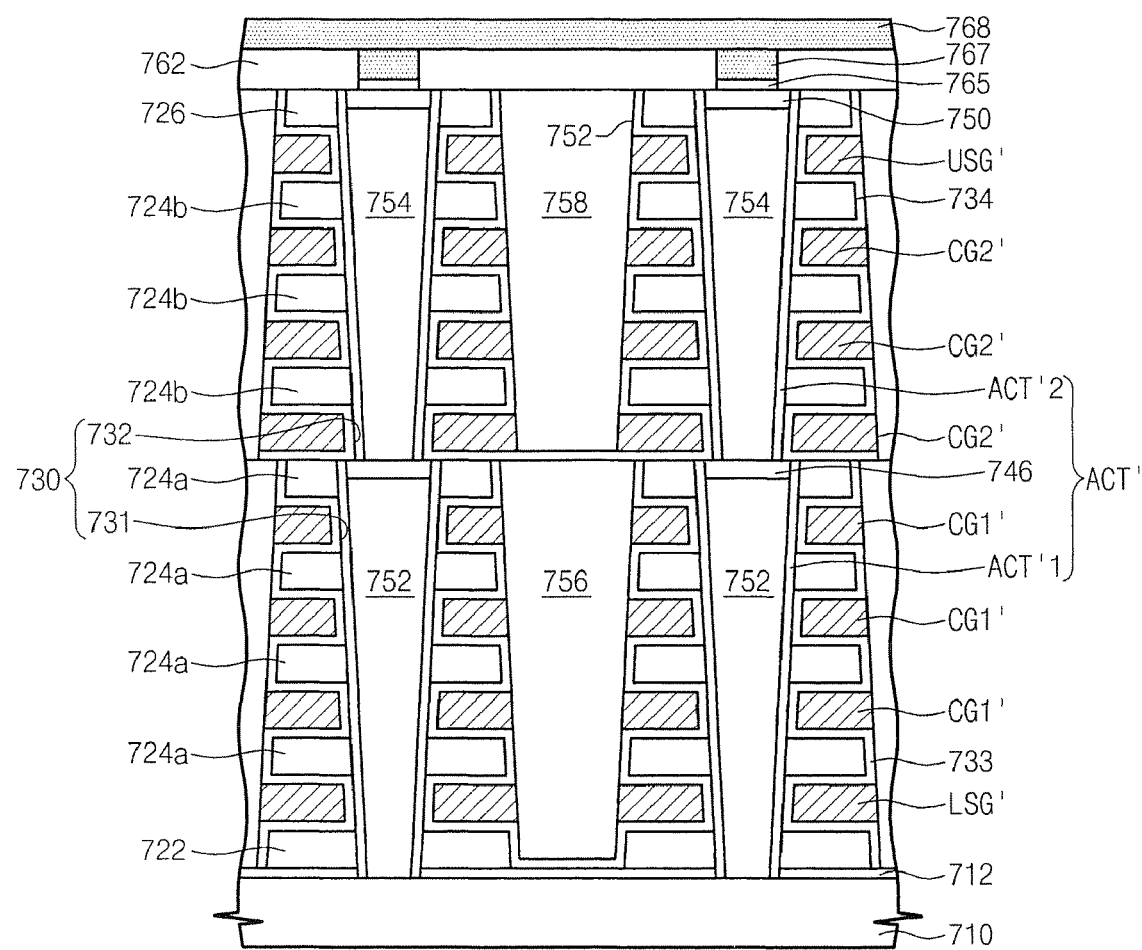
FIG. 13 is a cross-sectional view taken along line I-I' of FIG. 12.

As shown in FIG. 13, a plurality of gate patterns LSG', CG1', CG2', USG' and insulation patterns 722, 724*a*, 724*b*, 726 may be alternatingly stacked on the substrate 710. The lowermost gate pattern LSG' may be a lower select gate pattern LSG', and the uppermost gate pattern USG' may be an upper select gate pattern USG'. The gate patterns CG1', CG2' between the lower select gate pattern LSG' and the upper select gate pattern USG' may be first cell gate patterns CG1' and second cell gate patterns CG2'. Each of the gate patterns LSG', CG1', CG2', USG' may have a line shape extending in a first direction. The gate patterns LSG', CG1', CG2', USG' vertically stacked on the substrate 710 may constitute a single gate pattern group GG.

The lowermost insulation pattern, i.e., the insulation pattern 722 between the substrate 710 and the lower select gate pattern LSG', may be a base insulation pattern 722. The insulation patterns 724*a* between the lower select gate pattern LSG' and the lowermost cell gate pattern CG1' and between the first cell gate patterns CG1' may be first insulation patterns 724*a*. The insulation patterns 724*b* between the uppermost cell gate pattern CG2' and the upper select gate pattern USG' may be second insulation patterns 724*b*. Between the uppermost first cell gate pattern CG1' and the lowermost second cell gate pattern CG2', the first insulation pattern 724*a* and the second insulation pattern 724*b* may be disposed together. The insulation pattern 726 above the upper select gate pattern USG' may be an upper insulation pattern 726.

As shown in FIG. 12, the plurality of gate pattern groups GG extending in one direction may be disposed in the cell region of the substrate 710. The gate pattern groups GG may extend in a first direction in parallel with each other. The first direction may correspond to a Y-axis direction.

An opening 730 extending in the first direction may be defined between gate pattern groups GG in one pair. The opening 730 may have a bottom defined by the substrate 710, and sidewalls defined by the sidewalls of the gate patterns LSG', CG1', CG2', USG' and the insulation patterns 722, 724*a*, 724*b*, 726. The opening 730 may be a space where a first groove 731 defined by the sidewalls of the lower select gate pattern LSG' and the first cell gate patterns CG1' is connected with a second groove 732 defined by the sidewalls of the second cell gate patterns CG2' and the upper select gate pattern USG' in a vertical direction.

The first groove 731 and the second groove 732 may have inclined sidewalls. That is, the sidewalls of the gate patterns LSG', CG1', CG2', USG' and the insulation patterns 722, 724*a*, 724*b*, 726 defining the sidewalls of the first and second grooves 731 and 732 may not be completely normal to the top surface of the substrate 710. For example, the sidewalls and the bottom surfaces of the gate patterns LSG', CG1', CG2', USG' may form an oblique angle.

An active bar ACT' may extend upward along some of the sidewall of the opening 730. As shown in FIG. 12, at least two active bars ACT' may be disposed apart from each other in a horizontal direction in one opening 731. As shown in FIG. 13, the active bar ACT' may include a first sub-active bar ACT'1 disposed on the sidewall of the first groove 731, a second sub-active bar ACT'2 disposed on the sidewall of the second groove 732, and a first pad portion 746 connecting the first sub-active bar ACT'1 and the second sub-active bar ACT'2. Each of the first and second sub-active bars ACT'1, ACT'2 and the first pad portion 746 may comprise a semiconductor material. In one embodiment, the first and second sub-active bars ACT'1, ACT'2 and the first pad portion 746 may comprise the same semiconductor material.

The first sub-active bar ACT'1 may have an inclined sidewall, which may be due to the inclined sidewall of the first groove 731. The first sub-active bar ACT'1 may have a planar plate shape partially covering the sidewall of the first groove 731. Accordingly, an inner space may be defined between the first sub-active bars ACT'1 disposed on sidewalls of facing gate pattern groups in one pair. A first filling insulating layer 752 may be deposited in the inner space between the first sub-active bars ACT'1. In one embodiment, the first sub-active bar ACT'1 may include a bottom portion that contacts the top surface of the substrate 710. In this case, the bottom portion may be disposed between the substrate 710 and the first filling insulating layer 752. In other embodiments, the first sub-active bar ACT'1 may not include the bottom portion. In one embodiment, the first sub-active bar ACT'1 may penetrate the common source region 712. In this case, a lower portion of a sidewall of the first sub-active bar ACT'1 may contact the common source region 712, as shown in FIG. 13.

The first pad portion 746 may have sidewalls that contact the upper sidewalls of the first sub-active bar ACT'1. In one embodiment, the first pad portion 746 may have a top surface which is disposed between the first sub-active bars ACT'1 in the one pair facing each other and is coplanar with top surface of the first sub-active bars ACT'1 in the one pair. An area of the top surface of the first pad portion 746 may be wider than an area of a top surface of the first sub-active bar ACT'1. Thus, the area which can contact electrically with the first sub-active bars ACT'1 may be expanded.

The second sub-active bar ACT'2 may have an inclined sidewall, which may be due to the inclined sidewall of the second groove 732. A lower sidewall of the second sub-active bar ACT'2 may be disposed laterally offset from the upper sidewall of the first sub-active bar ACT'1 toward a center portion of the first pad portion 746.

In one embodiment, the sidewall of the second sub-active bar ACT'2 may be formed in a planar plate shape on some of the sidewall of the second groove 732. In this case, the second sub-active bars ACT'2 on both sidewalls of the second groove 732 may define an inner opening. This inner opening may be partially or completely filled with a second filling insulating layer 754. In other embodiments, the second sub-active bar ACT'2 may be formed by filling the inner space with a semiconductor material.

The second sub-active bar ACT'2 may be electrically connected to the first sub-active bar ACT'1. In particular, a bottom surface of the second sub-active bar ACT'2 may contact the top surface of the first pad portion 746 and/or the top surface of the first sub-active bar ACT'1.

The second sub-active bar ACT'2 may be electrically connected to the first sub-active bar ACT'1 by the first pad portion 746. Specifically, in order to electrically connect the first sub-active bar ACT'1 and the second sub-active bar ACT'2 without the first pad portion 746, the top surface of the first sub-active bar should contact the bottom surface of the second sub-active bar. As aforementioned, since the first sub-active bar ACT'1 is formed with an open interior and the narrow top surface, it may be difficult to contact the first sub-active bar ACT'1 and the second sub-active bar ACT'2. However, in the case where the first pad portion 746 is disposed in the active bar ACT according to embodiments of the inventive concept, the bottom surface of the second sub-active bar ACT'2 may be electrically connected to the first sub-active bar ACT'1 by contacting the top surface of the first pad portion 746. Accordingly, the first sub-active bar ACT'1 need not necessarily be precisely self-aligned with the second sub-active bar ACT'2. By the foregoing construction, more many sub-active bars and memory elements accompanied with the sub-active bars can be stacked on a semiconductor substrate. Accordingly, a nonvolatile memory device optimized for high integration can be provided.

In embodiments where the second sub-active bar ACT'2 includes an interior opening, a second pad portion 750 may be disposed at an upper portion of the second sub-active bar ACT'2. The second pad portion 750 may have a top surface which is coplanar with a top surface of the second sub-active bar ACT'2. Sidewalls of the first pad portion 750 may contact uppermost inner walls of the second sub-active bars ACT'2.

A gate dielectric 733, 734 may be disposed between the active bar ACT' and the gate patterns LSG', CG1', CG2', USG'. The gate dielectric 733, 734 may extend onto top surfaces and bottom surfaces of the gate patterns LSG', CG1', CG2', USG'. Also, the gate dielectrics 733, 734 may extend onto sidewalls of the insulation patterns 722, 724a, 726 which do not contact the active bar ACT'. In other embodiments, the gate dielectrics 733, 734 may be disposed only on the top and bottom surfaces and one sidewall of the gate patterns LSG', CG1', CG2', USG'.

The gate dielectrics 733, 734 may include a first gate dielectric portion 733 between the first cell gate patterns CG1' and the first sub-active bar ACT'1 and between the lower select gate pattern LSG' and the first sub-active bar ACT'1, and a second gate dielectric portion 734 between the second cell gate patterns CG2' and the second sub-active bar ACT'2 and between the upper select gate pattern USG' and the second sub-active bar ACT'2. The first gate dielectric portion 733 and the second gate dielectric portion 734 may be at least two layers separated from each other. A top surface of the first gate dielectric portion 733 may contact the second gate dielectric portion 734 positioned below the lowermost second cell gate pattern CG2'.

A bit line 768 may be disposed above the second sub-active bar ACT'2. The bit line 768 may extend in a second direction crossing a first direction in which the gate pattern groups GG extend. The second direction may correspond to an X-axis direction.

A bit line contact 767 may be disposed between the bit line 768 and the second sub-active bar ACT'2. An ohmic layer 765 may be disposed between the bit line contact 767 and the second sub-active bar ACT'2. The ohmic layer 765 can lower resistance between the second sub-active bar ACT'2 and the bit line contact 767.

In embodiments where the second sub-active bar ACT'2 includes an interior opening, the bit line contact 767 may be electrically connected to the second sub-active bar ACT'2 by the first pad portion 750. Additionally, the second sub-active bar ACT'2 may have a relatively narrow top surface. The pad portion 750 can make it easy to electrically connect the second sub-active bar ACT'2 and the bit line 768.

While the foregoing embodiment shows and describes a nonvolatile memory device that includes two sub-active bars and a pad portion connecting these two sub-active bars, embodiments of the inventive concept may include nonvolatile memories, each including two or more sub-active bars and a first pad portion between the two or more sub-active bars. Specifically, a third sub-active bar, third gate patterns and elements connected with the third sub-active bar and the third gate patterns may be further disposed on the second sub-active bar and the second gate patterns. In this case, the uppermost gate pattern of the second gate patterns may be a cell gate pattern, unlike the foregoing embodiment. In other words, a nonvolatile memory device according to an embodiment of the inventive concept may include two or more sub-active bars and a pad portion connecting these two or more sub-active bars.

Third Method Embodiment

A method of manufacturing nonvolatile memory devices according to embodiments of the inventive concept will now be described with reference to FIGS. 12, 13 and 14A to 14K. FIGS. 14A through 14K are cross-sectional views of a nonvolatile memory device taken along line I-I' of FIG. 12.

Figure 14A:
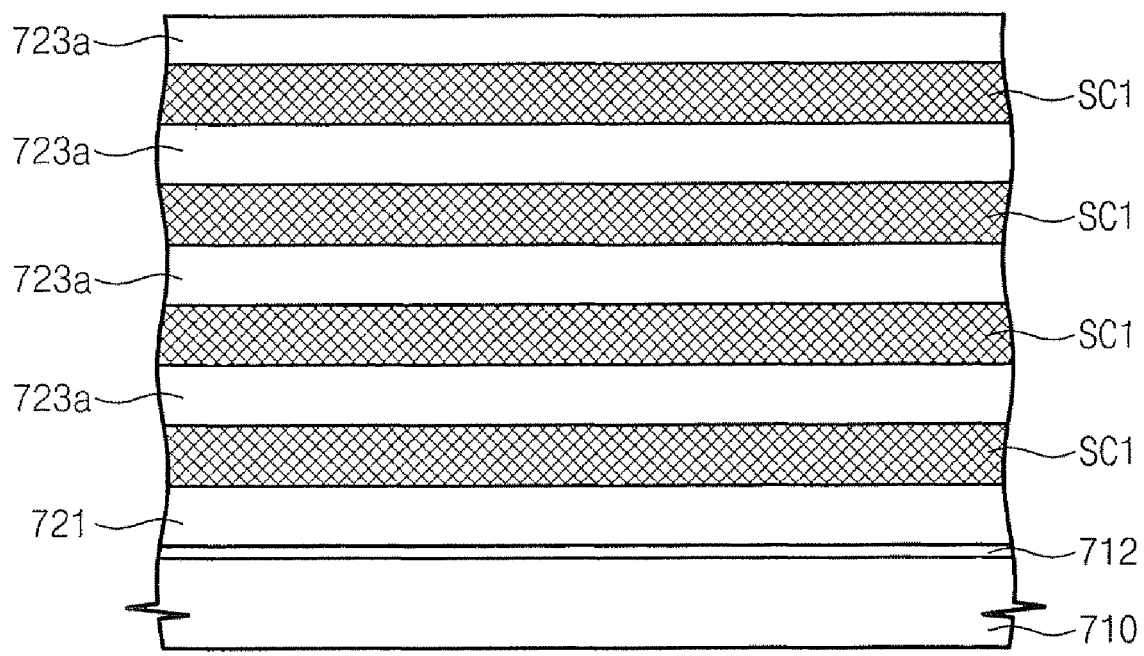
FIGS. 14A through 14K are cross-sectional views illustrating a method for manufacturing a nonvolatile memory device according to another embodiment of the inventive concept.

Referring to FIG. 14A, a substrate 710 is doped with a first conductivity type dopant to form a well region. An upper portion of the well region is doped with a second conductivity type dopant to form a common source region 712. A top surface of the common source region 712 may be the same as a top surface of the substrate 710.

A preliminary base insulation pattern 721 is formed on the substrate 710. First sacrificial layers SC1 and first preliminary insulation patterns 723a are alternatingly and repeatedly stacked on the preliminary base insulation pattern 721. The first sacrificial layers SC1 and the first preliminary insulation patterns 721, 723a may be formed of materials having different etch rates under the same etching conditions. For example, the first sacrificial layers SC1 may be formed of a nitride layer and the first preliminary insulation patterns 721, 723a may be formed of an oxide layer.

Figure 14B:
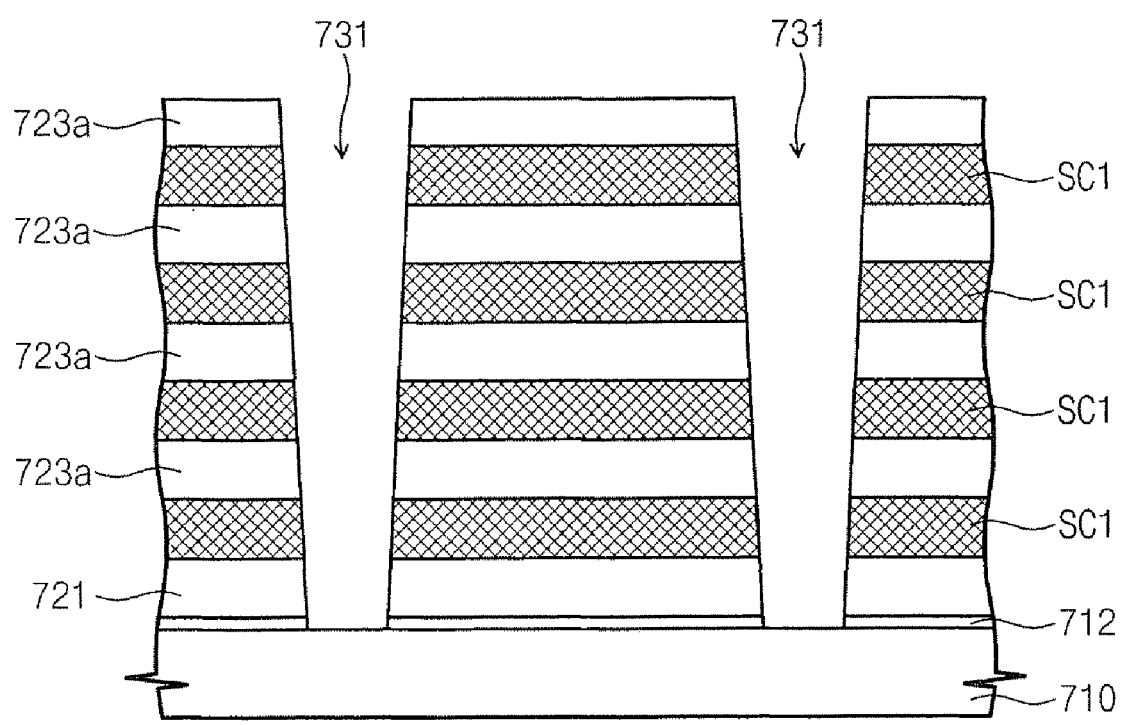

Referring to FIG. 14B, the first sacrificial layers SC1 and the first preliminary insulation patterns 721, 723a are anisotropically etched to form a first groove 731 that penetrates the first sacrificial layers SC1 and the first preliminary insulation patterns 721, 723a. The first groove 731 may extend in a first direction. The first direction may correspond to a Y-axis direction.

The first groove 731 may have inclined sidewalls. That is, sidewalls of the first sacrificial layers SC1 and the first preliminary insulation patterns 721, 723a defining the sidewalls of the first groove 731 may form an oblique angle with the top surface of the substrate 710. The degree to which the sidewalls of the first groove 731 are inclined with respect to a line that is normal to top surface of the substrate 710 may be proportional to thickness of the stacked first sacrificial layers SC1 and first preliminary insulation patterns 731, 723a. During the formation of the first groove 731, some of the common source region 712 may also be etched, so that the well region may be exposed.

Figure 14C:
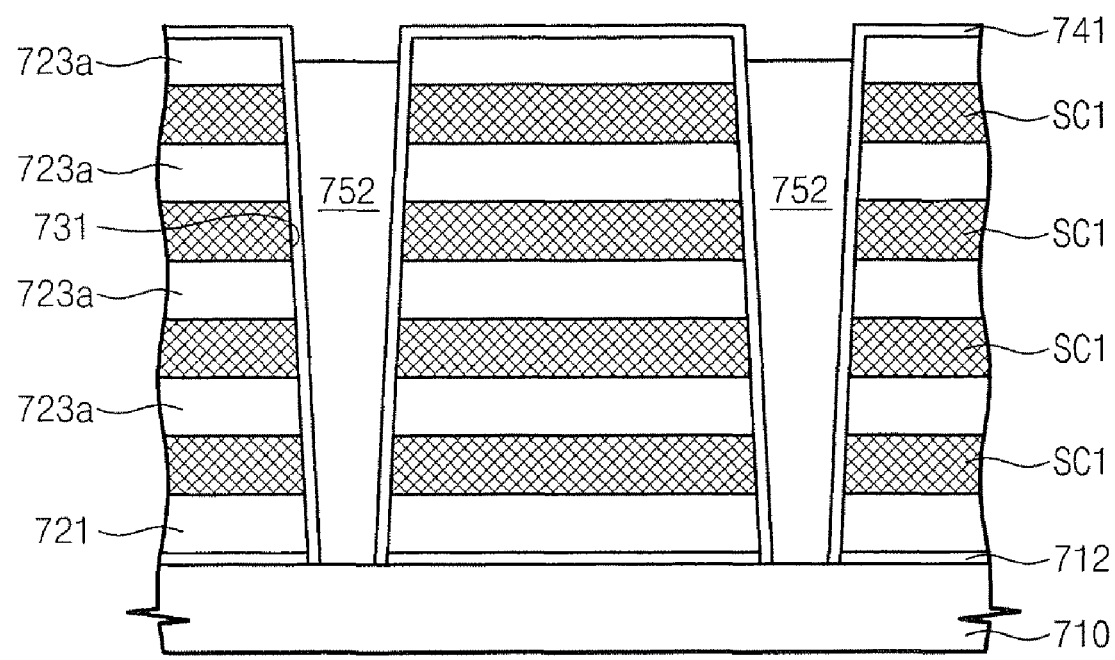

Referring to FIG. 14C, a first sub-active layer 741 may be formed on the sidewalls of the first groove 731. Specifically, a semiconductor layer that conformally covers the first groove 731 may be formed on the sidewalls of the first groove 731. The semiconductor layer may comprise a single crystalline semiconductor material or polycrystalline semiconductor material. A spacer may be formed in the first groove 731 on the semiconductor layer. The spacer may cover sidewalls of the first groove 731 and the semiconductor layer. Also, the spacer may expose some of the semiconductor layer on the substrate 710. By partially etching the exposed semiconductor layer, the first sub-active layer 741 may be formed on the sidewalls of the groove 731. In other embodiments, the removing of the semiconductor layer formed on the substrate 710 may be omitted. The first sub-active layer 741 formed thus may include a bottom portion disposed on the substrate 710.

A filling insulating layer 752 may be deposited in the first groove 731. A top surface of the filling insulating layer 752 may be formed lower than a top surface of the uppermost first preliminary insulation pattern 723a. Accordingly, upper portions of the sidewalls of the first groove 731 may be exposed.

Figure 14D:
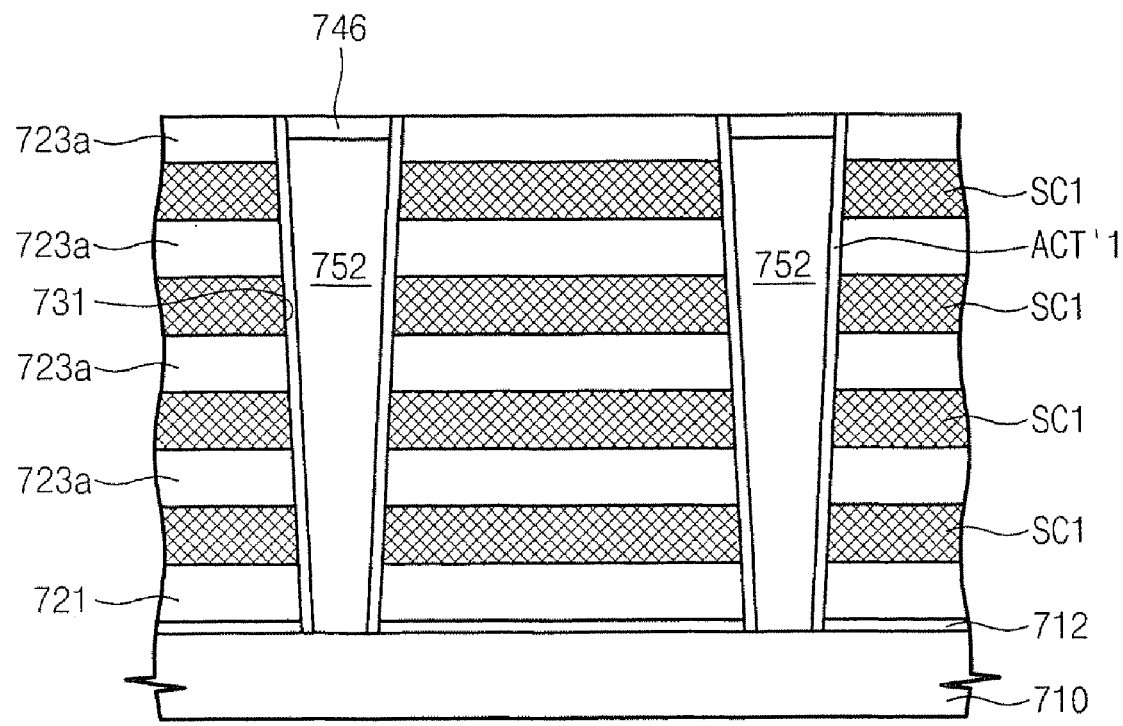

Referring to FIG. 14D, a first pad portion 746 may be formed at an uppermost portion of the first groove 731. The first pad portion 746 may be formed by forming a semiconductor layer in the first groove 731 and then removing some of the semiconductor layer. The semiconductor layer may be removed until the uppermost first preliminary insulation pattern 723a is exposed. At this time, the first sub-active layer 741 on the uppermost first preliminary insulation pattern 723a may be removed together to form the first sub-active bar ACT'1. A top surface of the first pad portion 746 may be coplanar with a top surface of the first sub-active bar ACT'1. The first pad portion 746 may comprise a semiconductor material that is the same as the first sub-active bar ACT'1.

Figure 14E:
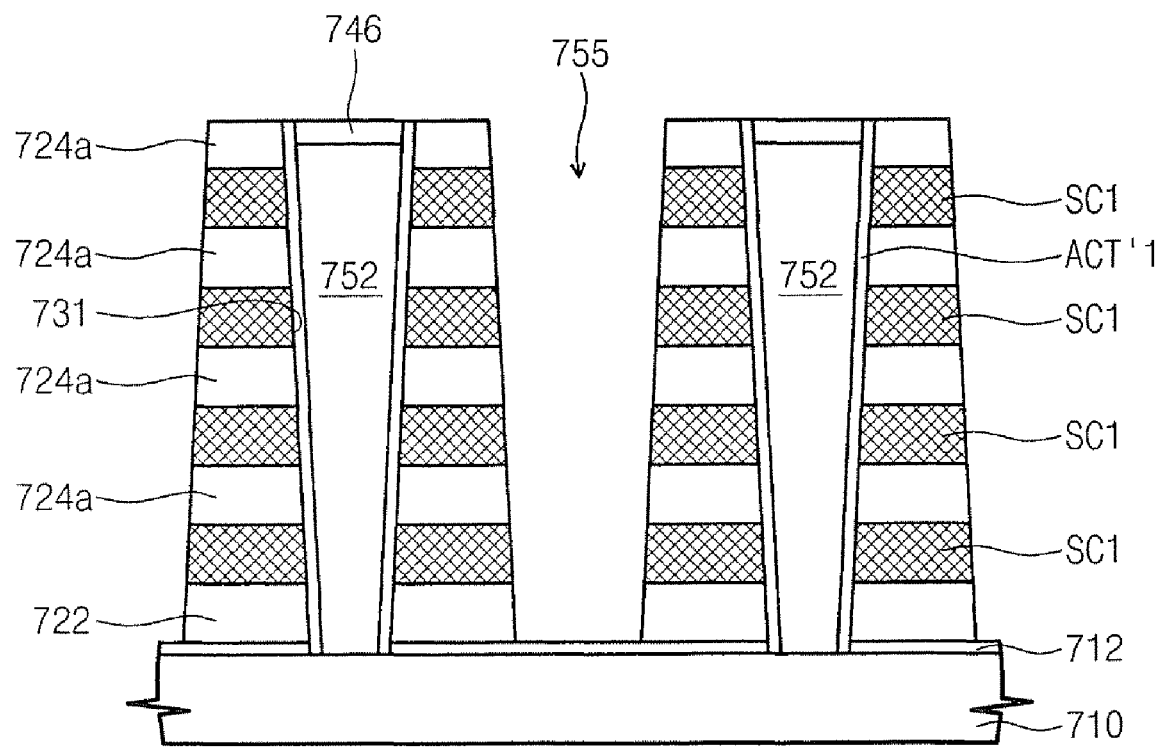

Referring to FIG. 14E, the first sacrificial layers SC1 and the first preliminary insulation patterns 721, 723a are patterned, so that first insulation patterns 724a and a base insulation pattern 722 may be formed. A first trench 755 may be defined by sidewalls of the first insulation patterns 722, 724a and the first sacrificial layers SC1. The first trench 755 may have a groove shape and may extend in a direction parallel to the direction in which the first groove 731 extends. The trench 755 may expose the sidewalls of the first insulation patterns 722, 724a and the first sacrificial layers SC1. The first trench 755 may have inclined sidewalls.

Figure 14F:
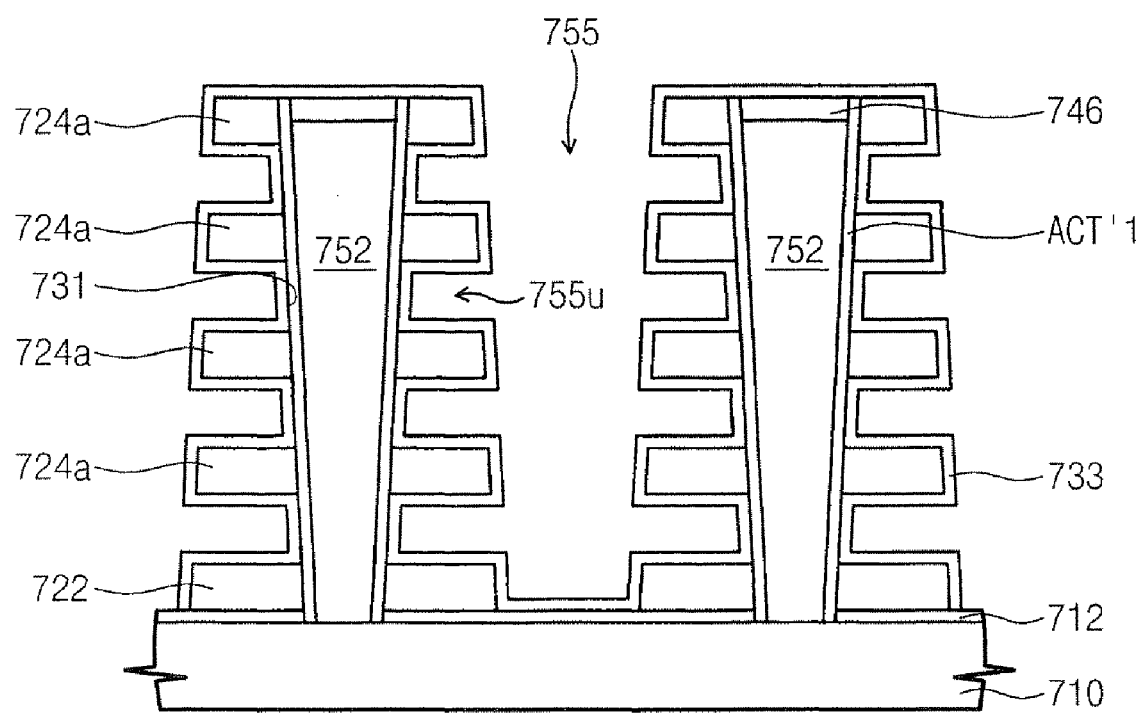

Referring to FIG. 14F, the first sacrificial layers SC1 that are exposed by the first trench 755 are removed. By doing so, a first vacant space 755u may be formed between the first insulation patterns 724a and between the lowermost first insulation pattern 724a and the base insulation pattern 722. The first vacant space 755u may expose some of the sidewalls of the first sub-active bar ACT'1. By forming the first vacant space 755u, top and bottom surfaces of the first insulation patterns 724a and a top surface of the base insulation pattern 722 may be exposed.

Next, as is also shown in FIG. 14F, a first gate dielectric portion 733 may be formed in the first trench 755 and in the first vacant space 755u. The first gate dielectric portion 733 may conformally cover the first trench 755 and the first vacant space 755u. The first gate dielectric portion 733 may include at least two layers. Specifically, the first gate dielectric portion 733 may include a tunnel barrier layer that contacts the first sub-active bar ACT'1, a charge storage layer on the tunnel barrier, and a blocking barrier on the charge storage layer. In one embodiment, the tunnel barrier may be formed by oxidizing the exposed sidewalls of the first sub-active bar ACT'1.

Figure 14G:
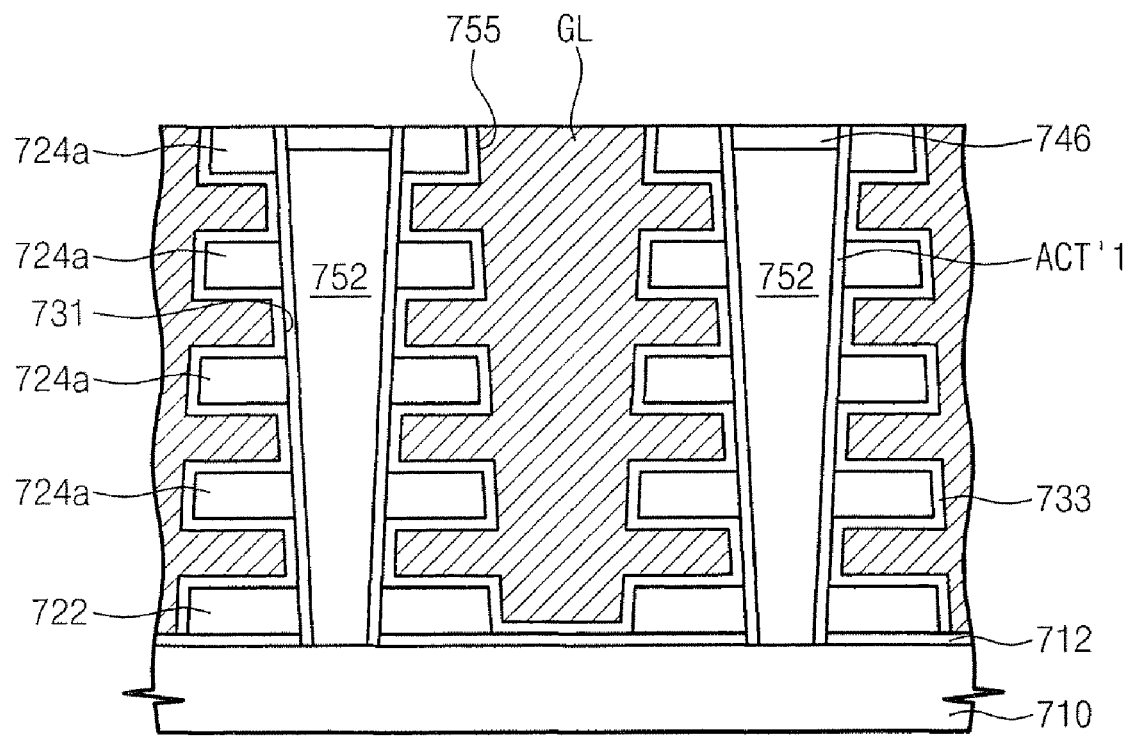

Referring to FIG. 14G, a gate layer GL may be formed in the first trench 755 and the first vacant space 755u. The gate layer GL may comprise, for example, a doped semiconductor material, a metal or a metal compound. A top surface of the gate layer GL may be planarized. During this planarizing operation, the first gate dielectric portion 733 that is on a top surface of the uppermost insulation pattern 724a may be removed to expose the top surface of the first pad portion 746 and the top surface of the uppermost insulation pattern 724a.

Figure 14H:
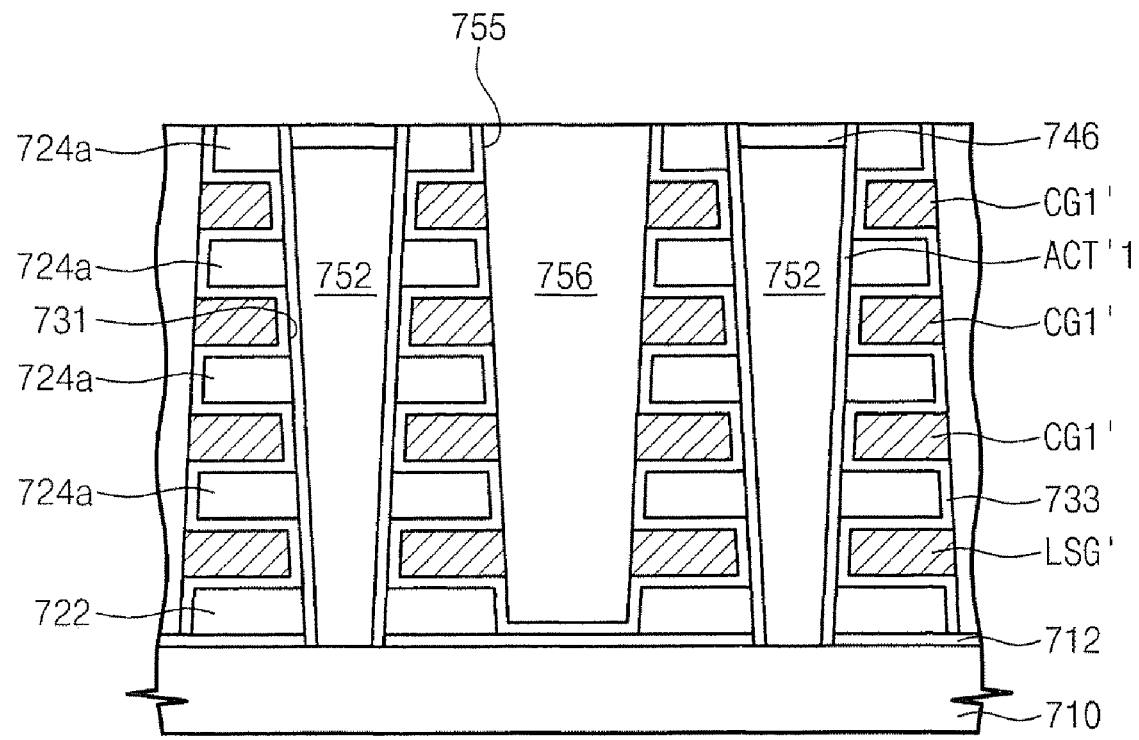

Referring to FIG. 14H, the gate layer GL may be etched to form first gate patterns LSG', CG1'. The first gate patterns LSG', CG1' may be the gate layer GL. The gate pattern LSG' between the base insulation pattern 722 and the lowermost insulation pattern 724a may be a lower select gate pattern LSG'. The gate patterns CG1' formed between the first insulation patterns 724a may be cell gate patterns CG'.

A first groove filling insulating layer 756 may be formed in the first trench 755. The first groove filling insulating layer 756 may be planarized until the top surfaces of the uppermost insulation pattern 724a and the first pad portion 746 are exposed.

Figure 14I:
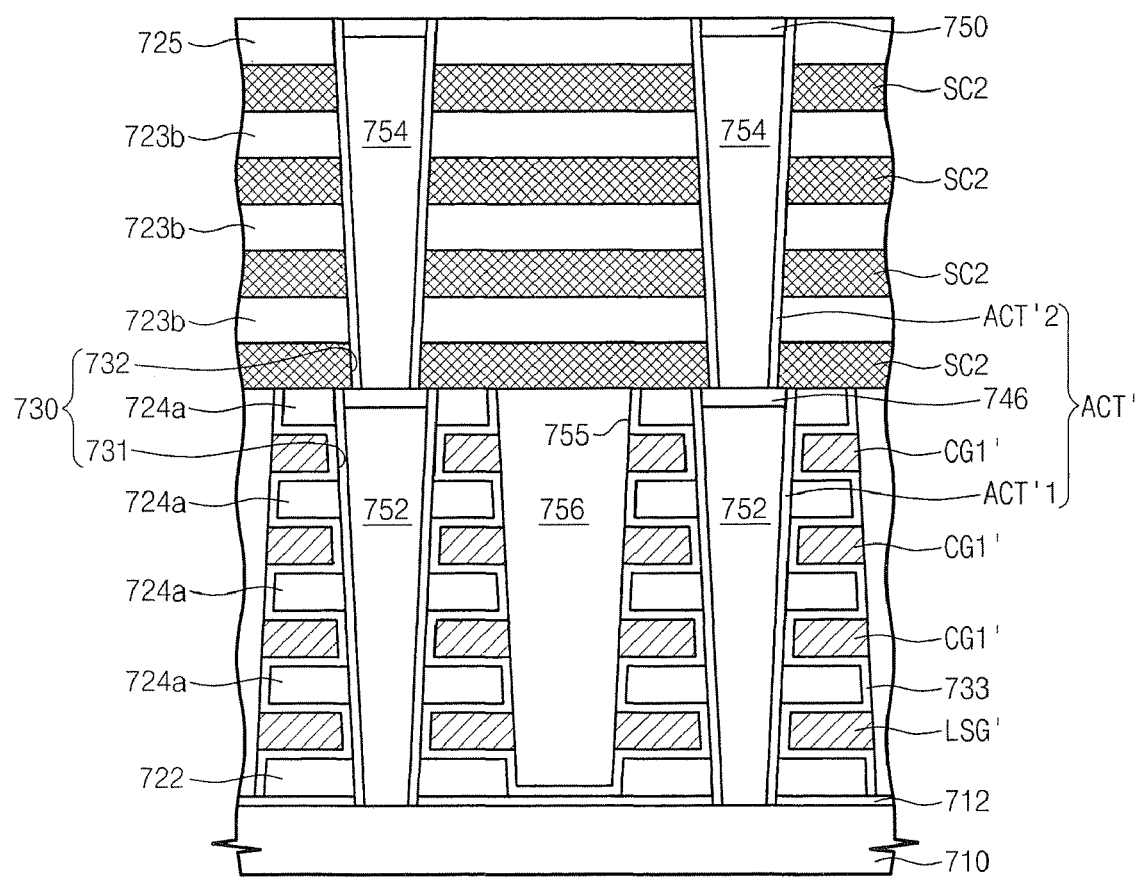

Referring to FIG. 14I, second sacrificial layers SC2 and second preliminary insulation layers 723b, 725 may be alternatingly stacked on the resultant structure shown in FIG. 14H. The second preliminary insulation patterns 723b, 725 may comprise second preliminary insulation patterns 723b between the sacrificial layers SC2 and a preliminary upper insulation pattern 725 on the uppermost second sacrificial layer SC2. The lowermost second sacrificial layer SC2 may contact the top surface of the uppermost first insulation pattern 724a and the top surface of the first pad portion 746. The second sacrificial layers SC2 and the second preliminary insulation patterns 723b may be formed of materials having different etch ratios.

A second groove 732 may then be formed that penetrates the second sacrificial layers SC2 and the second preliminary insulation patterns 723b, 725. The second groove 732 may include sidewalls defined by sidewalls of the second sacrificial layers SC2 and sidewalls of the second preliminary insulation patterns 723b, 725, and a bottom defined by the first pad portion 746. The sidewalls of the second groove 732 may be inclined.

The second groove 732 may be connected with the first groove 731 in a vertical direction. The second groove 732 may extend in a direction parallel to the first groove 731, i.e., a first direction. The first groove 731 and the second groove 732 may together constitute a single opening 730.

A second sub-active bar ACT'2 may be formed in the second groove 732. The second sub-active bar ACT'2 may be formed by the same method as the method for forming the first sub-active bar ACT'1. In some embodiments, a second filling insulating layer 754 may be formed in an inner opening defined by the second sub-active bar ACT'2. A top surface of the second filling insulating layer 754 may be lower than a top surface of the preliminary upper insulation pattern 725. In other embodiments, the second sub-active bar ACT'2 may be formed by filling the second groove 732 with a semiconductor material. In this case, the second groove filling insulating layer 754 may not be formed in the second groove 732.

A second pad portion 750 may be formed on the second sub-active bar ACT'2. The second pad portion 750 may be formed between upper portions of the sidewalls of the second sub-active bar ACT'2. In the case where the second sub-active bar ACT'2 defines an inner opening, the second pad portion 750 may fill the inner opening defined by the second sub-active bar ACT'2. A top surface of the second pad portion 750 may be coplanar with the top surface of the second sub-active bar ACT'2 and the top surface of the preliminary upper insulation pattern 725. In other embodiments, the second pad portion 750 may cover the top surface of the second sub-active bar ACT'2.

Figure 14J:
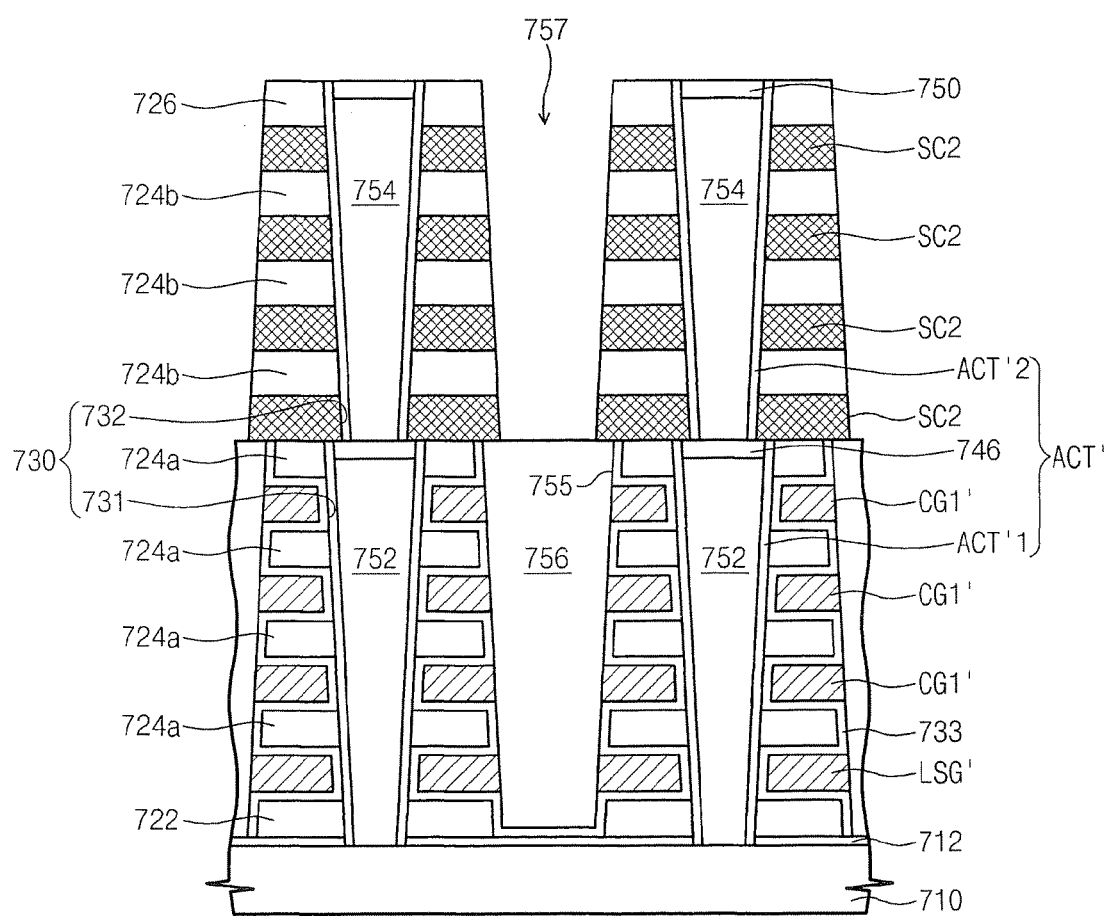

Referring to FIG. 14J, the second sacrificial layers SC2 and the second preliminary insulation patterns 723b, 725 may be patterned to form second insulation patterns 724b, 726. The second insulation patterns 724b, 726 may include the second insulation patterns 724b between the patterned sacrificial layers SC2, and the upper insulation pattern 726 on the uppermost sacrificial layer SC2.

By the foregoing patterning, a second trench 757 may also be formed. The second trench 757 may expose sidewalls of the second insulation patterns 724b, 726 and sidewalls of the patterned second sacrificial layers SC2.

Figure 14K:
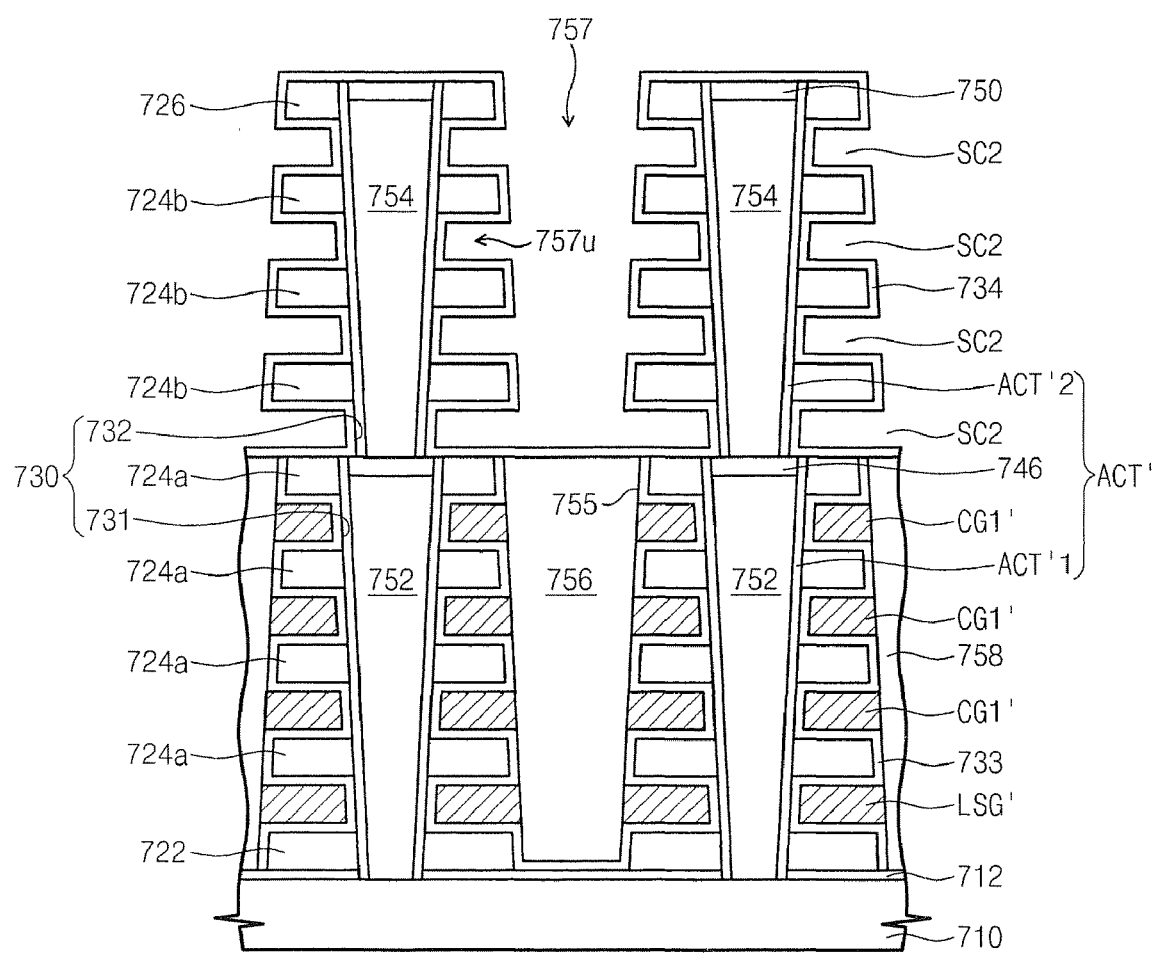

Referring to FIG. 14K, the exposed second sacrificial layers SC2 are removed so that a second vacant space 757u may be formed between the second insulation patterns 724b, 726. The second vacant space 757u may expose the sidewalls of the second sub-active bar ACT'2 and top and bottom surfaces of the second insulation patterns 724b, 726. The lowermost second vacant space 757u may expose the top surface of the uppermost first insulation pattern 724a.

A second gate dielectric portion 734 of a gate dielectric may be formed to conformally cover the second trench 757 and the second vacant space 757u. The second gate dielectric portion 734 may be formed by the same method as the method for forming the first gate dielectric portion 733. The second gate dielectric portion 734 may contact a top surface of the first gate dielectric portion 733.

Again referring to FIG. 13, second gate patterns CG2', USG' may be formed in the second vacant space 757u. The second gate patterns CG2', USG' may be formed by forming a gate layer in the second trench 757 and the second vacant space 757u and then removing the gate layer from the second trench 757. A top surface of the gate layer may be planarized before the gate layer in the second trench 757 is removed. The planarization may also remove portions of the gate dielectric 734 on the upper insulation pattern 726 and the second pad portion 750. After the gate layer is removed, an insulating layer may be formed in the second trench 757.

The gate layer remaining in the second vacant space 757u may constitute the second gate patterns CG2', USG'. The uppermost second gate pattern USG' may be the upper select gate pattern USG', and the second gate patterns CG2' between the second insulation patterns 724b and between the uppermost first insulation pattern 724a and the lowermost second insulation pattern 724b may be the second cell gate patterns CG2'.

An interlayer insulation layer 762 may be formed on the second pad portion 750 and the upper insulation pattern 726. The interlayer insulation layer 762 may include a contact hole exposing a top surface of the second pad portion 750. An ohmic layer 765 may be formed on the second pad portion 750. The ohmic layer 765 may be formed by metalizing the exposed top surface of the second pad portion 750. A bit line contact 767 may be formed by depositing a conductive material in the contact hole. A bit line 768 may be formed on the bit line contact 767. The bit line 768 may have a line shape and may extend in a second direction. The bit line contact 767 and the bit line 768 may be formed at the same time.

Application Example

Figure 15A:
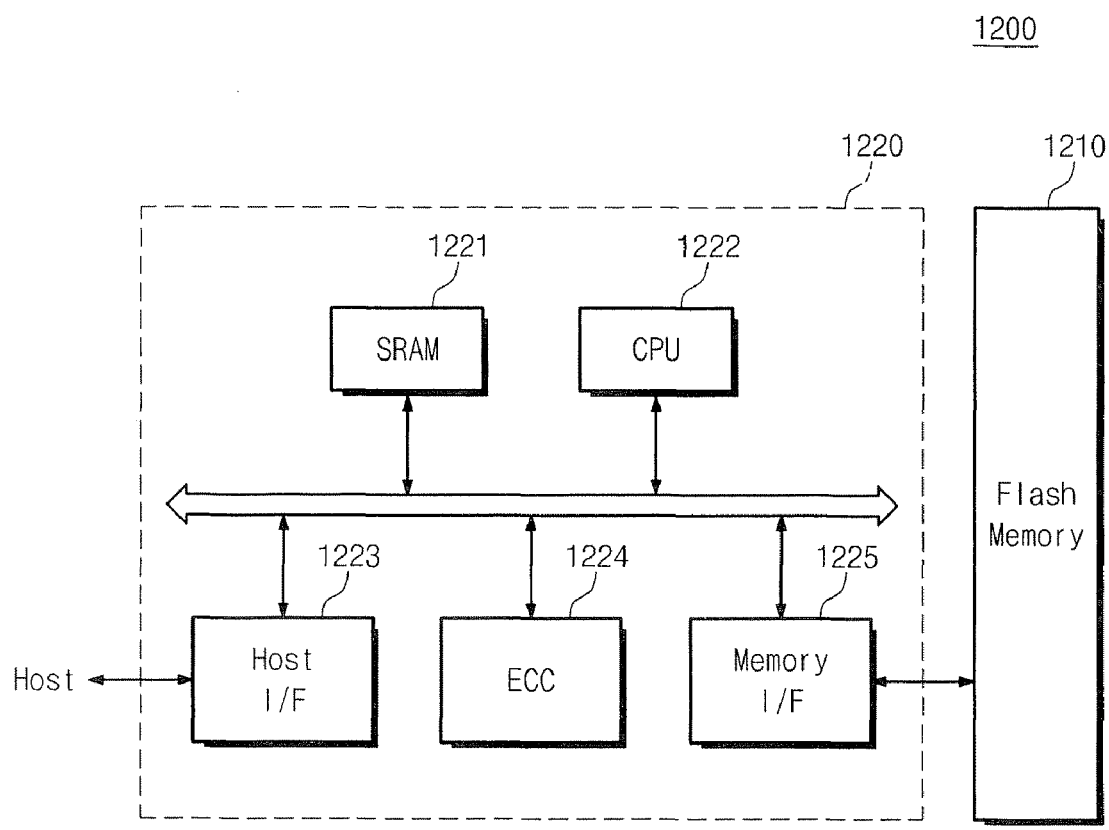
FIGS. 15A and 15B are block diagrams illustrating devices that apply a nonvolatile memory device according to embodiments of the inventive concept.

FIG. 15A is a block diagram of a memory card provided with a nonvolatile memory device according to an embodiment of the inventive concept.

Referring to FIG. 15A, the memory card 1200 is for supporting high-capacity data storage capability and includes a flash memory 1210. The flash memory 1210 may comprise a nonvolatile memory device according to any of the foregoing embodiments of the inventive concept. In some embodiments, the nonvolatile memory device may be a NAND flash memory device.

The memory card 1200 may include a memory controller 1220 that controls data exchange between a host and the flash memory 1210. An SRAM 1221 may be used as a working memory of a central processing unit (CPU) 1222. A host interface 1223 may have data exchange protocol of a host connected to the memory card 1200. An error correction circuit (ECC) 1224 may detect and correct an error included in data read from the flash memory 1210. A memory interface 1225 interfaces with the flash memory 1210. The CPU 1222 performs an overall control operation for data exchange of the memory controller 1220. Although not shown in the drawings, the memory card 1200 may further include a read only memory or "ROM" (not shown) that stores code data for interfacing with the host.

Figure 15B:
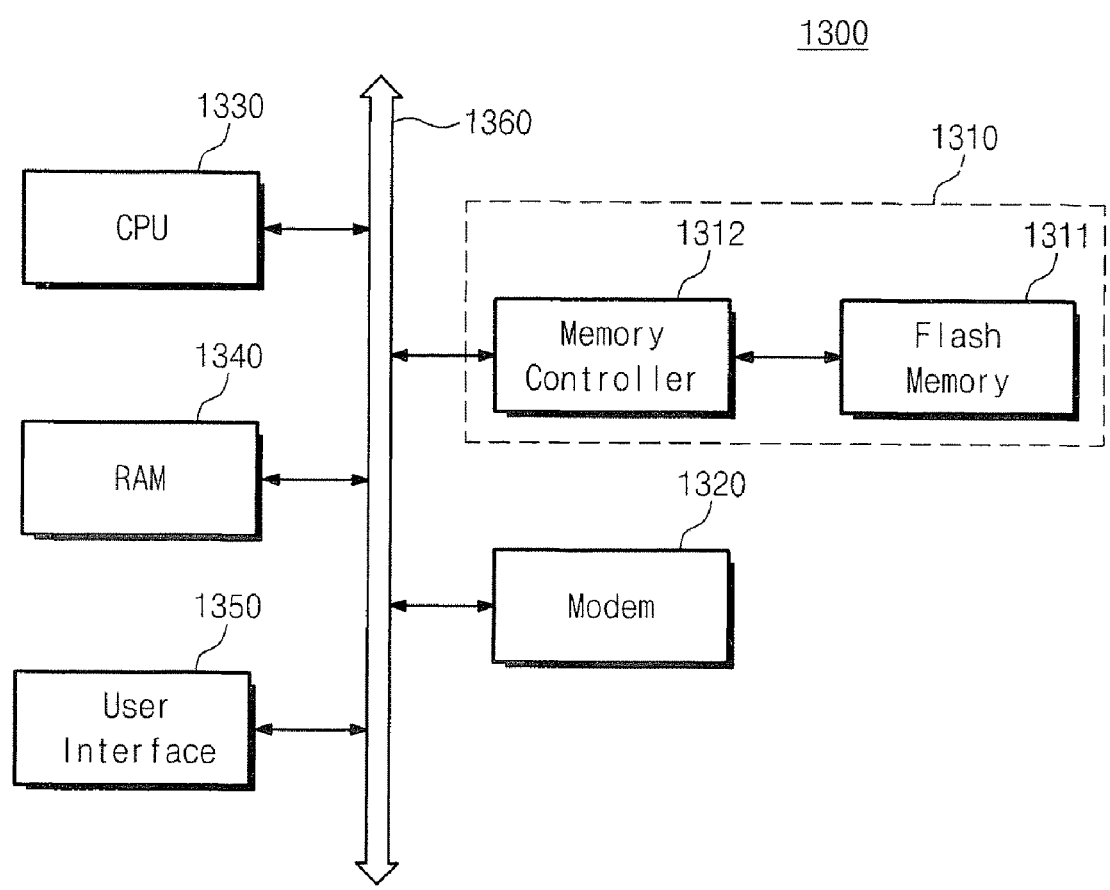

FIG. 15B is a block diagram of an information processing system according to embodiments of the inventive concept.

Referring to FIG. 15B, the information processing system 1300 according to an embodiment of the inventive concept may include a flash memory system 1310 provided with any of the foregoing nonvolatile memory devices, for example, a flash memory device (e.g., NAND flash memory device). The information processing system 1300 may include a mobile device, a computer or the like.

In some embodiments, the information processing system 1300 may include a flash memory system 1310 and a modem 1320 which are electrically connected to a system bus 1360, a central processing unit (CPU) 1330, a RAM 1340, and a user interface 1350. Data processed by the CPU 1330 or external input data may be stored in the flash memory system 1310.

The information processing system 1300 may be provided in the form of a memory card, a solid state disk, a camera image sensor and other application chipset. In one example, the flash memory system 1310 may be configured with a semiconductor disk device (SSD). In this case, the information processing system 1300 can stably and reliably store high-capacity data in the flash memory system 1310.

Furthermore, the flash memory or flash memory system according to embodiments of the inventive concept may be mounted in various types of packages. Examples of the packages of the flash memory or flash memory systems according to embodiments of the inventive concept may include package age on package (PoP), ball grid arrays (BGAs), chip scale packages (CSPs), a plastic leaded chip carrier (PLCC), a plastic dual in-line package (PDIP), a multi chip package (MCP), a wafer-level package (WP), a wafer-level fabricated package (WFP), a wafer-level processed stack package (WSP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP) and so on.

According to certain embodiments of the inventive concept, at least two active bars can be uniformly stacked on a semiconductor substrate without an electrical connection failure. Thus, nonvolatile memory devices configured to be suitable for high integration and having enhanced electrical characteristics can be realized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device, comprising:
   a plurality of gates that are vertically stacked on a semiconductor substrate;
   an active bar which penetrates the plurality of gates and extends vertically from the semiconductor substrate; and
   a gate dielectric between the active bar and the plurality of gates,
   wherein the active bar comprises the same material as the semiconductor substrate, and includes a plurality of separate bars that are vertically connected with each other, and the plurality of separate bars include at least mm two inclined bars that have sidewalls that are inclined with respect to the semiconductor substrate, wherein bar that has each of the at least two inclined bars has a cross-sectional area which gradually increases with increasing distance from the semiconductor substrate.

2. The non-volatile memory device of claim 1, wherein the at least two inclined bars that each have a cross-sectional area which increases with increasing distance from the semiconductor substrate comprise a first inclined bar and a second inclined bar, wherein a cross-sectional area of a top surface of the first inclined bar is greater than a cross-sectional area of a bottom surface of the second inclined bar.

3. The non-volatile memory device of claim 2, wherein the bottom surface of the second inclined bar is directly on the top surface of the first inclined bar.

4. The non-volatile memory device of claim 1, wherein the plurality of gates includes a lower select gate, a plurality of cell gates that are vertically stacked above the lower select gate, and an upper select gate that is vertically stacked on the plurality of cell gates, and wherein a top surface of at least one of the plurality of separate bars is disposed between the plurality of cell gates.

5. The non-volatile memory device of claim 2, wherein the plurality of gates includes a lower select gate, a plurality of cell gates that are vertically stacked above the lower select gate, and an upper select gate that is vertically stacked on the plurality of cell gates, and wherein one of the upper select and the lower select gate is formed in the form of a plate and the other of the upper select and the lower select gate is formed in the form of a plurality of lines.

6. A nonvolatile memory device, comprising:
   a plurality of gates that are vertically stacked on a semiconductor substrate;
   an active bar which penetrates the plurality of gates and extends vertically from the semiconductor substrate; and
   gate dielectric between the active bar and the plurality of gates,
   wherein the active bar comprises the same material as the semiconductor substrate, and includes a plurality of bars that are vertically connected with each other, and the plurality of bars include at least one inclined bar that has a cross-sectional area which increases with increasing distance from the semiconductor substrate,
   wherein the active bar includes an open interior, and wherein an insulator is disposed within the open interior of the active bar.

7. The non-volatile memory device of claim 6, wherein the plurality of gates includes a lower select gate, a plurality of cell gates that are vertically stacked above the lower select gate, and an upper select gate that is vertically stacked on the plurality of cell gates, and wherein one of the upper select and the lower select gate is formed in the form of a plate and the other of the upper select and the lower select gate is formed in the form of a plurality of lines.

8. The non-volatile memory device of claim 6, further comprising a bit line that is electrically connected to the active bar.

9. The non-volatile memory device of claim 6, wherein the plurality of bars include at least two inclined bars that each have a cross-sectional area which increases with increasing distance from the semiconductor substrate.

10. The non-volatile memory device of claim 9, wherein the at least two inclined bars that each have a cross-sectional area which increases with increasing distance from the semiconductor substrate comprise a first inclined bar and a second inclined bar, wherein a cross-sectional area of a top surface of the first inclined bar is greater than a cross-sectional area of a bottom surface of the second inclined bar.

11. A nonvolatile memory device, comprising:
    gate patterns and insulation patterns alternatingly stacked on top of a semiconductor substrate;
    an active bar which is disposed on the semiconductor substrate and extends upward along sidewalls of the gate patterns and sidewalls of the insulation patterns; and
    a gate dielectric between the gate patterns and the active bar,
    wherein the active bar comprises a first sub-active bar, a second sub-active bar on top of the first sub-active bar, and a first pad portion between the first sub-active bar and the second sub-active bar that electrically connects the first sub-active bar and the second sub-active bar, and
    wherein an area of a top surface of the first pad portion is greater than an area of a top surface of the first sub-active bar.

12. The nonvolatile memory device of claim 11, wherein the active bar is disposed in an opening that penetrates the gate patterns and the insulation patterns, and the first sub-active bar includes an inner opening that is surrounded by the first sub-active bar, and
    wherein a filling insulating pattern is in the inner opening of the first sub-active bar, and wherein the first pad portion is on the filling insulating pattern.

13. The nonvolatile memory device of claim 12, wherein the top surface of the first pad portion is coplanar with the top surface of the first sub-active bar.

14. The nonvolatile memory device of claim 13, wherein a bottom surface of the second sub-active bar directly contacts the top surface of the first pad portion, and
   a lower portion of a sidewall of the second sub-active bar that is adjacent to the gate dielectric is laterally offset toward a center portion of the first pad portion from a sidewall of the first sub-active bar that is adjacent to the gate dielectric.

15. The nonvolatile memory device of claim 11, wherein the gate dielectric comprises a first gate dielectric portion between the first sub-active bar and ones of the gate patterns that are positioned lateral to the first sub-active bar, and a second gate dielectric portion between the second sub-active bar and ones of the gate patterns that are positioned lateral to the second sub-active bar, and
   wherein the first gate dielectric portion and the second gate dielectric portion are separated from each other.

16. The nonvolatile memory device of claim 11, wherein the gate patterns and the insulation patterns alternatingly stacked constitute a first gate group,
   wherein the nonvolatile memory device further comprises second gate patterns and second insulation patterns alternatingly stacked to form a second gate group,
   wherein the first and second gate groups are disposed apart from each other to define a groove between the first and second gate groups,
   wherein first sub-active bars of the first and second gate groups are disposed apart from each other on respective sidewalls of the groove,
   wherein the nonvolatile memory device further comprises a filling insulating layer between the first sub-active bars of the first and second gate groups, and
   wherein the first pad portion is disposed on the filling insulating layer.

17. The nonvolatile memory device of claim 11, wherein the first sub-active bar, the second sub-active bar and the first pad portion comprise the same semiconductor material.

18. The nonvolatile memory device of claim 11, further comprising:
   a second pad portion on the second sub-active bar; and
   a bit line electrically connected with the second pad portion,
   wherein an area of a top surface of the second pad portion is greater than an area of a top surface of the second sub-active bar.

19. The nonvolatile memory device of claim 18, further comprising an ohmic layer between the second pad portion and the bit line.

20. The nonvolatile memory device of claim 11, wherein the gate dielectric comprises a tunnel barrier adjacent to the active bar, a blocking barrier adjacent to the gate pattern, and a charge storage layer between the tunnel barrier and the blocking barrier.

* * * * *